(12) United States Patent
Kubota et al.

(10) Patent No.: US 12,092,533 B2
(45) Date of Patent: Sep. 17, 2024

(54) SENSOR, STRAIN DETECTION SENSOR, PRESSURE SENSOR, AND MICROPHONE

(71) Applicant: Murata Manufacturing Co., Ltd., Nagaokakyo (JP)

(72) Inventors: Masashi Kubota, Nagaokakyo (JP); Ville Kaajakari, Nagaokakyo (JP); Masaki Takeuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 350 days.

(21) Appl. No.: 17/669,402

(22) Filed: Feb. 11, 2022

(65) Prior Publication Data
US 2022/0163410 A1    May 26, 2022

Related U.S. Application Data

(63) Continuation of application No. PCT/JP2020/035465, filed on Sep. 18, 2020.

(30) Foreign Application Priority Data

Oct. 21, 2019 (JP) ................. 2019-192058

(51) Int. Cl.
*G01L 1/12*  (2006.01)
*G01L 9/16*  (2006.01)
*H04R 15/00* (2006.01)

(52) U.S. Cl.
CPC .............. *G01L 1/12* (2013.01); *G01L 9/16* (2013.01); *H04R 15/00* (2013.01)

(58) Field of Classification Search
CPC ........... G01L 1/12; G01L 9/16; G01L 9/0042; H04R 15/00; H04R 1/08; H04R 23/00;
(Continued)

(56) References Cited

U.S. PATENT DOCUMENTS

2008/0180865 A1   7/2008  Min et al.
2015/0082894 A1*  3/2015  Okamoto ............... A61B 5/021
                                              29/832
(Continued)

FOREIGN PATENT DOCUMENTS

JP   2005019822 A  *  1/2005
JP   2015-061070 A     3/2015
(Continued)

OTHER PUBLICATIONS

Official Communication issued in International Patent Application No. PCT/JP2020/035465, mailed on Oct. 27, 2020.
(Continued)

*Primary Examiner* — Francis C Gray
(74) *Attorney, Agent, or Firm* — Keating & Bennett, LLP

(57) ABSTRACT

A sensor includes a film portion deformable by external force, a support body supporting the film portion, and a magnetoresistive element portion on the film portion and including a unit element that includes a first magnetic layer whose magnetization direction changes in accordance with deformation of the film portion, a second magnetic layer whose magnetization direction is fixed, and an intermediate layer between the first and second magnetic layers. The film portion includes a first side portion in a portion of an outer edge of the film portion. A slit portion is provided in the film portion and includes at least a portion along the first side portion, so that the film portion includes a connection portion in which the first side portion is partially connected to the support body. A magnetoresistive element portion is provided in the connection portion.

22 Claims, 31 Drawing Sheets

(58) Field of Classification Search
CPC .. H04R 1/04; H04R 31/006; H04R 2201/003; H04R 2410/00; H10N 35/00
See application file for complete search history.

(56) References Cited

U.S. PATENT DOCUMENTS

| | | | |
|---|---|---|---|
| 2015/0082901 A1 | 3/2015 | Fuji et al. | |
| 2015/0268105 A1* | 9/2015 | Fuji | G01L 9/16 73/779 |
| 2017/0135592 A1* | 5/2017 | Fuji | G01L 1/125 |
| 2017/0168122 A1 | 6/2017 | Raberg et al. | |
| 2018/0058965 A1* | 3/2018 | Yuzawa | H10N 30/8561 |
| 2018/0210041 A1 | 7/2018 | Baba et al. | |
| 2022/0163410 A1* | 5/2022 | Kubota | G01L 1/12 |

FOREIGN PATENT DOCUMENTS

| | | |
|---|---|---|
| JP | 2015-064255 A | 4/2015 |
| JP | 2018-006769 A | 1/2018 |
| JP | 2018-033007 A | 3/2018 |
| JP | 2018-116010 A | 7/2018 |

OTHER PUBLICATIONS

Fuji et al., "Spintronic MEMS Microphone Using Ultrasensitive Sprintronic Strain Gauge Sensor Element", vol. 73, No. 1, Jan. 2018, pp. 44-48.

Fuji et al., "Highly sensitive sprintronic strain-gauge sensor based on magnetic tunnel junction and its application to MEMS microphone", IEEE, 2018, pp. 4.2.1.-4.2.4.

Fuji et al., "Highly sensitive sprintronic strain-gauge sensor and Spin-MEMS microphone", Japanese Journal of Applied Physics, vol. 58, No. SD0802, May 21, 2019, pp. SD0802-1-SD0802-8.

Antos et al., "Magnetic Vortex Dynamics", Journal of the Physical Society of Japan, vol. 77, No. 3, Mar. 10, 2008, pp. 031004-1-031004-8.

Guslienko, "Magnetic Vortex State Stability, Reversal and Dynamics in Restricted Geometries", Journal of Nanoscience and Nanotechnology, vol. 8, Jul. 2008, ppl 2745-2760.

Schneider et al., "Lorentz microscopy of circular ferromagnetic permalloy nanodisks", Applied Physics Letters, vol. 77, No. 18, Oct. 30, 2000, pp. 2909-2911.

Endo et al., "Magnetic tunnel junction sensor applying magnetic vortex state", Tohoku University, 10pE-12, 2015, pp. 277.

Wurft et al., "The influence of Edge Inhomogeneities on Vortex Hysteresis Curves in Magnetic Tunnel Junctions", IEEE Transactions on Magnetics, vol. 53, No. 11, Nov. 2017, pp. 1-5.

* cited by examiner

SENSOR, STRAIN DETECTION SENSOR, PRESSURE SENSOR, AND MICROPHONE

CROSS REFERENCE TO RELATED APPLICATIONS

This application claims the benefit of priority to Japanese Patent Application No. 2019-192058 filed on Oct. 21, 2019 and is a Continuation application of PCT Application No. PCT/JP2020/035465 filed on Sep. 18, 2020. The entire contents of each application are hereby incorporated herein by reference.

BACKGROUND OF THE INVENTION

1. Field of the Invention

The present disclosure relates to a sensor in which a magnetoresistive element portion is provided in a film portion deformable by external force, and a strain detection sensor, a pressure sensor, and a microphone each including the sensor.

2. Description of the Related Art

Yoshihiko FUJI, Shiori KAJI, and Michiko HARA, "Spintronic MEMS microphone using ultrasensitive spintronic strain gauge sensor element", Toshiba Review 73, 44 (2018) discloses a microphone equipped with a sensor using micro-electromechanical systems (MEMS) processing technology. As the sensor, an electrostatic capacitance sensor and a strain detection sensor are known.

In the electrostatic capacitance sensor (electrostatic capacitance MEMS microphone), electrostatic capacitance changes due to changes in a distance between a diaphragm electrode and a back plate electrode with sound. Although this sensor has high sensitivity, there is a limit to improvement in a signal to noise ratio (SNR) due to an influence of air viscosity between the electrodes. In addition, the configuration thereof is complicated, and detection accuracy is lowered due to foreign matter (dust or water).

On the other hand, the strain detection sensor detects strain generated on a diaphragm surface due to sound. Compared with the electrostatic capacitance sensor, the sensor is less affected by air viscosity, has a simple configuration, and is easy to manufactured, and detection sensitivity thereof is less likely to be lowered due to foreign matter. However, since an existing semiconductor strain gauge has low sensitivity, a strain detection sensor (spin MEMS microphone) using the MEMS processing technology has been proposed as an approach to achieve high sensitivity and a wide band.

In this spin MEMS microphone, a tunnel magnetoresistance (TMR) sensor is integrated, by spintronics technology, on a diaphragm formed by the MEMS technology.

When the diaphragm is deformed by external force such as pressure, inertia, or sound, and strain is transmitted to the TMR sensor, a magnetization direction of a free layer (first magnetic layer) changes with the inverse magnetostrictive effect. As a result, a large resistance change occurs with the tunnel magnetoresistance effect depending on a relative angle between magnetization directions of the free layer and a reference layer (second magnetic layer), so that minute strain can be detected with high sensitivity.

By using the large resistance change of TMR, a performance index gauge factor ($GF=dR/R/d\varepsilon$) representing a resistance change ratio to the strain has a value of 2500 times that of a metal strain gauge and equal to or greater than 100 times that of the semiconductor strain gauge. A spin MEMS microphone in which a TMR sensor is connected in series onto a diaphragm fixed to the periphery has been prototyped by utilizing this characteristic.

Y. Fuji et al., "Highly sensitive spintronic strain-gauge sensor based on magnetic tunnel junction and its application to MEMS microphone", 2018 IEEE International Electron Devices Meeting (IEDM) and Japanese Unexamined Patent Application Publication No. 2018-006769 disclose a technique of applying bias to a free layer such that an initial magnetization direction of the free layer is 45 degrees or 135 degrees with respect to a magnetization direction of a reference layer for the purpose of making the odd function of resistance change to positive and negative strain (tension and compression), improving linearity, improving an input dynamic range, and reducing hysteresis in a spin MEMS microphone.

Japanese Unexamined Patent Application Publication No. 2018-116010 discloses a spin MEMS microphone in which a structure is provided so as to straddle a support body supporting a diaphragm and the diaphragm. The structure is provided so as not to overlap with a region where a plurality of elements is arranged on the diaphragm having a rectangular shape.

Fuji et al., "Highly sensitive spintronic strain-gauge sensor and Spin-MEMS microphone", Japanese Journal of Applied Physics 58, SD0802 (2019) discloses technology in which in a spin MEMS microphone, a diaphragm has a quadrangular shape and magnetic tunnel junction (MTJ) elements are arranged along a predetermined side of the diaphragm in order to improve sensitivity by matching a direction of stress acting on the elements when the diaphragm is deformed by external force with a sensitivity axis direction.

Japanese Unexamined Patent Application Publication No. 2015-061070 discloses a strain detection element in which a magnetoresistive element is arranged on a circular diaphragm to detect strain. As a technology for integrating a bias function in the magnetoresistive element, a technology is disclosed in which a free layer is biased by an interlayer exchange coupling layer with a laminated structure of bias magnetic layer/separation layer/free layer. As a method of fixing magnetization of the bias magnetic layer, a laminated structure of an antiferromagnetic layer/bias magnetic layer or an antiferromagnetic layer/ferromagnetic layer/magnetic coupling layer/bias magnetic layer is disclosed.

R. Antos, Y. Otani and J. Shibata, "Magnetic vortex dynamics", J. Phys. Soc. Jpn. 77, 031004 (2008) discloses a magnetoresistive element having a magnetic vortex structure (vortex) with a special response to a magnetic field. The magnetic vortex structure develops in a ferromagnetic submicron scale disk. The magnetic structure thereof is determined by competition among exchange energy, magnetostatic energy (shape anisotropy), Zeeman energy, and various magnetic anisotropic energies. In a hysteresis loop in the magnetoresistive element having the magnetic vortex structure, a linear region appears in a portion of a magnetization curve.

K. Y. Guslienko, "Magnetic vortex state stability, reversal and dynamics in restricted geometries", Journal of Nanoscience and Nanotechnology 8, 2745 (2008) discloses that magnetostatic energy depends on shapes and a magnetization structure can be controlled by a disk aspect ratio (disk thickness/disk diameter).

When the disk aspect ratio is low, shape anisotropy in the in-plane direction becomes dominant and a single domain structure in the plane is formed. When the disk aspect ratio is high, shape anisotropy in the vertical direction becomes dominant and a single domain structure in the vertical direction is formed. In an intermediate region thereof, a magnetic vortex structure is formed mainly by competition between exchange energy and magnetostatic energy.

M. Schneider, H. Hoffmann and J. Zweck, "Lorentz microscopy of circular ferromagnetic permalloy nanodisks", Appl. Phys. Lett. 77, 2909 (2000) discloses that a linear region of a magnetization curve expands with a decrease in a disk radius (increase in an aspect ratio).

U.S. Patent Application Publication No. 2008/0180865 discloses a method of using a magnetic vortex structure (vortex) in order to obtain odd-function linear input magnetic field-resistance characteristics in a giant magneto resistive effect (GMR) sensor or a TMR sensor.

Specifically, a structure is disclosed in which a magnetoresistive element including a laminated portion where a reference layer (second magnetic layer), a barrier layer (intermediate layer), and a free layer (first magnetic layer) having the magnetic vortex structure are laminated in order, is held between a lower shield and an upper shield made of a magnetically permeable material. Magnetization is fixed in the in-plane direction in the reference layer, whereas the magnetization has a vortex shape in the free layer.

Motoi ENDO, Mikihiko OOGANE, Hiroshi NAGANUMA, Yasuo ANDO, Magnetic tunnel junction sensor applying magnetic vortex state, Digests of the 39th Annual Conference on Magnetics in Japan 10pE-12, 277 (2015) and T. Wurft, W. Raberg, K. Prugl, A. Satz, G. Reiss and H. Bruckl, The influence of edge inhomogeneities on vortex hysteresis curves in magnetic tunnel junctions, IEEE Transactions on Magnetics AF-05, 1 (2017) also disclose a magnetoresistive element having a magnetic vortex structure.

U.S. Patent Application Publication No. 2017/0168122 discloses that exchange coupling bias is exhibited by a laminated structure of a free layer having a magnetic vortex structure and an antiferromagnetic layer.

Japanese Unexamined Patent Application Publication No. 2015-064255) discloses a technology of changing magnetization fixing directions of reference layers in accordance with arrangement positions of detection elements on a diaphragm in a spin MEMS microphone.

However, the spin MEMS microphone in Yoshihiko FUJI, Shiori KAJI, and Michiko HARA, "Spintronic MEMS Microphone using ultrasensitive spintronic strain gauge sensor element", Toshiba Review 73, 44 (2018) described above has the configuration in which TMR elements are connected in series on a diaphragm and has a signal to noise ratio (SNR) of 57 dB, which is inferior to those of existing electrostatic capacitance MEMS microphones (60 to 74 dB) in terms of characteristics. It cannot therefore be said that the spin MEMS microphone effectively utilizes characteristics of a high gauge factor (GF).

In Fuji et al., "Highly sensitive spintronic strain-gauge sensor based on magnetic tunnel junction and its application to MEMS microphone", 2018 IEEE International Electron Devices Meeting (IEDM) and Japanese Unexamined Patent Application Publication No. 2018-006769 described above, when stress acting on an element is small in deformation of a diaphragm by external force, it is necessary to decrease a bias intensity in order to increase sensitivity. However, it is difficult to perform accurate control in a region where the bias intensity is small, and when the bias intensity is decreased, resistance to disturbance magnetic fields is lowered.

In Japanese Unexamined Patent Application Publication No. 2018-116010 described above, a slit is provided such that a film portion is easily deformed by external force, but the slit is not provided in a predetermined side portion of the diaphragm on which the plurality of elements is arranged in a row. In addition, since the structure is provided so as to straddle the diaphragm and the support body, deformation of the film portion is suppressed. For this reason, stress acting on the elements is still small, and there is room for improvement as described above.

In Fuji et al., "Highly sensitive spintronic strain-gauge sensor and Spin-MEMS microphone", Japanese Journal of Applied Physics 58, SD0802(2019) described above, the plurality of elements are arranged along the predetermined side of the quadrangular diaphragm. However, when the diaphragm is simply formed into the quadrangular shape, the stress acting on the elements may be small. In this case, there is room for improvement similarly to the above description.

Moreover, in Japanese Unexamined Patent Application Publication No. 2015-061070 described above, stress acting on the element may be small, and there is room for improvement as described above. When the free layer is biased only by interlayer exchange coupling, the bias intensity is adjusted by designing materials and film thicknesses of the laminated structure. For this reason, it is difficult to form a laminated body such that the bias intensity is different in the same wafer and bridge circuit.

U.S. Patent Application Publication No. 2008/0180865, U.S. Patent Application Publication No. 2017/0168122, R. Antos, Y. Otani and J. Shibata, "Magnetic vortex dynamics", J. Phys. Soc. Jpn. 77, 031004 (2008), K. Y. Guslienko, "Magnetic vortex state stability, reversal and dynamics in restricted geometries", Journal of Nanoscience and Nanotechnology 8, 2745 (2008), M. Schneider, H. Hoffmann and J. Zweck, "Lorentz microscopy of circular ferromagnetic permalloy nanodisks", Appl. Phys. Lett. 77, 2909 (2000), Motoi ENDO, Mikihiko OOGANE, Hiroshi NAGANUMA, Yasuo ANDO, Magnetic tunnel junction sensor applying magnetic vortex state, Digests of the 39th Annual Conference on Magnetics in Japan 10pE-12, 277 (2015) and T. Wurft, W. Raberg, K. Prugl, A. Satz, G. Reiss and H. Bruckl, and The influence of edge inhomogeneities on vortex hysteresis curves in magnetic tunnel junctions, IEEE Transactions on Magnetics AF-05, 1 (2017) disclose the magnetoresistive element having the magnetic vortex structure as described above. However, application of the magnetoresistive element to a sensor for detecting strain, pressure, inertia, sound, or the like is not disclosed.

In Japanese Unexamined Patent Application Publication No. 2015-064255, the plurality of elements is arranged along the outer edge of the diaphragm. In such a case, stress acting on the elements may be small. Therefore, there is room to improve as described above.

SUMMARY OF THE INVENTION

Preferred embodiments of the present invention provide sensors each with improved resistance to disturbance magnetic fields, and strain detection sensors, pressure sensors, and microphones each including such sensors.

A sensor according to a preferred embodiment of the present invention includes a film portion deformable by external force, a support body supporting the film portion, and a magnetoresistive element on the film portion and including at least one unit element. The unit element includes a first magnetic layer whose magnetization direction changes in accordance with deformation of the film portion, a second magnetic layer whose magnetization direction is fixed, and an intermediate layer between the first magnetic layer and the second magnetic layer. The film portion includes a first side portion in a portion of an outer edge of the film portion. A slit portion is provided in the film portion so as to include at least a portion along the first side portion, so that the film portion includes a connection portion in which the first side portion is partially connected to the support body. The magnetoresistive element portion is provided in the connection portion.

In a sensor according to a preferred embodiment of the present invention, a plurality of the magnetoresistive element portions may be provided. In this case, it is preferable that the film portion includes a plurality of side portions corresponding to the outer edge of the film portion and including the first side portion. Further, it is preferable that the slit portion includes portions along the plurality of side portions, such that the film portion includes a plurality of connection portions in which the plurality of side portions are partially connected to the support body, and it is preferable that the magnetoresistive element portions are respectively provided in the plurality of connection portions.

In a sensor according to a preferred embodiment of the present invention, each of the plurality of connection portions may include one end on one side in a direction along the outer edge of the film portion and another end on another side in the direction along the outer edge of the film portion. In this case, the slit portion may include, in each of the plurality of side portions, a first slit portion extending from the one end of each of the connection portions toward the one side and a second slit portion extending from the another end of each of the connection portions toward the another side. Further, the first slit portion on one connection portion side of the connection portions adjacent to each other in a circumferential direction of the film portion and the second slit portion on the another connection portion side may be coupled to each other.

In a sensor according to a preferred embodiment of the present invention, the slit portion may include a plurality of pairs of extending portions on both outer sides of the plurality of connection portions along the outer edge of the film portion so as to extend in directions intersecting with the side portions that respectively correspond to the plurality of connection portions. In this case, it is preferable that the plurality of connection portions respectively include projecting portions extending between the pairs of extending portions. Further, it is preferable that the magnetoresistive element portions are provided at least in portions of the projecting portions, which are located on the outer edge side of the film portion.

In a sensor according to a preferred embodiment of the present invention, the film portion may have a polygonal or substantially polygonal shape including a plurality of corner portions, and the slit portions may include a plurality of pairs of extending portions corresponding to the plurality of corner portions. In this case, the pairs of extending portions may extend from corresponding predetermined corner portions toward corner portions adjacent to the predetermined corner portions on one side in the circumferential direction of the film portion. One extending portion of the pairs of extending portions may be provided along the side portions. Another extending portion of the pairs of extending portions may be parallel or substantially parallel to the one extending portions further on inner side portions of the film portion than the one extending portions. In this case, lengths of the pairs of extending portions are preferably equal to or greater than about 50% of lengths of the side portions.

In a sensor according to a preferred embodiment of the present invention, it is preferable that lengths of the one extending portions are larger than lengths of the another extending portions and the one extending portions are connected to the another extending portions of the pairs of extending portions provided at the corner portions adjacent to the predetermined corner portions.

In a sensor according to a preferred embodiment of the present invention, the plurality of magnetoresistive element portions may include a plurality of first magnetoresistive element portions and a plurality of second magnetoresistive element portions. In this case, it is preferable that the first magnetoresistive element portions and the second magnetoresistive element portions are provided in each of a plurality of the projecting portions. In addition, it is preferable that the first magnetoresistive element portions are provided in portions of the connection portions, which are located on the outer edge side of the film portion, and the second magnetoresistive element portions are provided in portions of the connection portions, which are located on tip sides of the pairs of extending portions. Furthermore, it is preferable that a first bridge circuit is defined by the plurality of first magnetoresistive element portions, and it is preferable that a second bridge circuit is defined by the plurality of second magnetoresistive element portions. In this case, it is preferable that the second bridge circuit has output characteristics opposite in sign to output characteristics of the first bridge circuit.

In a sensor according to a preferred embodiment of the present invention, the first magnetoresistive element portions and the second magnetoresistive element portions may include a plurality of the unit elements. In this case, the number of the unit elements included in the first magnetoresistive element portions may be smaller than the number of the unit elements included in the second magnetoresistive element portions.

In a sensor according to a preferred embodiment of the present invention, the first magnetoresistive element portions and the second magnetoresistive element portions may include a plurality of the unit elements having different sizes. In this case, an average size of the plurality of unit elements included in the first magnetoresistive element portions may be smaller than an average size of the plurality of unit elements included in the second magnetoresistive element portions.

In a sensor according to a preferred embodiment of the present invention, a bridge circuit may be defined by the magnetoresistive element portions that are provided in the plurality of connection portions.

In a sensor according to a preferred embodiment of the present invention, it is preferable that bias magnetic fields are applied to the first magnetic layers. In this case, relative angles between directions of the bias magnetic fields applied to the first magnetic layers and the magnetization directions of the second magnetic layers may be about 90 degrees±5 degrees. In addition, relative angles between directions of stress-induced magnetic anisotropies of the first magnetic layers and the directions of the bias magnetic fields may be about 45±5 degrees, the stress-induced magnetic anisotropies occurring when the film portion is deformed such that compressive force acts on portions of the connection portions, which are located on the outer edge side of the film portion.

In a sensor according to a preferred embodiment of the present invention, it is preferable that bias magnetic fields are applied to the first magnetic layers. In this case, relative angles between directions of the bias magnetic fields applied to the first magnetic layers and the magnetization directions of the second magnetic layers may be about 135 degrees±5 degrees. In addition, relative angles between directions of stress-induced magnetic anisotropies of the first magnetic layers and the directions of the bias magnetic fields may be about 45±5 degrees, the stress-induced magnetic anisotropies occurring when the film portion is deformed such that compressive force acts on portions of the connection portions, which are located on the outer edge side of the film portion.

In a sensor according to a preferred embodiment of the present invention, the unit element may further include a bias layer to apply a bias magnetic field to the first magnetic layer, and a separation layer between the bias layer and the first magnetic layer.

In a sensor according to a preferred embodiment of the present invention, the first magnetic layer may have a magnetization vortex structure. In this case, an intensity of the bias magnetic field which is applied to the first magnetic layer is preferably greater than an intensity of an interlayer exchange coupling magnetic field acting between the first magnetic layer and the second magnetic layer with the intermediate layer interposed therebetween.

In a sensor according to a preferred embodiment of the present invention, the first magnetic layer may have a disk shape.

In a sensor according to a preferred embodiment of the present invention, the magnetoresistive element portion may include a plurality of the unit elements with different disk diameters of the first magnetic layers. In this case, the plurality of unit elements may be provided such that the unit element arranged at a position in the connection portion where an absolute value of stress acting when the film portion is deformed is larger has a smaller disk diameter.

In a sensor according to a preferred embodiment of the present invention, a film thickness of the film portion in the connection portion may be larger than a film thickness of a central portion of the film portion.

In a sensor according to a preferred embodiment of the present invention, the support body may include a first portion and a second portion on the first portion and supporting the film portion, and the second portion may be made of a different material from a material of the first portion. In this case, the film portion may include a portion having a thickness smaller than a thickness of the second portion.

A sensor according to a preferred embodiment of the present invention may further include a protective film covering the magnetoresistive element portion. In this case, a film thickness of the protective film may be partially different in a region corresponding to the film portion.

A strain detection sensor according to a preferred embodiment of the present invention includes a sensor according to a preferred embodiment of the present invention.

A pressure sensor according to a preferred embodiment of the present invention includes a sensor according to a preferred embodiment of the present invention.

A microphone according to a preferred embodiment of the present invention includes a sensor according to a preferred embodiment of the present invention.

According to preferred embodiments of the present invention, it is possible to provide sensors each able to adjust sensitivity and output and influence of disturbance magnetic fields independently and each having high sensitivity and high output and resistance to the disturbance magnetic fields at the same time, and strain detection sensors, pressure sensors, and microphones each including such sensors.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
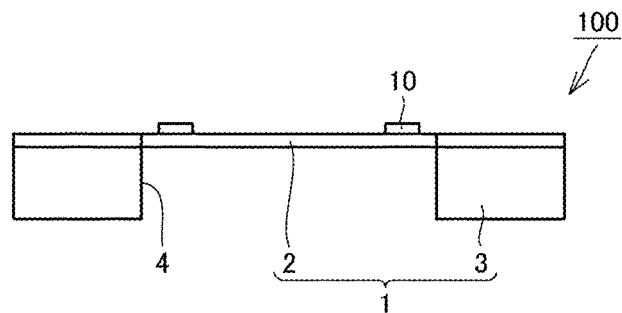
FIG. 1 is a schematic cross-sectional view illustrating a sensor according to Preferred Embodiment 1 of the present invention.

Hereinafter, preferred embodiments of the present disclosure will be described in detail with reference to the drawings. In the preferred embodiments described below, the same or corresponding portions are denoted by the same reference numerals in the drawings, and description thereof will not be repeated.

Preferred Embodiment 1

Figure 2:
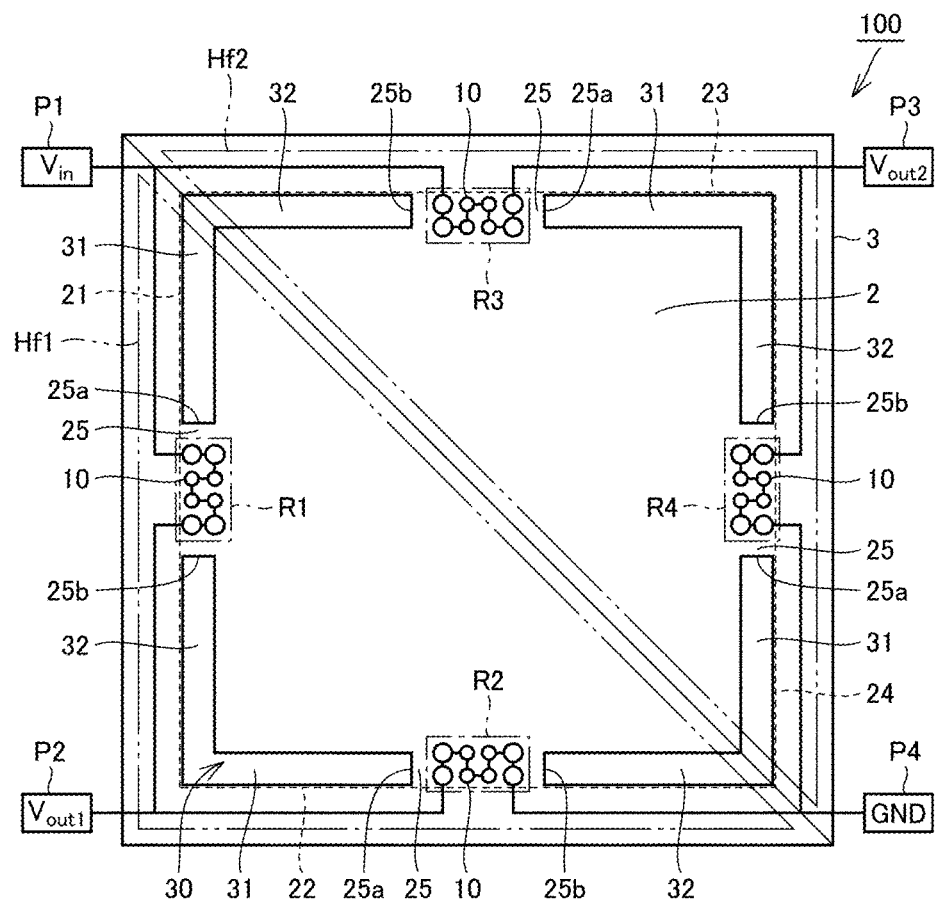
FIG. 2 is a schematic plan view illustrating the sensor in Preferred Embodiment 1 of the present invention.

FIG. 1 is a schematic cross-sectional view illustrating a sensor according to Preferred Embodiment 1. FIG. 2 is a schematic plan view illustrating the sensor in Preferred Embodiment 1. A sensor 100 in Preferred Embodiment 1 will be described with reference to FIGS. 1 and 2.

As illustrated in FIGS. 1 and 2, the sensor 100 in Preferred Embodiment 1 is a so-called MEMS sensor. The sensor 100 includes a substrate 1 including a film portion 2 and a support body 3, and a plurality of magnetoresistive element portions R1, R2, R3, and R4.

The film portion 2 is supported by the support body 3. The film portion 2 is provided so as to be deformable by external forces such as pressure, inertia, and sound. The thickness of the film portion 2 is smaller than the thickness of the support body 3. The film portion 2 is defined by providing a cavity portion 4 on the back surface side of the substrate 1. Here, the cavity portion refers to a space surrounded by inner walls of the substrate. The film portion 2 is provided in a region of the substrate 1 where the cavity portion 4 is provided. A region of the substrate 1 where the cavity portion 4 is not provided corresponds to the support body 3.

The film portion 2 may be integral with the support body 3 or may be separate from the support body 3. The film portion 2 may be made of the same material as that of the support body 3 or may be made of a different material from that of the support body 3. The support body 3 is made of, for example, a silicon substrate. The film portion 2 is made of, for example, silicon, polysilicon, silicon oxide, silicon nitride or the like.

The film portion 2 has a rectangular or substantially rectangular shape. The film portion 2 includes a first side portion in a portion of an outer edge. Specifically, the film portion 2 includes a plurality of side portions 21, 22, 23, and 24 corresponding to the outer edge. The side portion 21 corresponds to the above-described first side portion.

The side portion 21 and the side portion 24 face each other. The side portion 22 and the side portion 23 face each other and connect the side portion 21 and the side portion 24.

A slit portion 30 is formed in the film portion 2 so as to include at least a portion along the side portion 21. Accordingly, the film portion 2 includes a connection portion 25 in which the side portion 21 is partially connected to the support body 3.

Specifically, the slit portion 30 includes portions along the plurality of side portions 21, 22, 23, and 24, so that the film portion 2 includes a plurality of connection portions 25 in which the plurality of side portions 21, 22, 23, and 24 are partially connected to the support body 3.

Each of the plurality of connection portions 25 is located at a central portion of each of the plurality of side portions 21, 22, 23, and 24. Each of the plurality of connection portions 25 includes one end 25a on one side in a direction along the outer edge of the film portion 2 and another end 25b on the other side in the direction along the outer edge of the film portion 2. The one side in the direction along the outer edge of the film portion 2 is one side in the circumferential direction of the film portion 2, and the other side in the direction along the outer edge of the film portion 2 is the other side in the circumferential direction of the film portion 2.

The slit portion 30 includes a first slit portion 31 extending from the one end 25a of the connection portion 25 towards one side and a second slit portion 32 extending from the other end 25b of the connection portion 25 towards the other side in each of the plurality of side portions 21, 22, 23, and 24.

The first slit portion 31 on one connection portion side of the connection portions 25 adjacent to each other in the circumferential direction of the film portion 2 and the second slit portion 32 on the other connection portion 25 side are coupled.

The magnetoresistive element portion is provided in each of the plurality of connection portions 25. To be specific, the magnetoresistive element portion R1 is provided in the connection portion 25 on the side portion 21 side. The magnetoresistive element portion R2 is provided in the connection portion 25 on the side portion 22 side. The magnetoresistive element portion R3 is provided in the connection portion 25 on the side portion 23 side. The magnetoresistive element portion R4 is provided in the connection portion 25 on the side portion 24 side.

Each of the magnetoresistive element portions R1, R2, R3, and R4 includes a plurality of unit elements 10. The unit elements 10 are magnetoresistive elements as will be described later. Each of the plurality of unit elements 10 has a disk shape. Accordingly, a free layer 46 (see FIG. 3) included in each of the plurality of unit elements 10 also has a disk shape.

In each of the magnetoresistive element portions R1, R2, R3, and R4, the plurality of unit elements 10 are arranged, for example, in a matrix. Further, the plurality of unit elements 10 are connected in series. Specifically, in the adjacent unit elements 10, upper electrode layers 49 (see FIG. 3) and lower electrode layers 40 (see FIG. 3) are preferably alternately connected.

Although FIG. 2 illustrates an example in which the number of the plurality of unit elements 10 included in each magnetoresistive element portion is eight, the number of the unit elements 10 is not limited to eight and may be one or equal to or more than two.

The plurality of unit elements 10 are provided such that the unit elements 10 at positions in the connection portions 25 where absolute values of stress acting when the film portion 2 is deformed by external force are larger have smaller disk diameters. The disk diameters of the unit elements 10 located on the central portions of the connection portions 25 in the directions along the corresponding side portions are smaller than the disk diameters of the unit elements 10 located on both end sides of the connection portions 25.

In each of the magnetoresistive element portions R1, R2, R3, and R4, all of the disk diameters of the plurality of unit elements 10 may be the same or substantially the same.

The magnetoresistive element portions R1 and R2 are connected in series to define a first half bridge circuit Hf1. The magnetoresistive element portions R3 and R4 are connected in series to define a second half bridge circuit Hf2.

The first half bridge circuit Hf1 and the second half bridge circuit Hf2 are connected in parallel to define a full-bridge circuit.

To be specific, one side of the magnetoresistive element portion R1 is connected to an electrode portion P1 to apply a power supply voltage Vin. The other side of the magnetoresistive element portion R1 is connected to an electrode portion P2 to extract an output voltage V+.

One side of the magnetoresistive element portion R2 is connected to the electrode portion P2 to extract the output voltage V+. The other side of the magnetoresistive element portion R2 is connected to an electrode portion P4 defining and functioning as a ground electrode.

One side of the magnetoresistive element portion R3 is connected to the electrode portion P1 to apply the power supply voltage Vin. The other side of the magnetoresistive element portion R3 is connected to an electrode portion P3 to extract an output voltage V−.

One side of the magnetoresistive element portion R4 is connected to the electrode portion P3 to extract the output voltage V−. The other side of the magnetoresistive element portion R4 is connected to the electrode portion P4 defining and functioning as the ground electrode.

The magnetoresistive element portion R1 and the magnetoresistive element portion R2 have positive output characteristics. The magnetoresistive element portion R3 and the magnetoresistive element portion R4 have negative output characteristics.

When the power supply voltage Vin is applied between the electrode portion P1 and the electrode portion P4, the output voltages V+ and V− are extracted from the electrode portion P2 and the electrode portion P4 in accordance with the magnitude of the external force acting on the film portion 2. The output voltages V+ and V− are differentially amplified by a differential amplifier (not illustrated).

Although the electrode portions P1, P2, P3, and P4 are illustrated outside the support body 3 in FIG. 2, the electrode portions P1, P2, P3, and P4 may be provided on the support body 3.

Figure 3:
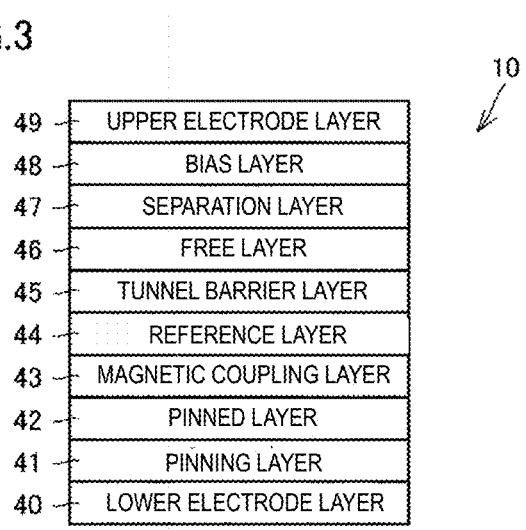
FIG. 3 is a schematic cross-sectional view illustrating a laminated structure of each of unit elements of magnetoresistive element portions included in the sensor in Preferred Embodiment 1 of the present invention.

FIG. 3 is a schematic cross-sectional view illustrating a laminated structure of each of the unit elements of the magnetoresistive element portions included in the sensor in Preferred Embodiment 1. The laminated structure of each unit element 10 will be described with reference to FIG. 3.

The unit element 10 includes the lower electrode layer 40, a pinning layer 41, a pinned layer 42, a magnetic coupling layer 43, a reference layer 44 as a second magnetic layer, a tunnel barrier layer 45 as an intermediate layer, the free layer 46 as a first magnetic layer, a separation layer 47, a bias layer 48, and the upper electrode layer 49.

The lower electrode layer 40 defines and functions as a seed layer to appropriately grow the crystal of the pinning layer 41. As the lower electrode layer 40, for example, a laminated film of Ru and Ta can be used. The lower electrode layer 40 may be a single metal film made of another metal or an alloy or a laminate of a plurality of types of the above-described metal films.

The pinning layer 41 is provided on the lower electrode layer 40. The pinning layer 41 is made of an antiferromagnetic layer. For example, IrMn can be used as the pinning layer 41. The pinning layer 41 may be an alloy including Mn, such as PtMn, for example.

The pinned layer 42 is provided on the pinning layer 41. The pinned layer 42 is made of a ferromagnetic layer. For example, CoFe can be used as the pinned layer 42. The pinned layer 42 may be made of CoFeB or the like, for example. Magnetization of the pinned layer 42 is fixed in a predetermined in-plane direction by an exchange coupling magnetic field acting from the pinning layer 41.

The magnetic coupling layer 43 is provided on the pinned layer 42. The magnetic coupling layer 43 is between the pinned layer 42 and the reference layer 44 and generates antiferromagnetic coupling between the pinned layer 42 and the reference layer 44.

The magnetic coupling layer 43 is made of a nonmagnetic layer. For example, Ru can be used as the magnetic coupling layer 43.

The reference layer 44 is provided on the magnetic coupling layer 43. The reference layer 44 is made of a ferromagnetic layer. For example, CoFeB can be used as the reference layer 44. The reference layer 44 may be made of CoFe or the like, for example.

The above-described pinned layer 42, magnetic coupling layer 43, and reference layer 44 define a synthetic antiferromagnet (SAF) structure. The magnetization direction of the reference layer 44 can thus be firmly fixed.

The tunnel barrier layer 45 is provided on the reference layer 44. The tunnel barrier layer 45 is between the reference layer 44 and the free layer 46. The tunnel barrier layer 45 is made of an insulating layer. For example, MgO can be used as the tunnel barrier layer 45.

The free layer 46 is provided on the tunnel barrier layer 45. The free layer 46 is made of a ferromagnetic layer. For example, a laminated layer of CoFeB and FeB can be used as the free layer 46. FeB has a large magnetostriction constant, is amorphous, and has small crystal magnetic anisotropy. In order to reduce or prevent crystallization of FeB, for example, ferromagnetic amorphous layers made of CoFeTa or the like may be provided between CoFeB and FeB and between FeB and the separation layer 47.

The separation layer 47 is provided on the free layer 46. The separation layer 47 is between the free layer 46 and the bias layer 48. As the separation layer 47, it is possible to use, for example, Cu, Ru, Rh, Ir, V, Cr, Nb, Mo, Ta, W, Rr, or the like, which exhibits Ruderman-Kittel-Kasuya-Yoshida (RKKY) coupling. Positive magnetic coupling (ferromagnetic, parallel) and negative magnetic coupling (antiferromagnetic, antiparallel) can be selectively used depending on the film thickness of the separation layer 47. In addition, when Au, Ag, Pt, Pd, Ti, Zr, or Hf is used, for example, the positive magnetic coupling is mainly obtained. When the negative magnetic coupling is used, for example, Ru, Rh, or Ir can be used.

The bias layer 48 is provided on the separation layer 47. The bias layer 48 defines and functions as a bias application unit that applies a bias magnetic field to the free layer 46. The bias layer 48 can be a laminated layer of a ferromagnetic layer and an antiferromagnetic layer. As the bias layer 48, for example, a laminated layer of CoFeB and IrMn can be used. CoFeB and IrMn are laminated in this order from the separation layer 47 side.

The bias layer 48 applies, to the free layer 46, an exchange coupling magnetic field generated by the ferromagnetic layer and the antiferromagnetic layer as the bias magnetic field. The intensity of the bias magnetic field is greater than the intensity of interlayer exchange coupling from the reference layer 44.

Further, the antiferromagnetic layer on the reference layer side and the antiferromagnetic layer on the bias layer 48 side have different blocking temperatures such that the direction of the bias magnetic field applied to the free layer and the magnetization direction of the reference layer 44 (the magnetization direction fixed in the reference layer 44) are different. As a result, the sensor 100 can be manufactured stably and reliability of the sensor 100 is improved.

When the antiferromagnetic layer on the reference layer side and the antiferromagnetic layer on the bias layer 48 side are made of the same material, for example, the antiferromagnetic layer on the reference layer side is thicker than the antiferromagnetic layer on the bias layer 48 side, such that the blocking temperature of the antiferromagnetic layer on the reference layer side can be higher than the blocking temperature of the antiferromagnetic layer on the bias layer 48 side.

As an example, the blocking temperature of PtMn is about 310° C., and the blocking temperature of IrMn is about 255° C. The antiferromagnetic layer on the reference layer side may be made of PtMn, and the antiferromagnetic layer on the bias layer side may be made of IrMn, for example.

The upper electrode layer 49 is provided on the bias layer 48. As the upper electrode layer 49, for example, a laminated film of Ru and Ta can be used. The upper electrode layer 49 may be, for example, a single metal film made of another metal or an alloy or a laminate of a plurality of types of the above-described metal films.

The case where each unit element 10 in Preferred Embodiment 1 is a bottom-pinned TMR element in which the reference layer 44 is below the free layer 46 has been described above as an example. Each unit element 10 is not limited thereto and may be a top-pinned TMR element in which the reference layer 44 is above the free layer 46. Further, the unit element 10 is not limited to the TMR element. Although the case where the bias layer 48 and the separation layer 47 are used has been described as an example of a method of applying the bias magnetic field to the free layer 46, the method is not limited to this. An external magnet or the like, for example, may be used while omitting the bias layer 48 and the separation layer 47.

Figure 4:
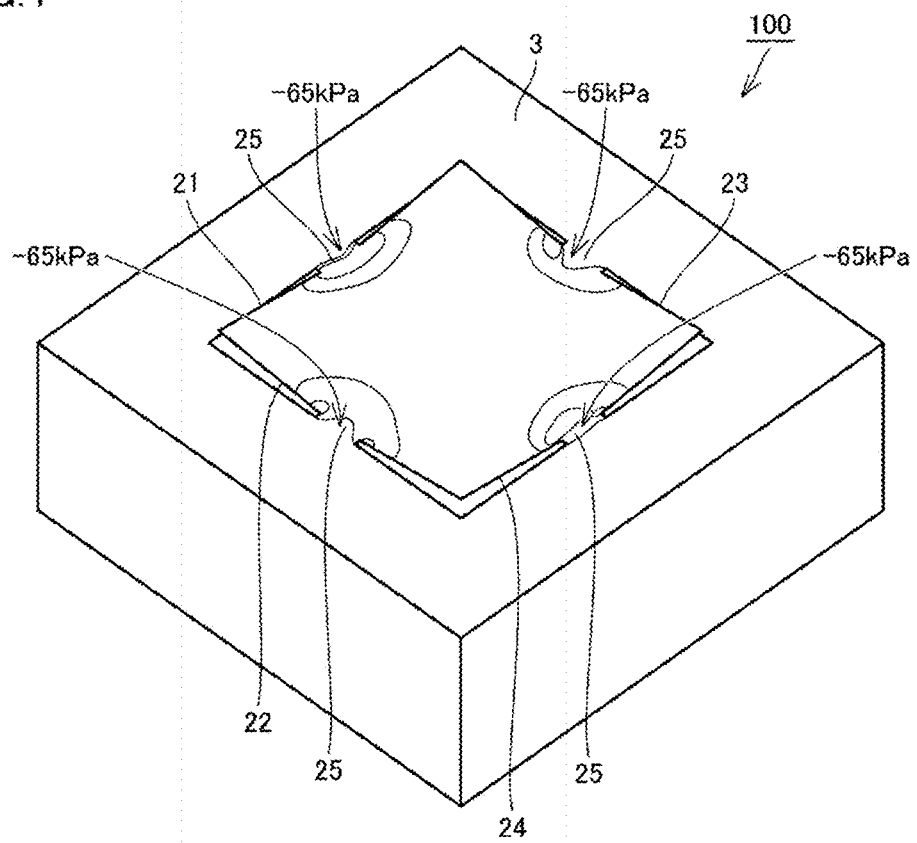
FIG. 4 is a perspective view illustrating a state where a film portion is deformed by an external force in the sensor in Preferred Embodiment 1 of the present invention.

FIG. 4 is a perspective view illustrating a state in which the film portion is deformed by external force in the sensor in Preferred Embodiment 1. The state in which the film portion 2 is deformed in the sensor 100 in Preferred Embodiment 1 will be described with reference to FIG. 4.

As illustrated in FIG. 4, when stress is applied to the central portion of the film portion 2 and the film portion 2 is deflected and deformed, the stress is concentrated on the plurality of connection portions 25. For example, in the film portion 2 described above, the lengths of the side portions 21, 22, 23, and 24 are about 600 μm and the thickness of the film portion 2 is about 1 μm. The lengths of the first slit portions 31 and the second slit portions 32 along the side portions are about 250 μm. The widths of the first slit portions 31 and the second slit portions 32, which are orthogonal or substantially orthogonal to the longitudinal directions of the first slit portions 31 and the second slit portions 32, are about 15 μm. In this case, when a case where pressure of approximately 1 Pa is applied to the film portion 2 from the cavity portion 4 side (the back surface side of the film portion 2) is simulated and stress distribution is analyzed by a finite element method (FEM), compressive stress of approximately 65 KPa at maximum acts on each of the plurality of connection portions 25.

On the other hand, although not illustrated here, when a sensor in which the slit portion 30 is not provided at all is prepared as a comparative example for simulation under the same or substantially the same conditions, compressive stress acting on the central portions of the plurality of side portions 21, 22, 23, and 24 is about 45 KPa at maximum.

As described above, in Preferred Embodiment 1, stress of approximately 1.4 times can be made to act on the connection portions 25 as compared with the above-described comparative example in which the slit portion is not provided. Therefore, the stress acting on the magnetoresistive element portions can be increased by arranging the magnetoresistive element portions in the connection portions 25. As a result, in the unit elements 10, the intensities of the bias magnetic fields that are applied to the free layers 46 can be increased, such controllability of the bias intensities can be improved and resistance to disturbance magnetic fields can be improved.

Figure 5:
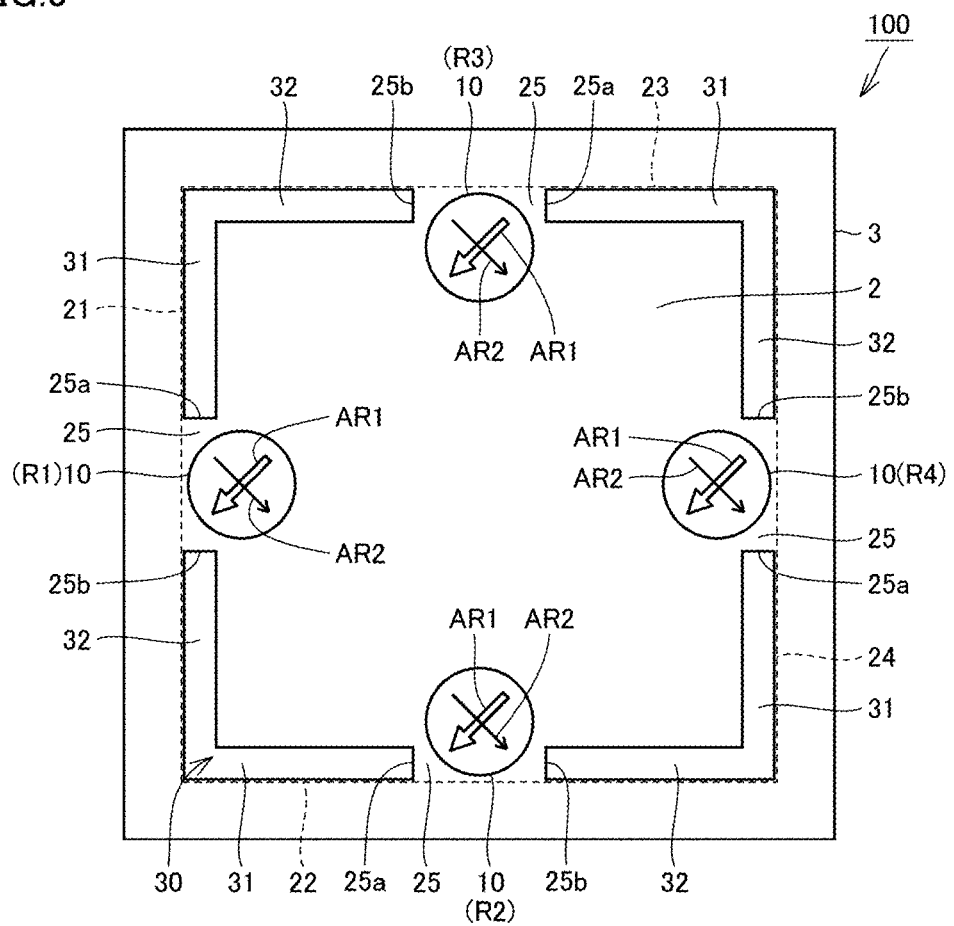
FIG. 5 is a view illustrating directions of bias magnetic fields applied to free layers and magnetization directions of reference layers in the sensor in Preferred Embodiment 1 of the present invention.
Figure 6:
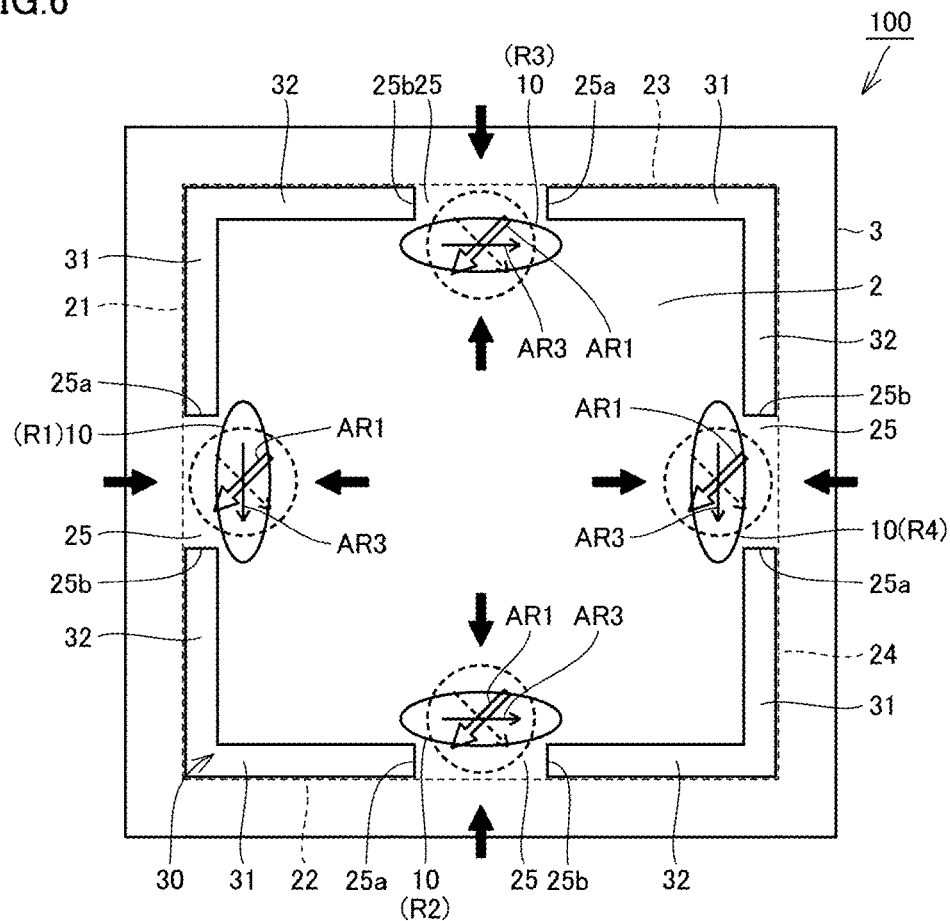
FIG. 6 is a view illustrating directions of stress-induced magnetic anisotropies generated when the film portion is deformed by the external force and the magnetization directions of the reference layers in the sensor in Preferred Embodiment 1 of the present invention.

Furthermore, in Preferred Embodiment 1, as illustrated in FIGS. 5 and 6, detection accuracy can be improved by adjusting angles between the magnetization directions of the free layers before and after deformation and the fixed magnetization directions of the reference layers.

FIG. 5 is a view illustrating the directions of the bias magnetic fields applied to the free layers and the magnetization directions of the reference layers in the sensor in Preferred Embodiment 1. Although each of the magnetoresistive element portions R1, R2, R3, and R4 includes the plurality of unit elements as described above, FIG. 5 illustrates the magnetization direction of the bias magnetic field applied to the free layer 46 and the magnetization direction of the reference layer 44 in one unit element 10 in each of the magnetoresistive element portions R1, R2, R3, and R4 for convenience.

In each unit element 10, an arrow AR2 indicated by black line indicates the direction of the bias magnetic field applied to the free layer 46 and an outlined arrow AR1 indicates the magnetization direction of the reference layer 44. In each of the magnetoresistive element portions R1, R2, R3, and R4, the directions of the bias magnetic fields applied to the free layers of the respective unit elements 10 are the same or substantially the same and the magnetization directions of the reference layers of the respective unit elements 10 are also the same or substantially the same.

As illustrated in FIG. 5, in the unit elements 10 included in any of the magnetoresistive element portions R1, R2, R3, and R4, relative angles between the directions of the bias magnetic fields applied to the free layers 46 and the magnetization directions of the reference layers 44 are about 90 degrees±5 degrees in a state where no external force is applied to the film portion 2.

To be specific, in the unit elements 10 included in any of the magnetoresistive element portions R1, R2, R3, and R4, the directions of the bias magnetic fields applied to the free layers 46 intersect with the direction parallel or substantially parallel to the side portion 21 counterclockwise at about 45 degrees±5 degrees. In the unit elements 10 included in any of the magnetoresistive element portions R1, R2, R3, and R4, the magnetization directions of the reference layers 44 intersect with the side portion 21 clockwise at about 45 degrees±5 degrees.

The bias magnetic fields cause the free layers 46 to be magnetized in the directions of the applied bias magnetic fields. That is, the relative angles between the directions in which the free layers 46 are magnetized by the bias magnetic fields and the magnetization directions of the reference layers 44 are about 90 degrees±5 degrees in the state where no external stress is applied to the film portion 2.

FIG. 6 is a view illustrating the directions of stress-induced magnetic anisotropies generated when the film portion is deformed by the external force and the magnetization directions of the reference layers in the sensor in Preferred Embodiment 1. Also in FIG. 6, in each of the magnetoresistive element portions R1, R2, R3, and R4, the direction of the stress-induced magnetic anisotropy and the magnetization direction of the reference layer in one unit element 10 are illustrated for convenience.

In each unit element 10, an arrow AR3 indicated by a black line indicates the direction of the stress-induced magnetic anisotropy and the outlined arrow AR1 indicates the magnetization direction of the reference layer 44. The direction of the bias magnetic field applied to the free layer 46 is indicated by a dashed arrow and the outer edge of each unit element 10 in a non-deformed state in which the film portion 2 is not deformed is indicated by a dashed circle.

As illustrated in FIG. 6, when the film portion 2 is deformed and compressive force acts on the connection portion 25 (more specifically, a portion of the connection portion 25, which is located on the outer edge side of the film portion 2) as indicated by black arrows in each of the side portions 21, 22, 23, and 24, the stress-induced magnetic anisotropies of the free layers 46 are exhibited by the deformation of the film portion 2. As a result, the magnetization directions of the free layers 46 become the directions of the stress-induced magnetic anisotropies. On the other hand, the directions of the bias magnetic fields applied to the free layers 46 and the magnetization directions of the reference layers 44 are not changed.

When the above-described compressive force acts, the relative angles between the directions of the stress-induced magnetic anisotropies in the free layers 46 and the directions of the bias magnetic fields applied to the free layers 46 are about 45 degrees±5 degrees.

To be specific, on the sides of the side portions 21 and 24, the directions of the stress-induced magnetic anisotropies are parallel or substantially parallel to the side portion 21 and correspond to the direction from the one end 25a toward the other end 25b of the connection portion 25 in the side portion 21. On the other hand, the directions of the bias magnetic fields applied to the free layers 46 are directions obtained by rotating the directions of the stress-induced magnetic anisotropies counterclockwise by about 45 degrees. That is, the relative angles between the directions of the stress-induced magnetic anisotropies in the free layers 46 and the directions of the bias magnetic fields applied to the free layers 46 are about 45 degrees±5 degrees.

On the sides of the side portions 22 and 23, the directions of the stress-induced magnetic anisotropies are orthogonal or substantially orthogonal to the side portion 21 and correspond to the direction from the side portion 21 toward the side portion 24. On the other hand, the directions of the bias magnetic fields applied to the free layers 46 are directions rotated clockwise by about 45 degrees±5 degrees with respect to the direction orthogonal or substantially orthogonal to the side portion 21. That is, the relative angles between the directions of the stress-induced magnetic anisotropies in the free layers 46 and the directions of the bias magnetic fields applied to the free layers 46 are about 45 degrees±5 degrees.

On the sides of the side portions 21 and 24, the magnetization directions of the reference layers 44 are directions obtained by rotating the directions of the stress-induced magnetic anisotropies clockwise by about 45 degrees. On the sides of the side portions 22 and 23, the magnetization directions of the reference layers 44 are directions obtained by rotating the directions of the stress-induced magnetic anisotropies clockwise by about 135 degrees±5 degrees.

Here, as described above, the free layers 46 have disk shapes and have magnetic vortex structures. When the strain amounts of the unit elements 10 are 0, the in-plane magnetization directions of the free layers 46 having the magnetic vortex structures are point-symmetric, and the free layers 46 have magnetization in the direction perpendicular or substantially perpendicular to the plane at the centers thereof. That is, it can be considered to be equivalent to the case of biasing in the direction perpendicular or substantially perpendicular to the plane.

As described above, the magnetization fixing directions of the reference layers 44 are set such that the relative angles with respect to the directions of the stress-induced anisotropic magnetic fields generated when the magnetoresistive elements are stretched or compressed are about 45 degrees±5 degrees.

In general, when the unit elements 10 have disk shapes and are deformed into elliptical shapes by causing stress to act thereon, it is difficult to uniquely determine whether the directions of the stress-induced anisotropic magnetic fields are directed to one sides or the other sides of the major axis directions of the elliptical shapes only by the inverse magnetostrictive effect.

Further, in the laminated structures of free layer/tunnel barrier layers/reference layers, a weak interlayer exchange coupling force acts on the free layers to align the free layers in directions parallel or substantially parallel to the magnetization directions of the reference layers when the tunnel barrier layers have general film thicknesses. When the directions of the stress-induced anisotropic magnetic fields are controlled by the interlayer exchange coupling force, the output characteristics for the positive and negative of the strain of the magnetoresistive elements are even or substantially even.

For this reason, in Preferred Embodiment 1, the intensities of the bias magnetic fields in the in-plane direction, which are applied to the free layers 46, are made larger than the intensities of the interlayer exchange coupling magnetic fields acting between the free layers and the reference layers to uniquely determine the magnetization directions of the free layers and bias the free layers 46 in the directions of about 90 degrees±5 degrees with respect to the magnetization directions of the reference layers when strain is applied to the magnetoresistive elements. As a result, output characteristics of an odd function are obtained in the bridge circuit.

The case where the relative angles between the directions of the bias magnetic fields applied to the free layers 46 and the magnetization directions of the reference layers 44 and the relative angles between the directions of the stress-induced magnetic anisotropies of the free layers 46 and the directions of the bias magnetic fields have the ranges of about ±5 degrees has been described as an example. However, more favorable output characteristics can be obtained by setting the relative angles between the directions of the bias magnetic fields applied to the free layers 46 and the magnetization directions of the reference layers 44 to about 90 degrees and setting the relative angles between the directions of the stress-induced magnetic anisotropies of the free layers 46 and the directions of the bias magnetic fields to about 45 degrees.

Figure 7:
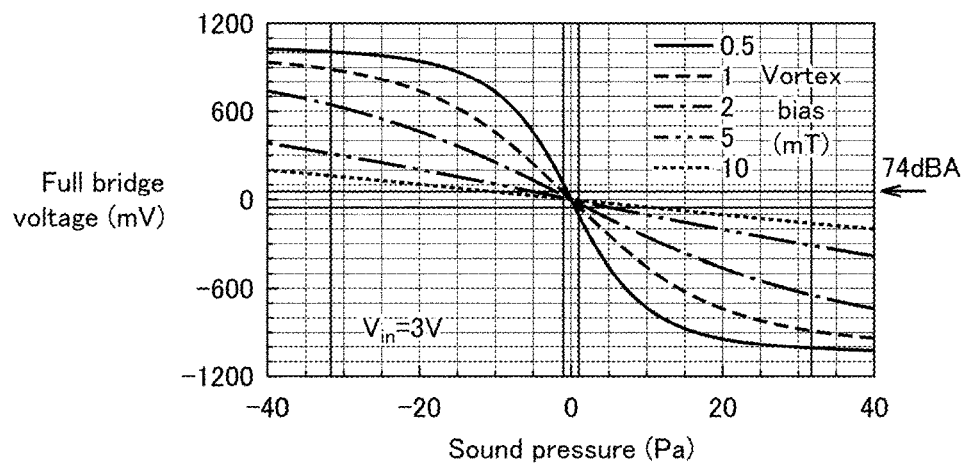
FIG. 7 is a graph illustrating a relationship between pressure that is input to the film portion and output of a full-bridge circuit in the sensor in Preferred Embodiment 1 of the present invention.

FIG. 7 is a graph illustrating a relationship between pressure that is input to the film portion 2 and output of the full-bridge circuit in the sensor in Preferred Embodiment 1. FIG. 7 illustrates output characteristics of the full-bridge circuit in the case where the disk diameters of the plurality of unit elements 10 defining the magnetoresistive element portions are constant or substantially constant and the disk diameters are changed.

Changes in the disk diameters can adjust the intensities of the effective bias magnetic fields for sensitivity control equivalent to the case of biasing in the direction perpendicular or substantially perpendicular to the plane by the magnetic vortexes. Specifically, the intensities of the bias magnetic fields can be decreased by increasing the disk diameters, and the intensities of the bias magnetic fields can be increased by decreasing the disk diameters.

In FIG. 7, the intensities of the bias magnetic fields by the magnetic vortexes are changed to about 0.5 mT, about 1 mT, about 2 mT, about 5 mT, and about 10 mT by changing the disk diameters, and the output characteristics of the full-bridge circuit with the respective intensities of the bias magnetic fields are illustrated.

As described above, by setting the directions in which the free layers 46 are magnetized by the bias magnetic fields in the in-plane direction, the magnetization directions of the reference layers 44, and the directions of the stress-induced magnetic anisotropies to have the above-described relationship, the bridge circuit has output characteristics of an odd function as illustrated in FIG. 7.

Further, when the unit elements having the intensities of the bias magnetic fields by the magnetic vortexes, which are reduced by increasing the disk diameters, are used, a large output is obtained from the bridge circuit, and when the unit elements having the intensities of the bias magnetic fields by the magnetic vortexes, which are increased by decreasing the disk diameters, are used, a small output is obtained from the bridge circuit.

In this manner, the sensitivity can be adjusted by changing the disk diameters of the unit elements 10. Further, the disk diameters can be adjusted for the respective unit elements 10 by, for example, etching in a manufacturing process. Therefore, the plurality of unit elements 10 having different sensitivities can be provided in the same film portion 2 by adjusting the disk diameters of the unit elements 10 in the plane.

Here, in Preferred Embodiment 1, an absolute value of the stress slightly decreases from the central portion towards both outer sides along the outer edge of the film portion 2 in each of the connection portions 25. In order to compensate for such imbalance in the absolute value of the stress, the disk diameters of the unit elements 10 positioned on the central portion of each of the connection portions 25 are smaller than the disk diameters of the unit elements 10 positioned on both end sides of each of the connection portions 25.

In the connection portions 25 having reduced areas due to the formation of the slit portion 30, resistances of the connection portions 25 per area can be increased while maintaining preferable responsiveness by appropriately adjusting the disk diameters in accordance with the absolute values of the stress acting when the film portion 2 is deformed and connecting them in series. Current consumption can thus be reduced. Further, when resistance values of the magnetoresistive element portions are set to the same or substantially the same values as that of an existing magnetoresistive element portion, the sensor 100 can be miniaturized.

In addition, appropriate adjustment of the disk diameters of the unit elements 10 as described above can increase the number of connected unit elements 10 even with the same or substantially the same installation area, and thus reliability design, redundancy design, and the like can be performed. Accordingly, high reliability can be obtained.

As described above, formation of the unit elements with high aspect ratios of the free layers 46 at positions in the film portion 2 where the stress by external force is large can adjust sensitivity and output and influence of disturbance magnetic fields independently. Therefore, high sensitivity and high output and resistance to the disturbance magnetic fields can be achieved at the same time.

Manufacturing Method

FIGS. 8 to 15 are views illustrating first to eighth steps of a non-limiting example of a manufacturing process of the sensor in Preferred Embodiment 1. A non-limiting example of a method of manufacturing the sensor 100 in Preferred Embodiment 1 will be described with reference to FIGS. 8 to 15.

Figure 8:
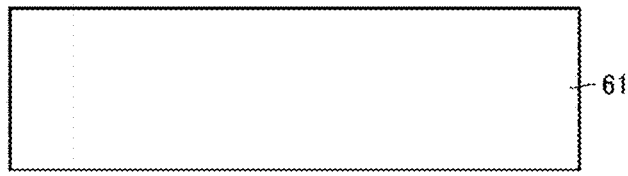
FIG. 8 is a view illustrating a first step of a non-limiting example of a manufacturing process of the sensor in Preferred Embodiment 1 of the present invention.

When the sensor 100 in Preferred Embodiment 1 is manufactured, as illustrated in FIG. 8, a substrate 61 is prepared in the first step. The substrate 61 is, for example, a silicon substrate. For example, an insulating layer made of silicon oxide, silicon nitride, or the like or polysilicon may be formed on the surface of the silicon substrate on which the film portion is to be formed.

Subsequently, dry etching is performed on the surface of the substrate 61 to form a trench portion (not illustrated), and a wiring portion made of Cu or the like, for example, is formed in the trench portion by plating or sputtering, for example. Then, an excess conductive portion protruding to an outer side portion from an opening of the trench portion is polished by, for example, chemical mechanical polishing (CMP).

Figure 9:
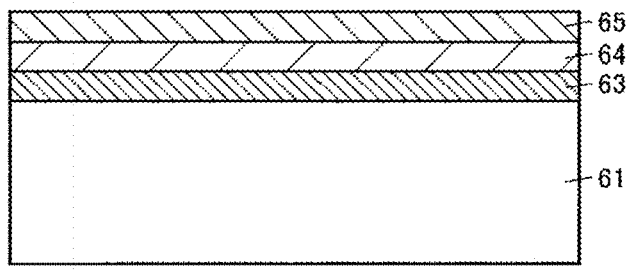
FIG. 9 is a view illustrating a second step of a non-limiting example of a manufacturing process of the sensor in Preferred Embodiment 1 of the present invention.

Thereafter, as illustrated in FIG. 9, in the second step, a lower electrode film 63, a TMR laminated film 64, and an upper electrode film 65 are laminated on the substrate 61. Specifically, the lower electrode film 63, a pinning film, a pinned film, a magnetic coupling film, a reference film, a tunnel barrier film, a free film, a separation film, a bias film, and the upper electrode film 65 are laminated.

The lower electrode film 63, the pinning film, the pinned film, the magnetic coupling film, the reference film, the tunnel barrier film, the free film, the separation film, the bias film, and the upper electrode film become the lower electrode layer 40, the pinning layer 41, the pinned layer 42, the magnetic coupling layer 43, the reference layer 44, the tunnel barrier layer 45, the free layer 46, the separation layer 47, the bias layer 48, and the upper electrode layer 49 after patterning.

For example, Ru/Ta is film-formed as the lower electrode film 63. For example, CoFe/IrMn is film-formed as the pinned film/pinning film (ferromagnetic film/antiferromagnetic film) above the lower electrode film 63. This laminated film defines and functions as the pinned layer with exchange coupling caused by annealing in a magnetic field, which will be described later. IrMn may be film-formed as the pinning film, for example.

For example, Ru is film-formed as the magnetic coupling film (nonmagnetic film) above the pinned film (ferromagnetic film), and for example, CoFeB is film-formed as the reference film (lower ferromagnetic film) above the nonmagnetic film. The reference film/magnetic coupling film/pinned film (lower ferromagnetic film/nonmagnetic film/ferromagnetic film) define the SAF structure.

For example, MgO is film-formed as the tunnel barrier film, and for example, FeB/CoFeB is film-formed as the free film (upper ferromagnetic film) on the tunnel barrier film. FeB has a large magnetostriction constant, is amorphous, and has small crystal magnetic anisotropy.

Cu is, for example, film-formed as the separation film. The separation film is not limited to being made of Cu as described above and can be appropriately selected depending on positive magnetic coupling or negative magnetic coupling.

For example, IrMn/CoFeB is film-formed as the bias film (antiferromagnetic film/ferromagnetic film). The blocking temperature of the antiferromagnetic film in the bias film is preferably different from the blocking temperature of the antiferromagnetic film on the reference film side. The magnetization direction of the reference layer can thus be different from the bias magnetic field direction by the bias layer as will be described later.

When the antiferromagnetic film in the bias film and the antiferromagnetic film in the reference film are made of the same material, the antiferromagnetic film in the reference film is made thicker than the antiferromagnetic film in the bias film. For example, Ta/Ru is film-formed as the upper electrode film 65.

Subsequently, the substrate 61 on which the lower electrode film 63, the TMR laminated film 64, and the upper electrode film 65 are formed is annealed in the magnetic field.

Figure 10:
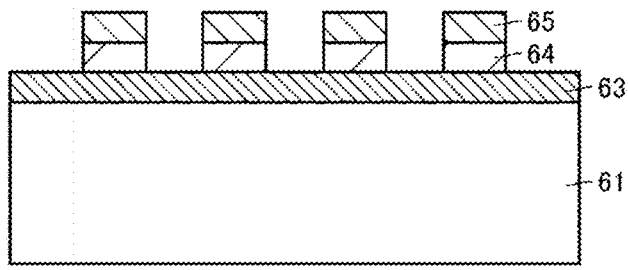
FIG. 10 is a view illustrating a third step of a non-limiting example of a manufacturing process of the sensor in Preferred Embodiment 1 of the present invention.

Then, as illustrated in FIG. 10, in the third step, the TMR laminated film 64 and the upper electrode film 65 are patterned into desired shapes by, for example, photolithography and dry etching.

Figure 11:
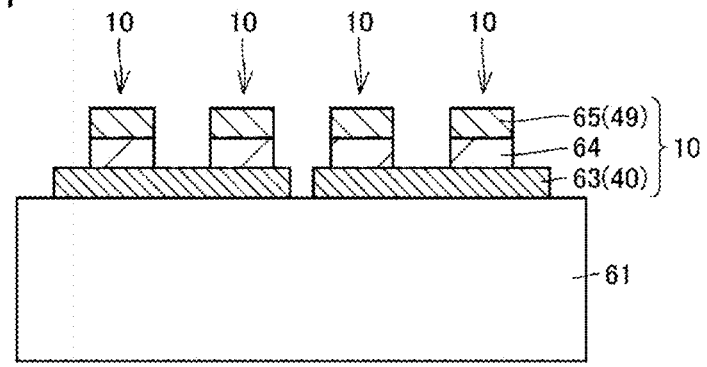
FIG. 11 is a view illustrating a fourth step of a non-limiting example of a manufacturing process of the sensor in Preferred Embodiment 1 of the present invention.

Subsequently, as illustrated in FIG. 11, in the fourth step, portions of the lower electrode film 63 are removed by, for example, photolithography and dry etching to form a wiring pattern. Thus, the plurality of unit elements 10 are formed. The plurality of unit elements 10 are patterned in the disk shapes. The disk diameters of the plurality of unit elements 10 are adjusted in accordance with the stress acting on the film portion 2 as described above. Some of the plurality of unit elements 10 are electrically connected by the wiring pattern formed by the lower electrode film 63.

Figure 12:
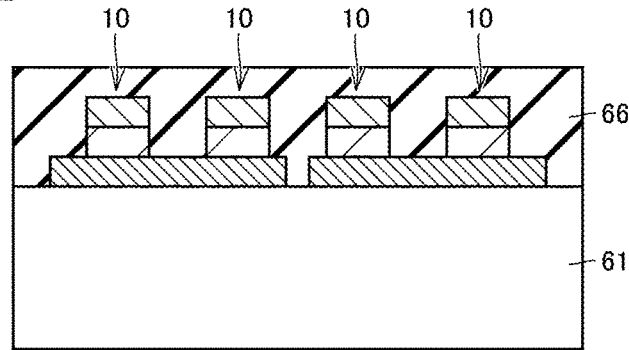
FIG. 12 is a view illustrating a fifth step of a non-limiting example of a manufacturing process of the sensor in Preferred Embodiment 1 of the present invention.

Thereafter, as illustrated in FIG. 12, in the fifth step, an insulating film 66 covers the substrate 61 so as to cover the plurality of unit elements 10. For example, $SiO_2$ can be used as the insulating film 66.

Figure 13:
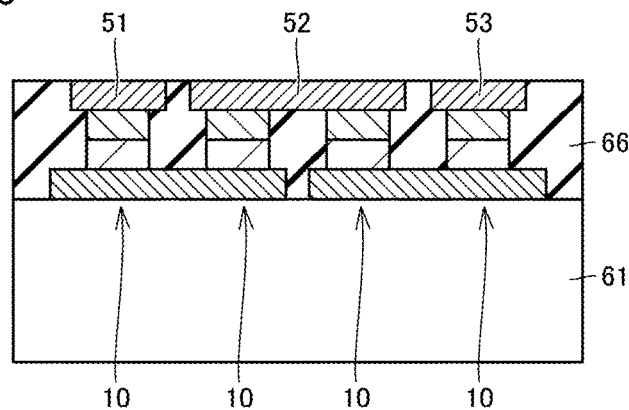
FIG. 13 is a view illustrating a sixth step of a non-limiting example of a manufacturing process of the sensor in Preferred Embodiment 1 of the present invention.

Subsequently, as illustrated in FIG. 13, in the sixth step, portions of the insulating film 66 are removed by, for example, photolithography and dry etching to form contact holes. Then, metal wirings 51, 52, and 53 are formed in the contact holes by, for example, photolithography and lift-off. Cu can be used as the metal wirings 51, 52, and 53.

Figure 14:
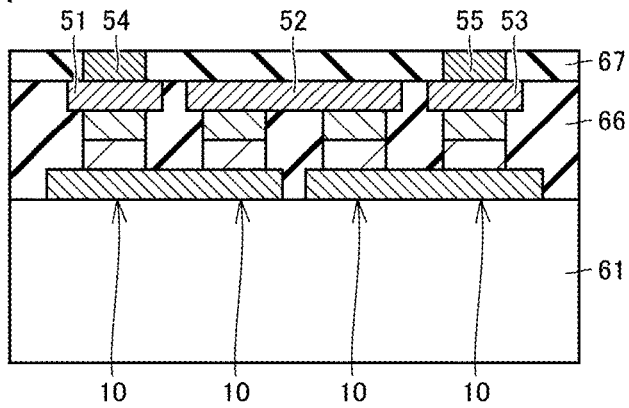
FIG. 14 is a view illustrating a seventh step of a non-limiting example of a manufacturing process of the sensor in Preferred Embodiment 1 of the present invention.

Thereafter, as illustrated in FIG. 14, in the seventh step, a passivation film 67 is formed on the insulating film 66 so as to cover the metal wirings 51, 52, and 53. For example, $SiO_2$ can be used as the passivation film 67.

Then, portions of the passivation film 67 are removed by, for example, photolithography and dry etching to form openings. Subsequently, connection wirings 54 and 55 for connection to the electrode portions P1, P2, P3, and P4 are formed in the openings by, for example, photolithography and lift-off.

Subsequently, the magnetization directions of the reference layers are fixed. Here, as illustrated in FIG. 5 described above, the magnetization directions are determined in accordance with the shape of the slit portion 30 to be formed in a subsequent step, the direction of the stress acting on the connection portions 25 to be formed by the slit portion 30, and the configuration of the full-bridge circuit.

As examples of a method of fixing the magnetization directions of the reference layers, there are a method including local heating by laser irradiation while applying a magnetic field by an electromagnet or a permanent magnet, a method including heating by energization to heater wiring arranged in the vicinity of the elements while applying a magnetic field by an electromagnet or a permanent magnet, a method including heat treatment in a state where a jig capable of locally applying a magnetic field is arranged, and the like.

Subsequently, the directions of the bias magnetic fields are determined. Specifically, a method similar to the above-described method of fixing the magnetization directions of the reference layers is performed. At this time, the temperature at which the unit elements 10 are heated is a temperature at which the magnetization directions of the reference layers do not change.

Figure 15:
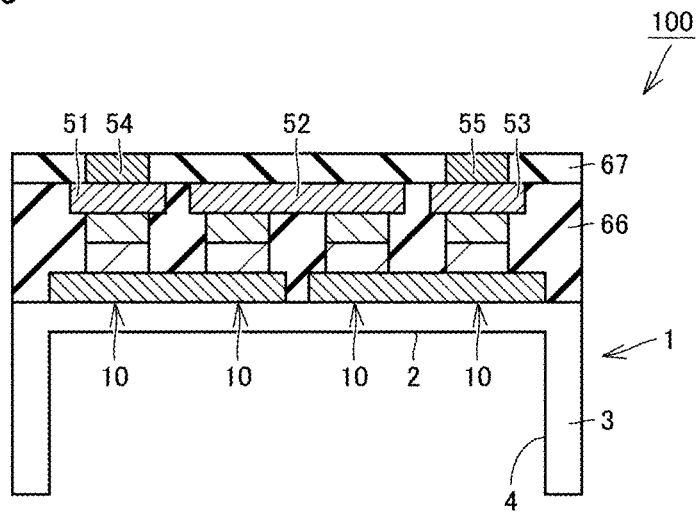
FIG. 15 is a view illustrating an eighth step of a non-limiting example of a manufacturing process of the sensor in Preferred Embodiment 1 of the present invention.

Then, as illustrated in FIG. 15, in the eighth step, dry etching is used to remove a portion of the substrate 61 from the main surface side of the substrate 61 located on the side opposite to the side on which the unit elements 10 are formed, thus forming the cavity portion 4. The deformable film portion 2 is formed by forming the cavity portion 4 in this manner. Subsequently, a portion of the film portion 2 is dry-etched to form the slit portion 30 having a desired shape at a predetermined position.

As described above, the sensor 100 in Preferred Embodiment 1 that includes the full-bridge circuit defined by the plurality of magnetoresistive elements and can improve the sensitivity is manufactured through such a manufacturing process.

Although the case where the upper end sides of the plurality of unit elements 10 are electrically connected by the metal wirings 51, 52, and 53 has been described as an example in the above-described manufacturing method, the upper end sides of the plurality of unit elements 10 may be electrically connected by the upper electrode. In this case, the layers from the lower electrode film 63 to the bias film are laminated on the substrate 61 in the second step, and the upper electrode layer 49 is formed instead of the metal wirings 51, 52, and 53 in the fifth step.

Preferred Embodiment 2

Figure 16:
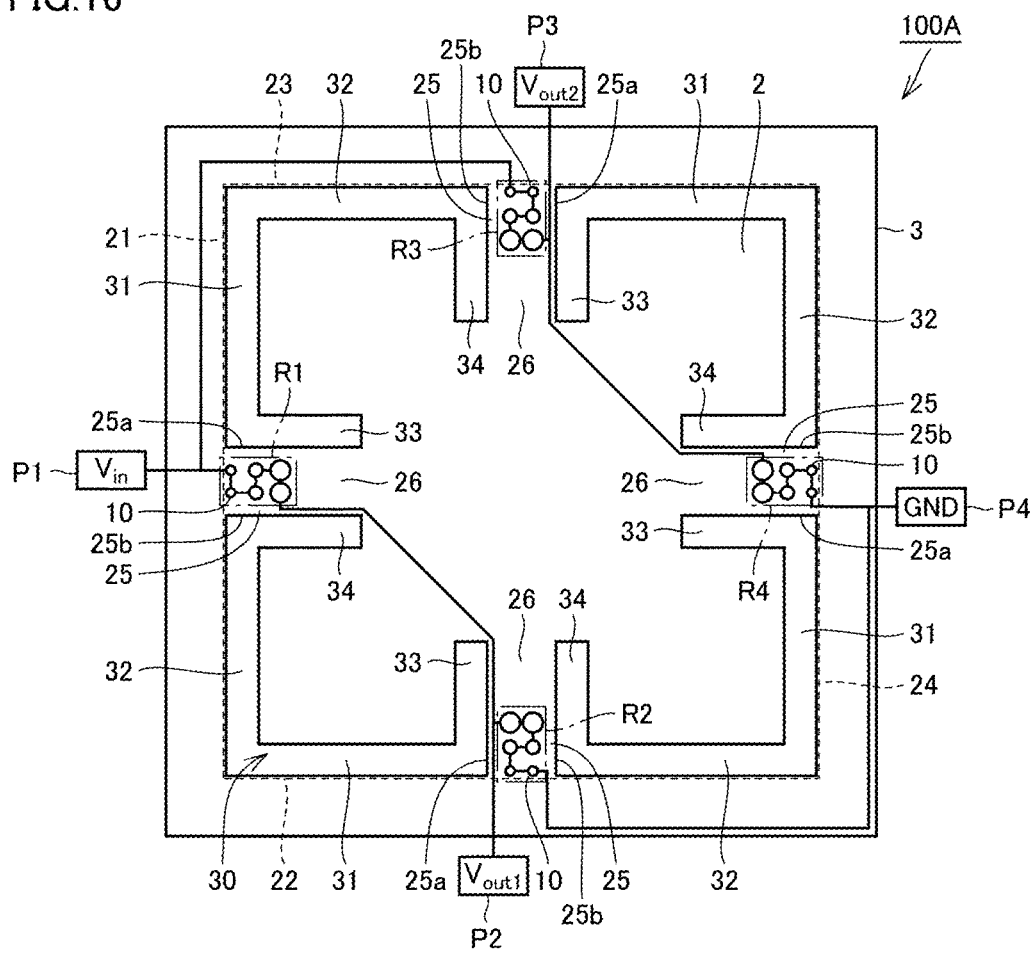
FIG. 16 is a schematic plan view illustrating a sensor according to Preferred Embodiment 2 of the present invention.

FIG. 16 is a schematic plan view illustrating a sensor in Preferred Embodiment 2 of the present invention. A sensor 100A in Preferred Embodiment 2 will be described with reference to FIG. 16.

As illustrated in FIG. 16, the sensor 100A in Preferred Embodiment 2 is different from the sensor 100 in Preferred Embodiment 1 in the configuration of the slit portion 30. The other configurations thereof are the same or substantially the same.

As illustrated in FIG. 16, as compared with Preferred Embodiment 1, the slit portion 30 further includes a plurality of pairs of extending portions 33 and 34 extending in the directions intersecting with the side portions that respectively correspond to the plurality of connection portions 25 along the outer edge of the film portion 2.

The pairs of extending portions 33 and 34 respectively extend from the plurality of corresponding side portions 21, 22, 23, and 24 towards an inner side portion of the film portion 2. The pairs of extending portions 33 and 34 respectively extend in the directions orthogonal or substantially orthogonal to the plurality of corresponding side portions 21, 22, 23, and 24.

Specifically, the pair of extending portions 33 and 34 provided on the side portion 21 side extend in the direction orthogonal or substantially orthogonal to the side portion 21. The pair of extending portions 33 and 34 provided on the side portion 22 side extend in the direction orthogonal or substantially orthogonal to the side portion 22. The pair of extending portions 33 and 34 provided on the side portion 23 side extend in the direction orthogonal or substantially orthogonal to the side portion 23. The pair of extending portions 33 and 34 provided on the side portion 24 side extend in the direction orthogonal or substantially orthogonal to the side portion 24.

Each of the plurality of connection portions 25 includes a projecting portion 26 extending between the pair of extending portions 33 and 34. Each of the plurality of magnetoresistive element portions R1, R2, R3, and R4 is provided at least in a portion of the projecting portion 26, which is located on the outer edge side of the film portion 2.

Figure 17:
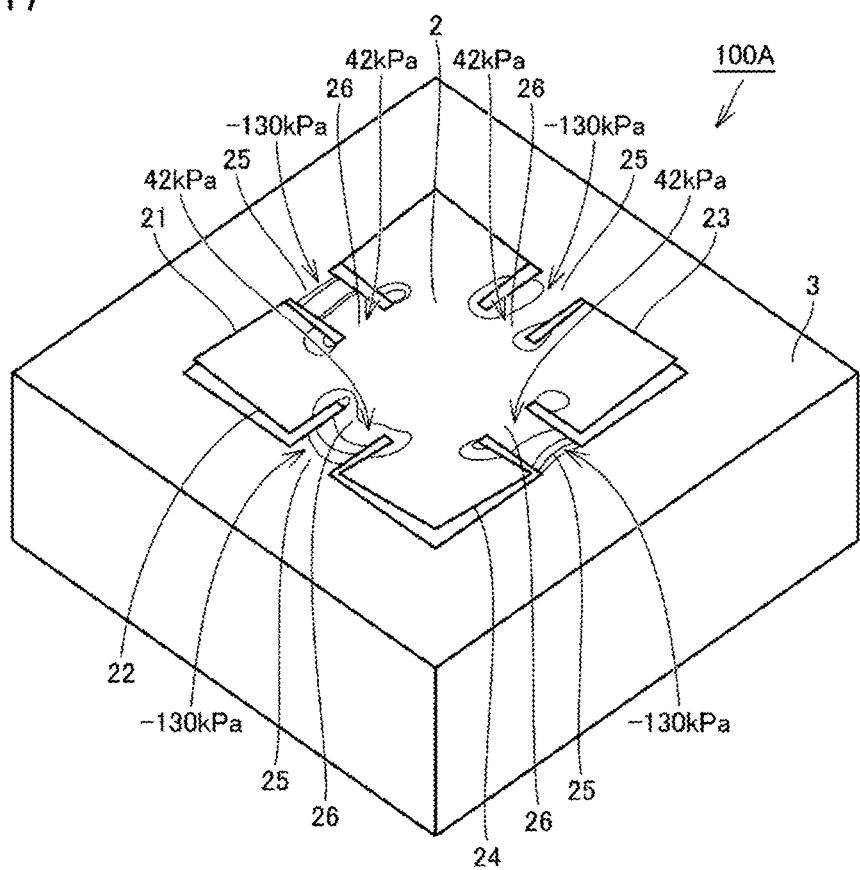
FIG. 17 is a perspective view illustrating a state where a film portion is deformed by external force in the sensor in Preferred Embodiment 2 of the present invention.

FIG. 17 is a perspective view illustrating a state in which the film portion is deformed by external force in the sensor in Preferred Embodiment 2. A state in which the film portion 2 is deformed in the sensor 100A in Preferred Embodiment 2 will be described with reference to FIG. 17.

As illustrated in FIG. 17, when stress is applied to the film portion 2 and the film portion 2 is deflected and deformed, the stress is concentrated on the plurality of connection portions 25. In the connection portions 25, the projecting portions 26 extend between the pairs of extending portions 33 and 34 from the outer edge of the film portion 2. Therefore, when the film portion is deformed, the stress can be further concentrated on the projecting portions 26 on the outer edge side of the film portion (on the base sides of the connection portions 25).

As in Preferred Embodiment 1, the lengths of the side portions 21, 22, 23, and 24 are, for example, about 600 μm, and the thickness of the film portion 2 is about 1 μm. Further, the lengths of the first slit portions 31 and the second slit portions 32 along the respective side portions are, for example, about 250 μm. The widths of the first slit portions 31 and the second slit portions 32, which are orthogonal or substantially orthogonal to the longitudinal directions of the first slit portions 31 and the second slit portions 32, are, for example, about 15 μm. Further, the lengths of the pairs of extending portions 33 and 34 orthogonal or substantially orthogonal to the corresponding side portions are, for example, about 125 μm. The widths of the pairs of extending portions 33 and 34, which are orthogonal or substantially orthogonal to the longitudinal directions of the pairs of extending portions 33 and 34, are, for example, about 15 μm.

In this case, when a case where pressure of approximately 1 Pa is applied to the film portion 2 from the cavity portion 4 side (the back surface side of the film portion 2) is simulated and stress distribution is analyzed by FEM, tensile stress of approximately 42 KPa at maximum acts on the tip sides of the connection portions 25 (on the projecting portions 26 on the tip sides of the pairs of extending portions 33 and 34) and compressive stress of approximately 130 KPa at maximum acts on the base sides of the connection portions 25.

As described above, in Preferred Embodiment 2, stress can be further concentrated on the base sides of the connection portions 25 as compared with Preferred Embodiment 1. As a result, in the unit elements 10, the intensities of the bias magnetic fields for sensitivity control, which are applied to the free layers 46, can be increased, such that controllability of the bias intensities for sensitivity control can be improved and resistances to disturbance magnetic fields can be improved.

In the sensor 100A in Preferred Embodiment 2, a relationship among the directions in which the free layers 46 are magnetized by the bias magnetic fields in the in-plane direction, the magnetization directions of the reference layers 44, and the directions of the stress-induced magnetic anisotropies is the same or substantially the same as that in Preferred Embodiment 1.

The sensor 100A in Preferred Embodiment 2 is manufactured in accordance with the non-limiting example of a method of manufacturing the sensor 100 in Preferred Embodiment 1. In this case, a portion of the film portion 2 is dry-etched such that the first slit portions 31, the second slit portions 32, and the pairs of extending portions 33 and 34 are formed in a step based on the eighth step in Preferred Embodiment 1.

Preferred Embodiment 3

Figure 18:
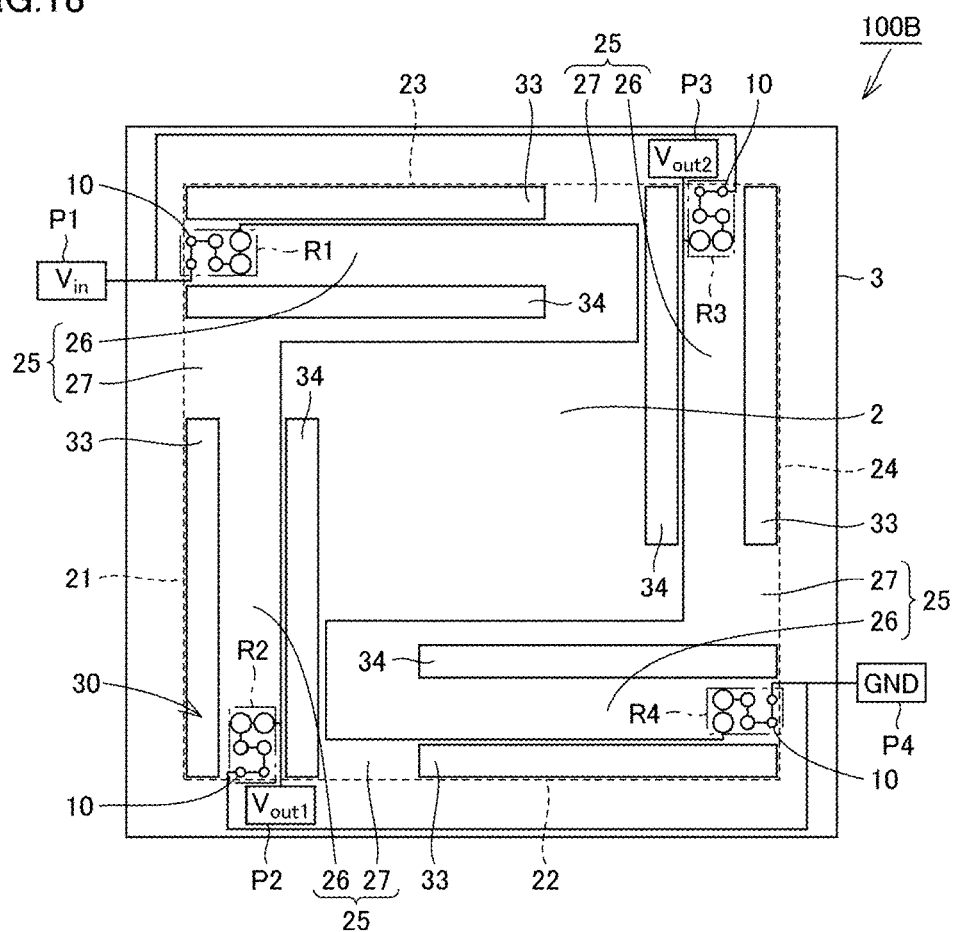
FIG. 18 is a schematic plan view illustrating a sensor according to Preferred Embodiment 3 of the present invention.

FIG. 18 is a schematic plan view illustrating a sensor according to Preferred Embodiment 3 of the present invention. A sensor 100B in Preferred Embodiment 3 will be described with reference to FIG. 18.

As illustrated in FIG. 18, the sensor 100B in Preferred Embodiment 3 is different from the sensor 100 in Preferred Embodiment 1 in the configuration of the slit portion 30.

As compared with Preferred Embodiment 1, the slit portion 30 includes no first slit portion 31 and no second slit portion 32 and includes only the plurality of pairs of extending portions 33 and 34. Also in this case, the slit portion 30 is includes portions along the plurality of side portions 21, 22, 23, and 24, so that the film portion 2 includes the plurality of connection portions 25 in which the plurality of side portions 21, 22, 23, and 24 is partially connected to the support body 3.

The film portion 2 has a rectangular or substantially rectangular shape including four corner portions, and the pairs of extending portions 33 and 34 extend from corresponding predetermined corner portions toward corner portions located adjacent to the predetermined corner portions on one sides in the circumferential direction of the film portion 2.

One extending portions 33 of the pairs of extending portions 33 and 34 extend along the corresponding side portions. The other extending portions 34 of the pairs of extending portions 33 and 34 are provided in inner side portions of the film portion 2 further inward than the one extending portions 33 so as to be parallel or substantially parallel to the one extending portions 33.

The connection portions 25 are provided between the one extending portions 33 extending from the predetermined corner portions and the corner portions located adjacent to the predetermined corner portions on one sides in the circumferential direction of the film portion 2. The connection portions 25 include the projecting portions 26 extending between the pairs of extending portions 33 and 34 provided at the adjacent corner portions. Each of the magnetoresistive element portions R1, R2, R3, and R4 is provided in a portion of the corresponding projecting portion 26, which is located on the outer edge side of the film portion 2.

The connection portions 25 include portions 27 between the one extending portions 33 extending from the predetermined corner portions and the other extending portions 34 of the pairs of extending portions 33 and 34 provided at the adjacent corner portions.

The lengths of the one extending portions 33 and the other extending portions 34 along the corresponding side portions are the same or substantially the same. The lengths of the pairs of extending portions 33 and 34 along the corresponding side portions are preferably, for example, equal to or more than about 50% of the lengths of the side portions along the corresponding side portions, and more preferably, for example, equal to or more than about 80% thereof.

With such a length relationship, when the film portion is deformed, stress can be concentrated on portions of the projecting portions 26, which are located on the outer edge side of the film portion 2, and the stress acting on the magnetoresistive element portions R1, R2, R3, and R4 can be increased. As a result, in the unit elements 10, the intensities of the bias magnetic fields for sensitivity control, which are applied to the free layers 46, can be increased, such that controllability of the bias intensities for sensitivity control can be improved and resistances to disturbance magnetic fields can be improved.

In the sensor 100B in Preferred Embodiment 3, a relationship among the directions in which the free layers 46 are magnetized by the bias magnetic fields in the in-plane directions, the magnetization directions of the reference layers 44, and the directions of the stress-induced magnetic anisotropies is the same or substantially the same as that in Preferred Embodiment 1.

The sensor 100B in Preferred Embodiment 3 is manufactured in accordance with the non-limiting example of a method of manufacturing the sensor 100 in Preferred Embodiment 1. In this case, in the third step in Preferred Embodiment 1, the TMR laminated film 64 and the upper electrode film 65 are patterned such that the plurality of unit elements 10 are formed in regions of the film portion 2, which correspond to the plurality of corner portions. Further, in a step based on the eighth step in Preferred Embodiment 1, portions of the film portion 2 are dry-etched such that the pairs of extending portions 33 and 34 are formed along the side portions from the plurality of corner portions in the film portion 2.

Preferred Embodiment 4

Figure 19:
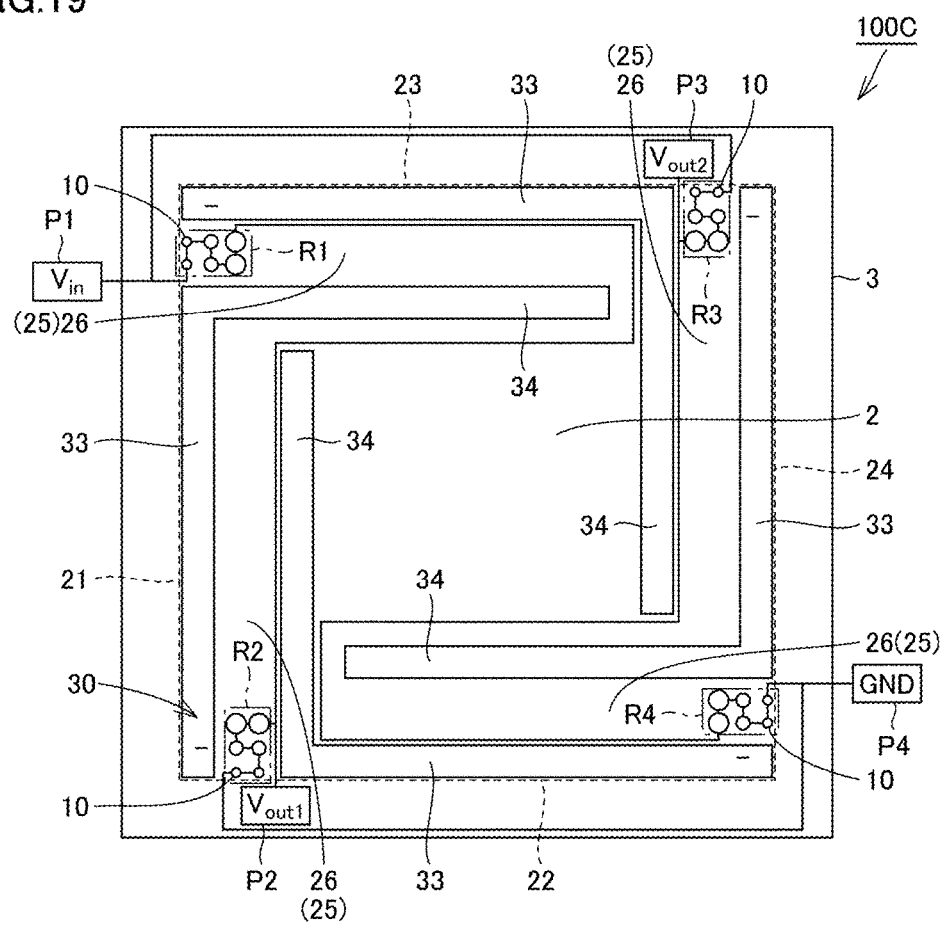
FIG. 19 is a schematic plan view illustrating a sensor according to Preferred Embodiment 4 of the present invention.

FIG. 19 is a schematic plan view illustrating a sensor according to Preferred Embodiment 4 of the present invention. A sensor 100C in Preferred Embodiment 4 will be described with reference to FIG. 19.

As illustrated in FIG. 19, the sensor 100C in Preferred Embodiment 4 is different from the sensor 100B in Preferred Embodiment 3 in the configuration of the slit portion 30.

In Preferred Embodiment 4, in the plurality of pairs of extending portions 33 and 34 defining the slit portion 30, the lengths of the one extending portions 33 are larger than the lengths of the other extending portions 34, and the one extending portions 33 are connected to the other extending portions 34 of the pairs of extending portions 33 and 34 provided at corner portions located adjacent to the predetermined corner portions.

The connection portions 25 are thus defined by the projecting portions 26 extending between the pairs of extending portions 33 and 34.

Figure 20:
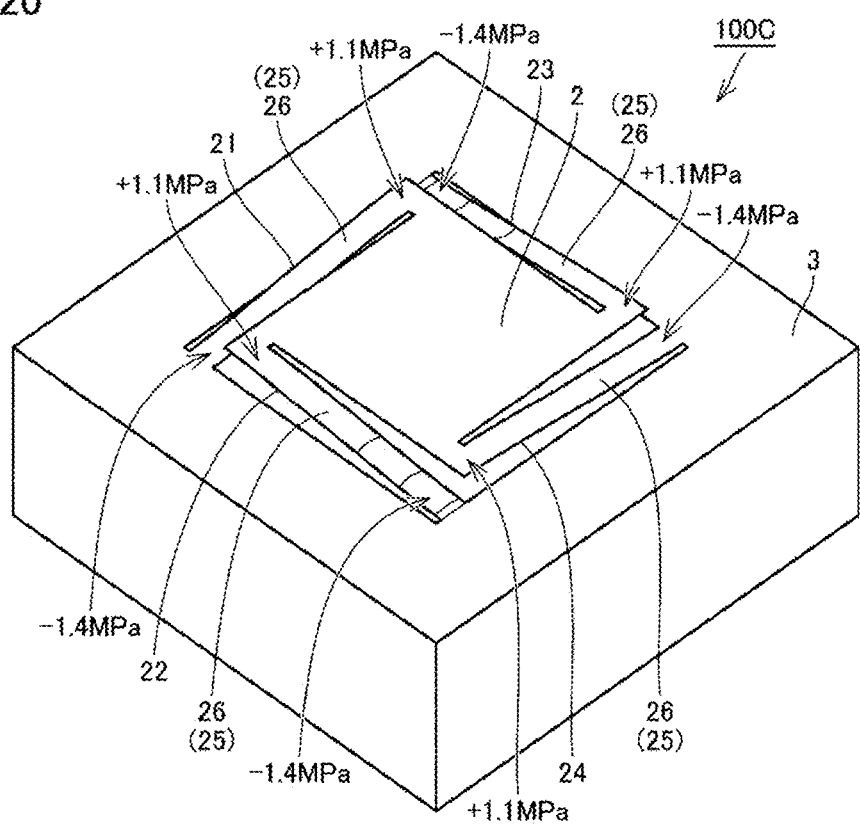
FIG. 20 is a perspective view illustrating a state where a film portion is deformed by external force in the sensor in Preferred Embodiment 4 of the present invention.

FIG. 20 is a perspective view illustrating a state in which a film portion is deformed by external force in the sensor in Preferred Embodiment 4. The state in which the film portion 2 is deformed in the sensor 100C in Preferred Embodiment 4 will be described with reference to FIG. 20.

As illustrated in FIG. 20, when stress is applied to the central portion of the film portion 2 and the film portion 2 is deflected and deformed, the stress is concentrated on the plurality of projecting portions 26. In Preferred Embodiment 4, since the connection portions 25 are defined by only the projecting portions 26, when the film portion 2 is deformed, the stress can be further concentrated on the projecting portions 26 on the outer edge side of the film portion 2 (the base sides of the connection portions 25) as compared with Preferred Embodiment 3.

As in Preferred Embodiment 1, the lengths of the side portions 21, 22, 23, and 24 are, for example, about 600 μm, and the thickness of the film portion 2 is, for example, about 1 μm. Further, the lengths of the one extending portions 33 of the pairs of extending portions 33 and 34, which are orthogonal or substantially orthogonal to the corresponding side portions, are, for example, about 535 μm, and the lengths of the other extending portions 34 thereof are, for example, about 470 μm. Moreover, the widths of the one extending portions 33 and the widths of the other extending portions 34, which are orthogonal or substantially orthogonal to the longitudinal directions of the pairs of extending portions 33 and 34, are, for example, about 15 μm.

In this case, when a case where pressure of approximately 1 Pa is applied to the film portion 2 from the cavity portion 4 side (the back surface side of the film portion 2) is simulated and stress distribution is analyzed by FEM, tensile stress of approximately 1.1 MPa acts on the tip sides of the connection portions 25 (on the projecting portions 26 on the tip sides of the pairs of extending portions 33 and 34) and compressive stress of approximately 1.4 MPa acts on the base sides of the connection portions 25.

As described above, in Preferred Embodiment 4, stress of equal to or more than about ten times as large as that in Preferred Embodiment 1 can be concentrated on the base sides of the connection portions 25. As a result, in the unit elements 10, the intensities of the bias magnetic fields for sensitivity control, which are applied to the free layers 46, can be further increased. Therefore, controllability of the bias intensities for sensitivity control can be further improved, and resistance to disturbance magnetic fields can be further improved.

Also in the sensor 100C in Preferred Embodiment 4, a relationship among the directions in which the free layers 46 are magnetized by the bias magnetic fields in the in-plane direction, the magnetization directions of the reference layers 44, and the directions of the stress-induced magnetic anisotropies is the same or substantially the same as that in Preferred Embodiment 1.

The sensor 100C in Preferred Embodiment 4 is manufactured in accordance with the non-limiting example of a method of manufacturing the sensor 100 in Preferred Embodiment 1. In this case, in the third step in Preferred Embodiment 1, the TMR laminated film 64 and the upper electrode film 65 are patterned such that the plurality of unit elements 10 are formed in regions of the film portion 2, which correspond to the plurality of corner portions. Further, in a step based on the eighth step of Preferred Embodiment 1, portions of the film portion 2 are dry-etched such that the one extending portions 33 along the corresponding side portions in the pairs of extending portions 33 and 34 formed at the plurality of corner portions are connected to the other extending portions 34 of the pairs of extending portions 33 and 34 provided at the corner portions adjacent to the predetermined corner portions.

Preferred Embodiment 5

Figure 21:
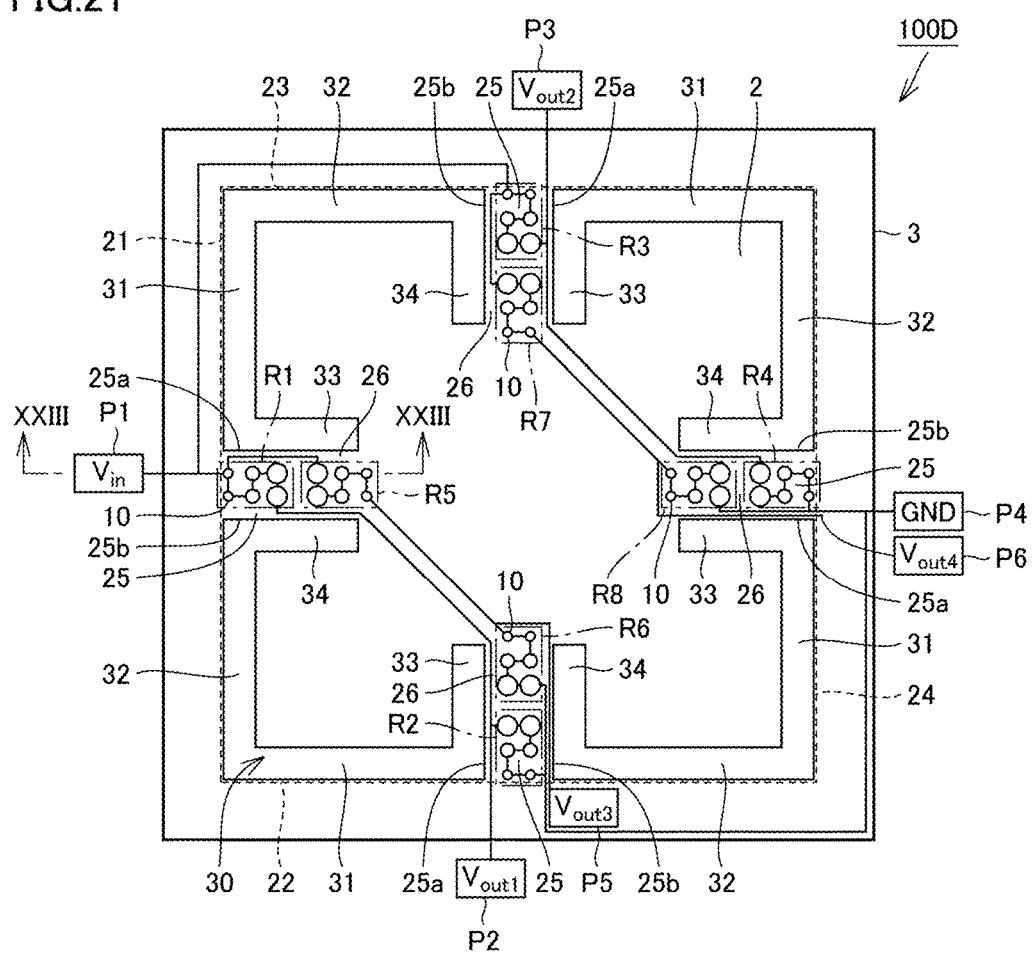
FIG. 21 is a schematic plan view illustrating a sensor according to Preferred Embodiment 5 of the present invention.

FIG. 21 is a schematic plan view illustrating a sensor according to Preferred Embodiment 5 of the present invention. A sensor 100D in Preferred Embodiment 5 will be described with reference to FIG. 21.

As illustrated in FIG. 21, the sensor 100D in Preferred Embodiment 5 is different from the sensor 100A in Preferred Embodiment 2 in that the plurality of magnetoresistive element portions include a plurality of first magnetoresistive element portions R1, R2, R3, and R4 and a plurality of second magnetoresistive element portions R5, R6, R7, and R8. The other configurations thereof are the same or substantially the same.

The first magnetoresistive element portion and the second magnetoresistive element portion are provided in each of the plurality of projecting portions 26. To be specific, the first magnetoresistive element portion R1 and the second magnetoresistive element portion R5 are provided in the projecting portion 26 on the side portion 21 side. The first magnetoresistive element portion R2 and the second magnetoresistive element portion R6 are provided in the projecting portion 26 on the side portion 22 side. The first magnetoresistive element portion R3 and the second magnetoresistive element portion R7 are provided in the projecting portion 26 on the side portion 23 side. The first magnetoresistive element portion R4 and the second magnetoresistive element portion R8 are provided in the projecting portion 26 on the side portion 24 side.

In each of the plurality of projecting portions 26, the first magnetoresistive element portion is provided in a portion of the projecting portion 26, which is located on the outer edge side of the film portion (on the base side of the projecting portion 26). The second magnetoresistive element portion is provided in a portion of the projecting portion 26, which is located on the tip sides of the pair of extending portions 33 and 34 (on the tip side of the projecting portion 26).

Figure 22:
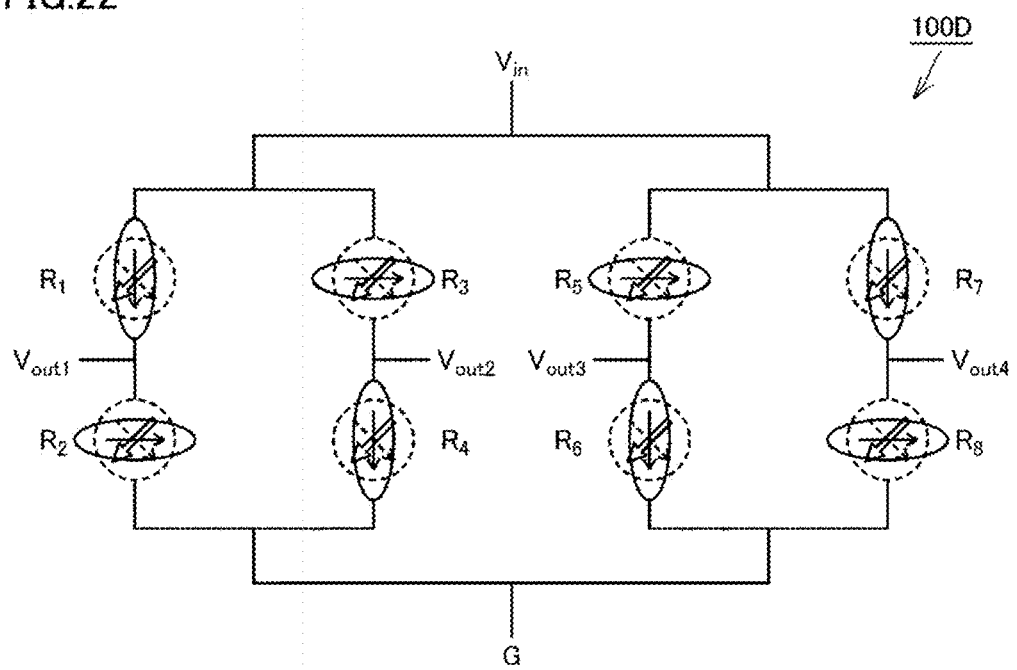
FIG. 22 is a circuit diagram schematically illustrating the sensor in Preferred Embodiment 5 of the present invention.

FIG. 22 is a circuit diagram schematically illustrating the sensor in Preferred Embodiment 5. As illustrated in FIGS. 21 and 22, the plurality of first magnetoresistive element portions R1, R2, R3, and R4 define a first full-bridge circuit, and the plurality of second magnetoresistive element portions R5, R6, R7, and R8 define a second full-bridge circuit. The first bridge circuit and the second full-bridge circuit are connected in parallel with each other. The second bridge circuit has output characteristics opposite in sign to output characteristics of the first bridge circuit.

Figure 23:
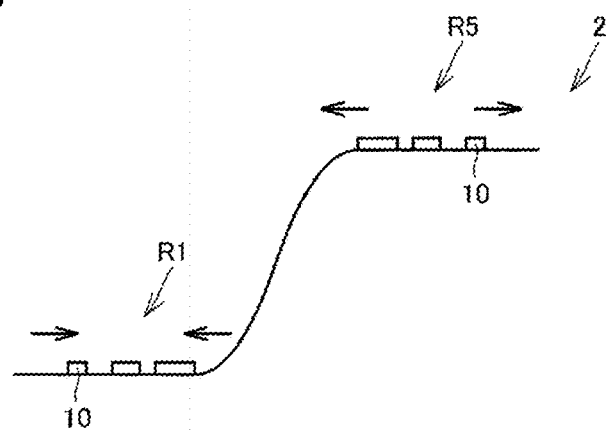
FIG. 23 is a schematic cross-sectional view illustrating a portion of a film portion deformed by external force in the sensor in Preferred Embodiment 5 of the present invention.

FIG. 23 is a schematic cross-sectional view illustrating a portion of the film portion deformed by external force in the sensor in Preferred Embodiment 5. FIG. 23 is a cross-sectional view taken along line XXIII-XXIII illustrated in FIG. 21 and is a cross-sectional view of a portion corresponding to the projecting portion 26. Stress acting on the film portion 2 during the deformation will be described with reference to FIG. 23.

As illustrated in FIG. 23, when pressure is applied to the film portion 2 from the cavity portion 4 side (the back surface side of the film portion 2), compressive stress acts on the base side of the projecting portion 26 where the first magnetoresistive element portion R1 is provided and tensile stress acts on the tip side of the projecting portion 26 where the second magnetoresistive element portion R5 is provided.

In addition, an absolute value of the compressive stress increases from the central portion of the projecting portion 26 toward the base side of the projecting portion 26 in the extending direction of the projecting portion 26. On the other hand, an absolute value of the tensile stress increases from the central portion of the projecting portion 26 toward the tip side of the projecting portion 26.

In order to compensate for an imbalance in output characteristics due to such an imbalance in the absolute values of the stresses, the plurality of unit elements 10 included in the first magnetoresistive element portion R1 and the second magnetoresistive element portion R5 are provided such that the unit elements 10 at positions in the projecting portion 26 where the absolute values of the stresses acting when the film portion 2 is deformed are larger have smaller disk diameters.

To be more specific, in the first magnetoresistive element portion R1, the disk diameters of the unit elements 10 decrease from the central portion of the projecting portion 26 towards the base side of the projecting portion 26. In the second magnetoresistive element portion R5, the disk diameters of the unit elements 10 decrease from the central portion of the projecting portion 26 towards the tip side of the projecting portion 26.

In the first magnetoresistive element portions R2, R3, and R4, the disk diameters of the unit elements 10 decrease from the central portions of the projecting portions 26 towards the base sides of the projecting portions 26 similarly to the first magnetoresistive element portion R1. In addition, also in the second magnetoresistive element portions R6, R7, and R8, the disk diameters of the unit elements 10 decrease from the central portions of the projecting portions 26 toward the tip sides of the projecting portions 26 similarly to the second magnetoresistive element portion R5.

Further, as illustrated in FIG. 17 described above, the absolute values of the compressive stress acting on the base sides of the projecting portions 26 are larger than the absolute values of the tensile stress acting on the tip sides of the projecting portions 26. For this reason, the plurality of unit elements 10 may be provided to compensate for the imbalance in the absolute values of the stresses between the base sides of the projecting portions 26 and the tip sides of the projecting portions 26.

To be specific, the number of unit elements 10 included in the first magnetoresistive element portions R1, R2, R3, and R4 provided on the base sides of the projecting portions 26 may be smaller than the number of unit elements included in the second magnetoresistive elements R5, R6, R7, and R8 provided on the tip sides of the projecting portions 26.

An average size of the plurality of unit elements 10 included in the first magnetoresistive element portions R1, R2, R3, and R4 provided on the base sides of the projecting portions 26 may be smaller than an average size of the plurality of unit elements 10 included in the second magnetoresistive elements R5, R6, R7, and R8 provided on the tip sides of the projecting portions 26.

Although the case where the unit elements 10 have different sizes in each of the first magnetoresistive element portions R1, R2, R3, and R4 and the second magnetoresistive element portions R5, R6, R7, and R8 has been described above as an example, the disk diameters of the plurality of unit elements 10 may all be the same.

Figure 24:
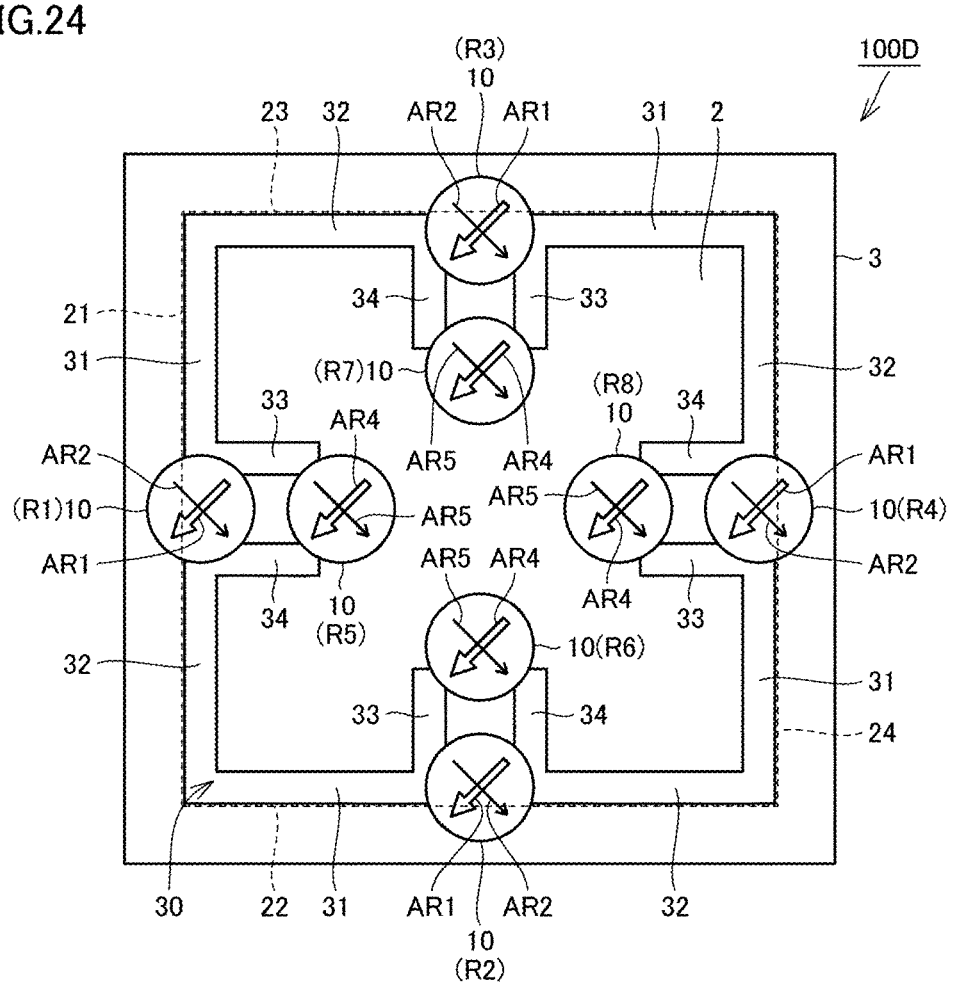
FIG. 24 is a view illustrating directions of bias magnetic fields applied to free layers and magnetization directions of reference layers in the sensor in Preferred Embodiment 5 of the present invention.

FIG. 24 is a view illustrating the magnetization directions of bias magnetic fields in the in-plane direction, which are applied to free layers, and the magnetization directions of reference layers in the sensor in Preferred Embodiment 5. In FIG. 24, the direction of the bias magnetic field in the in-plane direction, which is applied to the free layer, and the magnetization direction of the reference layer in one unit element 10 are illustrated in each of the first magnetoresistive element portions R1, R2, R3, and R4 and the second magnetoresistive element portions R5, R6, R7, and R8 for convenience.

In each of the first magnetoresistive element portions R1, R2, R3, and R4, the directions of the bias magnetic fields in the in-plane direction, which are applied to the free layers of the respective unit elements 10, are the same or substantially the same, and the magnetization directions of the reference layers of the respective unit elements 10 are also the same or substantially the same. In each of the first magnetoresistive element portions R1, R2, R3, and R4, the arrow AR2 indicated by a black line indicates the direction of the bias magnetic field in the in-plane direction, which is applied to the free layer 46, and the outlined arrow AR1 indicates the magnetization direction of the reference layer 44.

In each of the second magnetoresistive element portions R5, R6, R7, and R8, the directions of the bias magnetic fields in the in-plane direction, which are applied to the free layers of the respective unit elements 10, are the same or substantially the same, and the magnetization directions of the reference layers of the respective unit elements 10 are also the same or substantially the same. In each of the second magnetoresistive element portions R5, R6, R7, and R8, an arrow AR5 indicated by a black line indicates the direction of the bias magnetic field in the in-plane direction, which is applied to the free layer 46, and an outlined arrow AR4 indicates the magnetization direction of the reference layer 44.

As illustrated in FIG. 24, in the unit elements 10 included in any of the first magnetoresistive element portions R1, R2, R3, and R4 and the second magnetoresistive element portions R5, R6, R7, and R8, relative angles between the directions of the bias magnetic fields in the in-plane direction, which are applied to the free layers 46, and the magnetization directions of the reference layers 44 are about 90 degrees±5 degrees in a state where no external force is applied to the film portion 2.

To be specific, in the unit elements 10 included in any of the first magnetoresistive element portions R1, R2, R3, and R4 and the second magnetoresistive element portions R5, R6, R7, and R8, the directions of the bias magnetic fields in the in-plane direction, which are applied to the free layers 46, intersect with the direction parallel or substantially parallel to the side portion 21 counterclockwise at about 45 degrees±5 degrees. In the unit elements 10 included in any of the magnetoresistive element portions R1, R2, R3, and R4, the magnetization directions of the reference layers 44 intersect with the side portion 21 clockwise at about 45 degrees±5 degrees.

The bias magnetic fields in the in-plane direction cause the free layers 46 to be magnetized in the directions of the applied bias magnetic fields in the in-plane direction. That is, the relative angles between the directions in which the free layers are magnetized by the bias magnetic fields in the in-plane direction and the magnetization directions of the reference layers 44 are also about 90 degrees±5 degrees in the state where no external stress is applied to the film portion 2.

Figure 25:
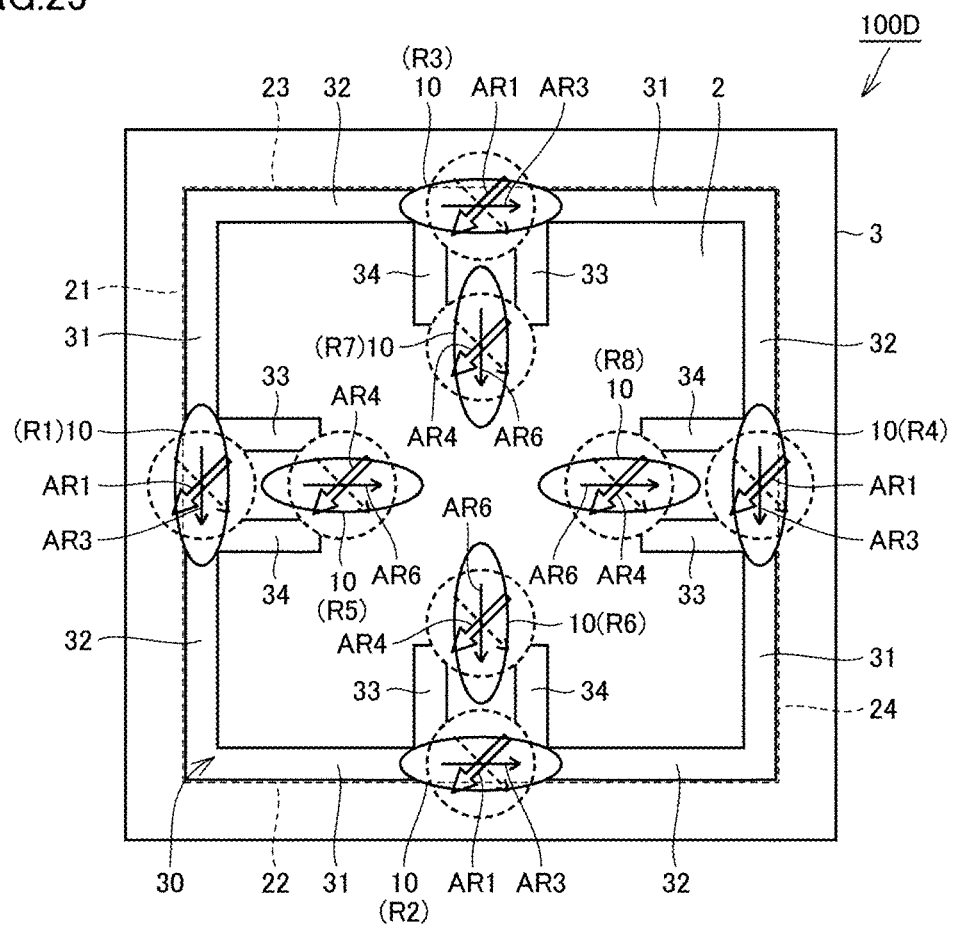
FIG. 25 is a view illustrating directions of stress-induced magnetic anisotropies generated when the film portion is deformed by the external force and the magnetization directions of the reference layers in the sensor in Preferred Embodiment 5 of the present invention.

FIG. 25 is a view illustrating the directions of stress-induced magnetic anisotropies generated when the film portion is deformed by external force and the magnetization directions of the reference layers in the sensor in Preferred Embodiment 5. Also in FIG. 25, in each of the first magnetoresistive element portions R1, R2, R3, and R4 and the second magnetoresistive element portions R5, R6, R7, and R8, the direction of the stress-induced magnetic anisotropy and the magnetization direction of the reference layer in one unit element 10 are illustrated for convenience.

In each of the first magnetoresistive element portions R1, R2, R3, and R4, the arrow AR3 indicated by a black line indicates the direction of the stress-induced magnetic anisotropy, and the outlined arrow AR1 indicates the magnetization direction of the reference layer 44.

In each of the second magnetoresistive element portions R5, R6, R7, and R8, an arrow AR6 indicated by a black line indicates the direction of the stress-induced magnetic anisotropy, and the outlined arrow AR4 indicates the magnetization direction of the reference layer 44.

The direction of the bias magnetic field in the in-plane direction, which is applied to the free layer 46, is indicated by a dashed arrow, and the outer edge of each unit element 10 in a non-deformed state in which the film portion 2 is not deformed is indicated by a dashed circle.

As illustrated in FIG. 25, when the film portion 2 is deformed, the compressive stress and the tensile stress act as described above, such that the stress-induced magnetic anisotropies of the free layers 46 occur. As a result, the magnetization directions of the free layers 46 become the directions of the stress-induced magnetic anisotropies. On the other hand, the directions of the bias magnetic fields in the in-plane direction, which are applied to the free layers 46, and the magnetization directions of the reference layers 44 are not changed.

Regardless of whether the compressive stress or the tensile stress acts, the relative angles between the directions of the stress-induced magnetic anisotropies in the free layers 46 and the directions of the bias magnetic fields in the in-plane direction, which are applied to the free layers 46, are about 45 degrees±5 degrees.

To be specific, in the first magnetoresistive element portions R1 and R4 (on the sides of the side portions 21 and 24), the directions of the stress-induced magnetic anisotropies are parallel or substantially parallel to the side portion 21 and correspond to the direction from one ends 25*a* (see FIG. 21) toward the other ends 25*b* (see FIG. 21) of the connection portions 25 on the base sides of the projecting portions 26 on which the compressive stress acts. On the other hand, the directions of the bias magnetic fields in the in-plane direction, which are applied to the free layers 46, are directions obtained by rotating the directions of the stress-induced magnetic anisotropies counterclockwise by about 45 degrees±5 degrees. That is, the relative angles between the directions of the stress-induced magnetic anisotropies in the free layers 46 and the directions of the bias magnetic fields applied to the free layers 46 are about 45 degrees±5 degrees.

In the first magnetoresistive element portions R2 and R3 (on the sides of the side portions 22 and 23), the directions of the stress-induced magnetic anisotropies are orthogonal or substantially orthogonal to the side portion 21 and correspond to the direction from the side portion 21 toward the side portion 24 on the base sides of the projecting portions 26 on which the compressive stress acts. On the other hand, the directions of the bias magnetic fields in the in-plane direction, which are applied to the free layers 46, are directions rotated clockwise by about 45 degrees±5 degrees with respect to the direction orthogonal or substantially orthogonal to the side portion 21. That is, the relative angles between the directions of the stress-induced magnetic anisotropies in the free layers 46 and the directions of the bias magnetic fields in the in-plane direction, which are applied to the free layers 46, are about 45 degrees±5 degrees.

In the first magnetoresistive element portions R1 and R4 (on the sides of the side portions 21 and 24), the magnetization directions of the reference layers 44 are directions obtained by rotating the directions of the stress-induced magnetic anisotropies clockwise by about 45 degrees±5 degrees. In the first magnetoresistive element portions R2 and R3 (on the sides of the side portions 22 and 23), the magnetization directions of the reference layers 44 are directions obtained by rotating the directions of the stress-induced magnetic anisotropies clockwise by about 135 degrees±5 degrees.

In the second magnetoresistive element portions R5 and R8 (on the sides of the side portions 21 and 24), the directions of the stress-induced magnetic anisotropies are orthogonal or substantially orthogonal to the side portion 21 and correspond to the direction from the side portion 21 toward the side portion 24 on the tip sides of the projecting portions 26 on which the tensile stress acts. On the other hand, the directions of the bias magnetic fields in the in-plane direction, which are applied to the free layers 46, are directions obtained by rotating the directions of the stress-induced magnetic anisotropies clockwise by about 45 degrees±5 degrees. That is, the relative angles between the directions of the stress-induced magnetic anisotropies in the free layers 46 and the directions of the bias magnetic fields in the in-plane direction, which are applied to the free layers 46, are about 45 degrees±5 degrees.

In the second magnetoresistive element portions R6 and R7 (on the sides of the side portions 22 and 23), the directions of the stress-induced magnetic anisotropies are parallel or substantially parallel to the side portion 21 and correspond to the direction from the one end 25*a* toward the other end 25*b* of the connection portion 25 in the side portion 21 on the base sides of the projecting portions 26 on which the compressive stress acts. On the other hand, the directions of the bias magnetic fields in the in-plane direction, which are applied to the free layers 46, are directions obtained by rotating the directions of the stress-induced magnetic anisotropies counterclockwise by about 45 degrees±5 degrees. That is, the relative angles between the directions of the stress-induced magnetic anisotropies in the free layers 46 and the directions of the bias magnetic fields in the in-plane direction, which are applied to the free layers 46, are about 45 degrees±5 degrees.

In the second magnetoresistive element portions R5 and R8 (on the sides of the side portions 21 and 24), the magnetization directions of the reference layers 44 are directions obtained by rotating the directions of the stress-induced magnetic anisotropies clockwise by about 135 degrees±5 degrees. In the second magnetoresistive element portions R6 and R7 (on the sides of the side portions 22 and 23), the magnetization directions of the reference layers 44 are directions obtained by rotating the directions of the stress-induced magnetic anisotropies clockwise by about 45 degrees±5 degrees.

By making the intensities of the bias magnetic fields in the in-plane direction, which are applied to the free layers 46, greater than the intensities of exchange coupling magnetic fields acting between the free layers 46 and the reference layers 44 and making the directions in which the free layers 46 are magnetized by the bias magnetic fields in the in-plane direction, the directions of the stress-induced magnetic anisotropies of the free layers 46, and the magnetization directions of the reference layers have the above-described angular relationship, output characteristics of an odd function are obtained in each of the first bridge circuit and the second bridge circuit as described above.

Even in the case of such a configuration, the sensor 100D in Preferred Embodiment 5 can improve controllability of the bias intensities for sensitivity control and improve resistances to disturbance magnetic fields as in Preferred Embodiment 2.

Further, the first bridge circuit is defined by the first magnetoresistive element portions R1, R2, R3, and R4 on the base sides of the plurality of projecting portions 26 on which the compressive stress acts, the second bridge circuit is defined by the second magnetoresistive element portions R5, R6, R7, and R8 on the tip sides of the plurality of projecting portions 26 on which the tensile stress acts, and the first bridge circuit and the second bridge circuit have output characteristics that are opposite in sign. The sensor 100D in Preferred Embodiment 5 can thus provide double sensitivity. As a result, the signal can be increased and an SNR can be increased.

The sensor 100D in Preferred Embodiment 5 is manufactured in accordance with the non-limiting example of a method of manufacturing the sensor 100 in Preferred Embodiment 1. In this case, in a step based on the third step in Preferred Embodiment 1, the TMR laminated film 64 and the upper electrode film 65 are patterned such that the plurality of unit elements defining the first magnetoresistive element portions are formed on the base sides of the portions of the film portion 2, which become the projecting portions 26, and the plurality of unit elements defining the second magnetoresistive elements are formed on the tip sides of the portions thereof, which become the projecting portions 26. Further, in a step based on the eighth step in Preferred Embodiment 1, portions of the film portion 2 are dry-etched such that the first slit portions 31, the second slit portions 32, and the pairs of extending portions 33 and 34 are formed.

Preferred Embodiment 6

Figure 26:
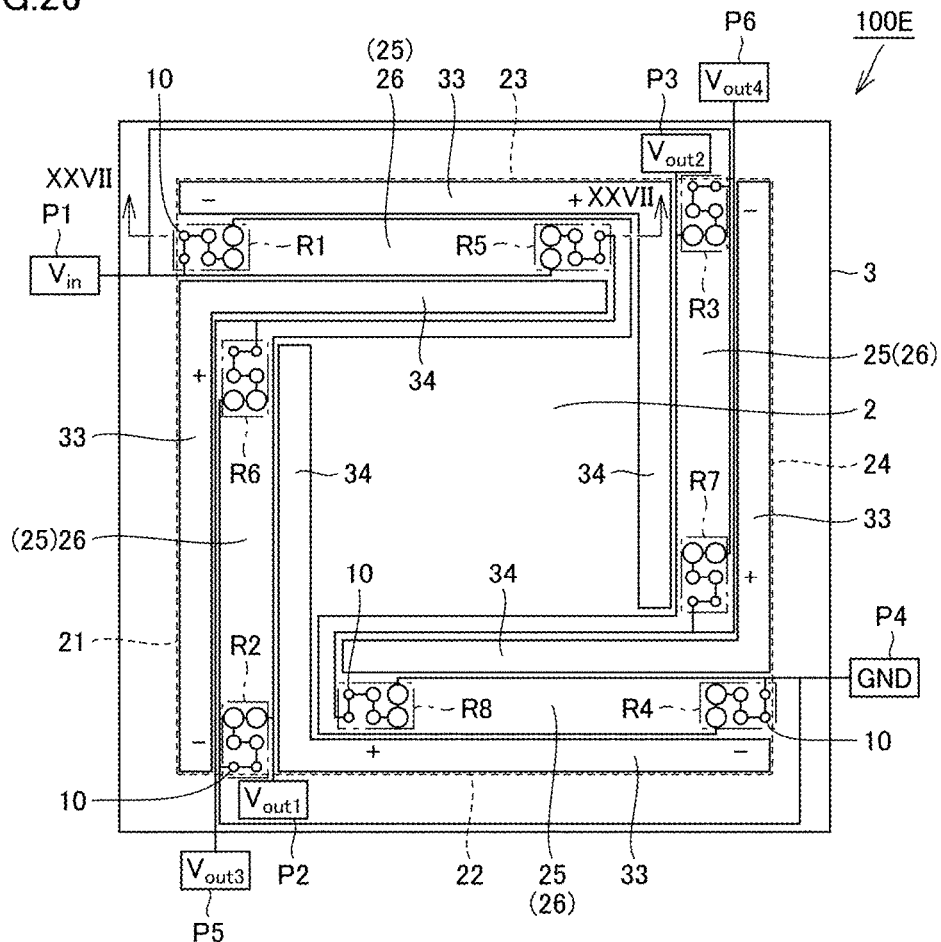
FIG. 26 is a schematic plan view illustrating a sensor according to Preferred Embodiment 6 of the present invention.

FIG. 26 is a schematic plan view illustrating a sensor according to Preferred Embodiment 6 of the present invention. A sensor 100E in Preferred Embodiment 6 will be described with reference to FIG. 26.

As illustrated in FIG. 26, the sensor 100E in Preferred Embodiment 6 is different from the sensor 100C in Preferred Embodiment 4 in that the plurality of magnetoresistive element portions include the plurality of first magnetoresistive element portions R1, R2, R3, and R4 and the plurality of second magnetoresistive element portions R5, R6, R7, and R8. The other configurations thereof are the same or substantially the same.

A first magnetoresistive element portion and a second magnetoresistive element portion are provided in each of the plurality of projecting portions 26. To be specific, the first magnetoresistive element portion R1 and the second magnetoresistive element portion R5 are provided in the projecting portion 26 on the side portion 21 side. The first magnetoresistive element portion R2 and the second magnetoresistive element portion R6 are provided in the projecting portion 26 on the side portion 22 side. The first magnetoresistive element portion R3 and the second magnetoresistive element portion R7 are provided in the projecting portion 26 on the side portion 23 side. The first magnetoresistive element portion R4 and the second magnetoresistive element portion R8 are provided in the projecting portion 26 on the side portion 24 side.

In each of the plurality of projecting portions 26, a first magnetoresistive element portion is provided in a portion of the projecting portion 26, which is located on the outer edge side of the film portion. A second magnetoresistive element portion is provided in a portion of the projecting portion 26, which is located on the tip sides of the pair of extending portions 33 and 34.

The plurality of first magnetoresistive element portions R1, R2, R3, and R4 define a first full-bridge circuit, and the plurality of second magnetoresistive element portions R5, R6, R7, and R8 define a second full-bridge circuit. The first bridge circuit and the second full-bridge circuit are connected in parallel with each other. The second bridge circuit has output characteristics opposite in sign to output characteristics of the first bridge circuit.

Figure 27:
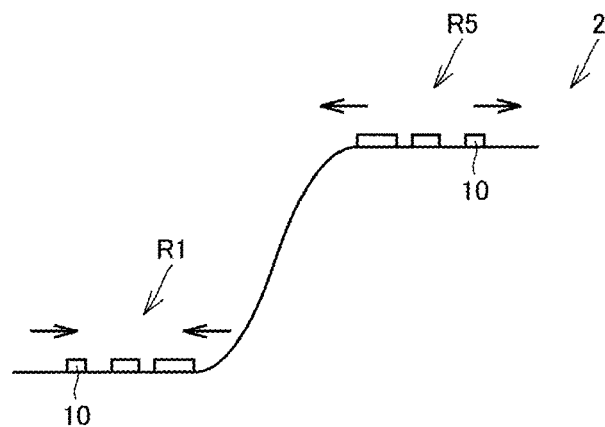
FIG. 27 is a schematic cross-sectional view illustrating a portion of a film portion deformed by external force in the sensor in Preferred Embodiment 6 of the present invention.

FIG. 27 is a schematic cross-sectional view illustrating a portion of the film portion deformed by external force in the sensor in Preferred Embodiment 6. FIG. 27 is a cross-sectional view taken along line XXVII-XXVII illustrated in FIG. 26 and is a cross-sectional view of a portion corresponding to the projecting portion 26. Stress acting on the film portion 2 during the deformation will be described with reference to FIG. 23.

As illustrated in FIG. 27, when pressure is applied to the film portion 2 from the cavity portion 4 side (the back surface side of the film portion 2), compressive stress acts on the base side of the projecting portion 26 where the first magnetoresistive element portion R1 is provided and tensile stress acts on the tip side of the projecting portion 26 where the second magnetoresistive element portion R5 is provided.

In addition, an absolute value of the compressive stress increases from the central portion of the projecting portion 26 toward the base side of the projecting portion 26 in the extending direction of the projecting portion 26. On the other hand, an absolute value of the tensile stress increases from the central portion of the projecting portion 26 toward the tip side of the projecting portion 26.

The plurality of unit elements 10 included in the first magnetoresistive element portion R1 and the second magnetoresistive element portion R5 are provided such that the unit elements 10 at positions in the projecting portion 26 where the absolute values of the stresses acting thereon when the film portion 2 is deformed are larger have smaller disk diameters.

To be more specific, in the first magnetoresistive element portion R1, the disk diameters of the unit elements 10 decrease from the central portion of the projecting portion 26 toward the base side of the projecting portion 26. In the second magnetoresistive element portion R5, the disk diameters of the unit elements 10 decrease from the central portion of the projecting portion 26 toward the tip side of the projecting portion 26.

In the first magnetoresistive element portions R2, R3, and R4 as well, the disk diameters of the unit elements 10 decrease from the central portions of the projecting portions 26 toward the base sides of the projecting portions 26 similarly to the first magnetoresistive element portion R1. In addition, also in the second magnetoresistive element portions R6, R7, and R8, the disk diameters of the unit elements 10 decrease from the central portions of the projecting portions 26 toward the tip sides of the projecting portions 26 similarly to the second magnetoresistive element portion R5.

Further, as illustrated in FIG. 20 described above, the absolute values of the compressive stress acting on the base sides of the projecting portions 26 are larger than the absolute values of the tensile stress acting on the tip sides of the projecting portions 26. For this reason, also in Preferred Embodiment 6, the plurality of unit elements 10 may compensate for an imbalance in output characteristics due to such an imbalance in the absolute values of the stresses between the base sides of the projecting portions 26 and the tip sides of the projecting portions 26, similarly to Preferred Embodiment 5.

Although the case where the unit elements 10 have different sizes in each of the first magnetoresistive element portions R1, R2, R3, and R4 and the second magnetoresistive element portions R5, R6, R7, and R8 has been described above as an example, the disk diameters of the plurality of unit elements 10 may all be the same.

Figure 28:
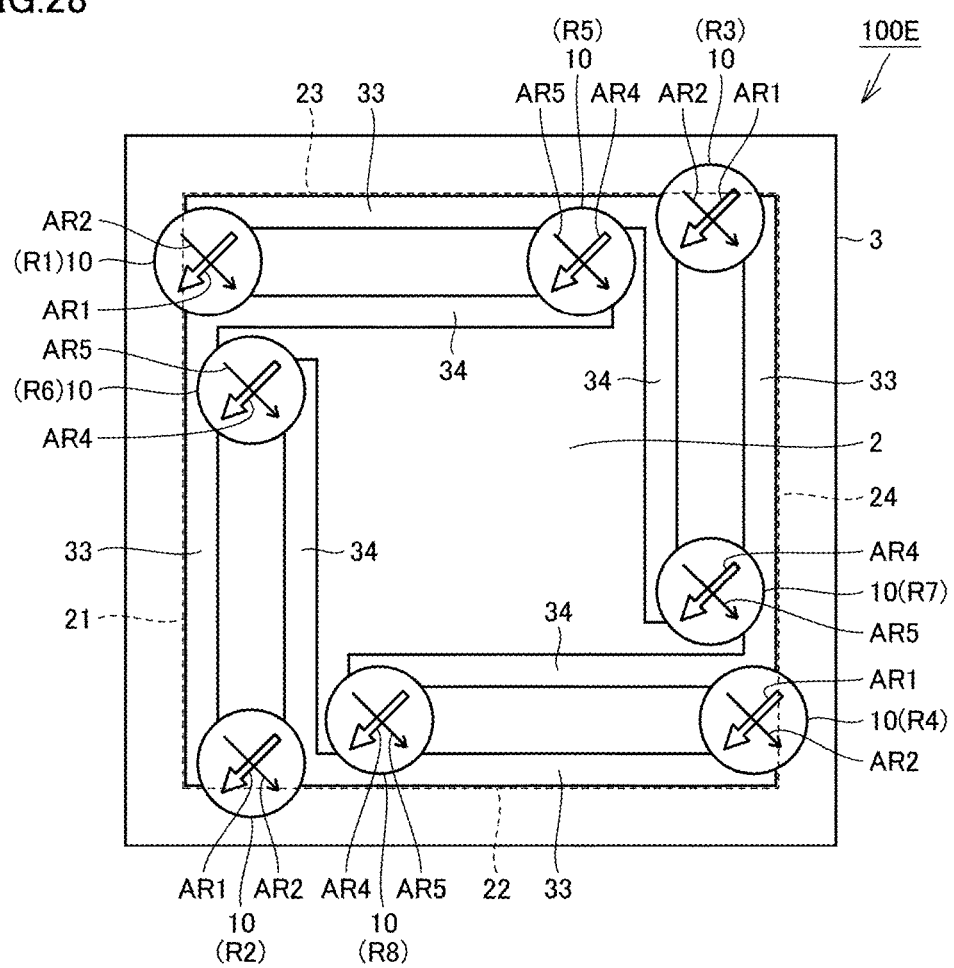
FIG. 28 is a view illustrating directions of bias magnetic fields applied to free layers and magnetization directions of reference layers in the sensor in Preferred Embodiment 6 of the present invention.
Figure 29:
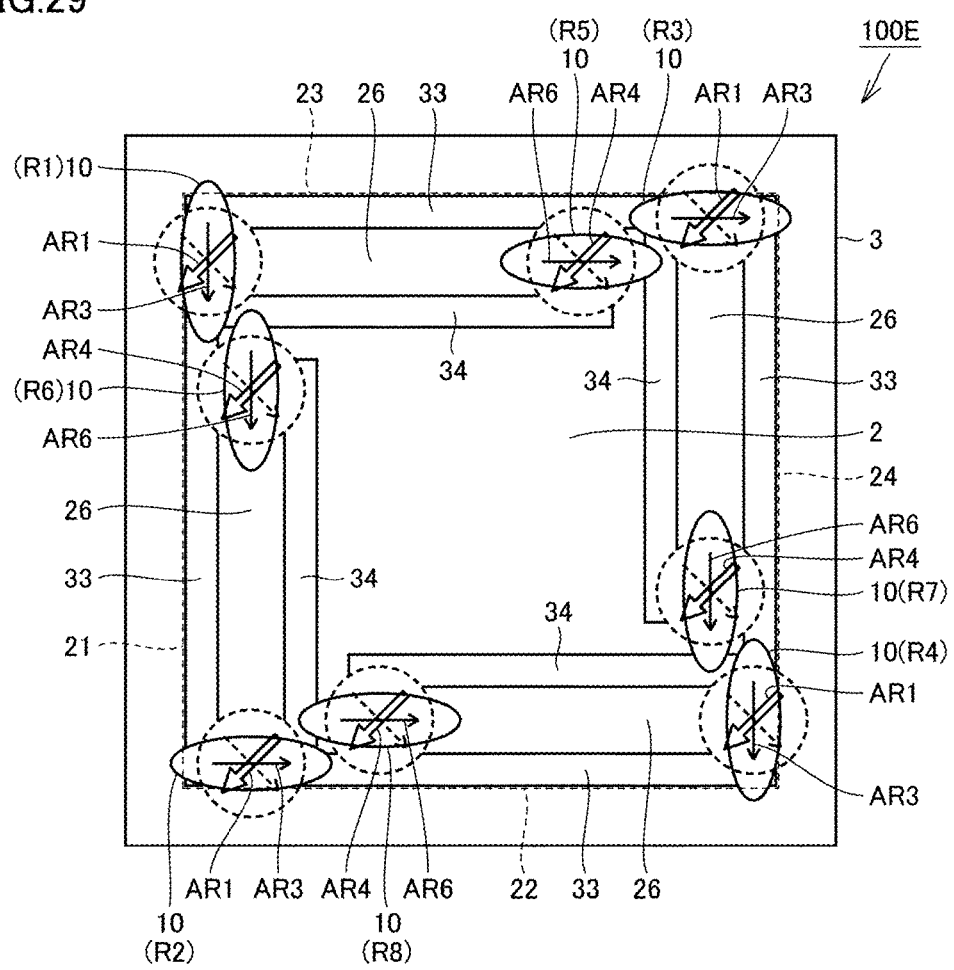
FIG. 29 is a view illustrating directions of stress-induced magnetic anisotropies generated when the film portion is deformed by the external force and the magnetization directions of the reference layers in the sensor in Preferred Embodiment 6 of the present invention.

FIG. 28 is a view illustrating the magnetization directions of bias magnetic fields in the in-plane direction, which are applied to free layers, and the magnetization directions of reference layers in the sensor in Preferred Embodiment 6. FIG. 29 is a view illustrating the directions of stress-induced magnetic anisotropies generated when the film portion is deformed by external force and the magnetization directions of the reference layers in the sensor in Preferred Embodiment 6.

In FIGS. 28 and 29, for the same or substantially the same reason as described above, the magnetization direction of the reference layer and the direction of the bias magnetic field in the in-plane direction, which is applied to the free layer 46, or the direction of the stress-induced magnetic anisotropy in one unit element 10 are illustrated in each of the first magnetoresistive element portions R1, R2, R3, and R4 and the second magnetoresistive element portions R5, R6, R7, and R8.

In FIG. 28, in each of the first magnetoresistive element portions R1, R2, R3, and R4, the arrow AR2 indicated by a black line indicates the direction in which the free layer 46 is magnetized by the bias magnetic field in the in-plane direction, and the outlined arrow AR1 indicates the magnetization direction of the reference layer 44.

In each of the second magnetoresistive element portions R5, R6, R7, and R8, the arrow AR5 indicated by a black line indicates the direction in which the free layer 46 is magnetized by the bias magnetic field in the in-plane direction, and the outlined arrow AR4 indicates the magnetization direction of the reference layer 44.

In FIG. 29, in each of the first magnetoresistive element portions R1, R2, R3, and R4, the arrow AR3 indicated by a black line indicates the direction of the stress-induced magnetic anisotropy, and the outlined arrow AR1 indicates the magnetization direction of the reference layer 44. The magnetization direction of the free layer of each unit element 10 in a non-deformed state in which the film portion 2 is not deformed and the outer edge of the unit element 10 in the non-deformed state are indicated by broken lines.

In each of the second magnetoresistive element portions R5, R6, R7, and R8, the arrow AR6 indicated by a black line indicates the direction of the stress-induced magnetic anisotropy, and the outlined arrow AR4 indicates the magnetization direction of the reference layer 44. The magnetization direction of the free layer of each unit element 10 in the non-deformed state in which the film portion 2 is not deformed and the outer edge of the unit element 10 in the non-deformed state are indicated by broken lines.

In FIGS. 30 to 35, the magnetization direction of the reference layer and the direction of the bias magnetic field in the in-plane direction, which is applied to the free layer 46, or the direction of the stress-induced magnetic anisotropy in one unit element 10 are illustrated as in the above description, and thus description thereof is omitted.

As illustrated in FIGS. 28 and 29, also in Preferred Embodiment 6, in the first magnetoresistive element portions R1, R2, R3, and R4 and the second magnetoresistive element portions R5, R6, R7, and R8, the directions of the bias magnetic fields in the in-plane direction, which are applied to the free layers 46, the magnetization directions of the reference layers 44, and the directions of the stress-induced magnetic anisotropies are the same or substantially the same as those described in Preferred Embodiment 5. The intensities of the bias magnetic fields in the in-plane direction, which are applied to the free layers 46, are greater than the intensities of exchange coupling magnetic fields acting between the free layers 46 and the reference layers 44. Thus, also in Preferred Embodiment 6, the output characteristics of an odd function are obtained in each of the first bridge circuit and the second bridge circuit as described above.

Even with such a configuration, the sensor 100E in Preferred Embodiment 6 can improve controllability of the bias intensities for sensitivity control and improve resistances to disturbance magnetic fields as in Preferred Embodiment 4.

Further, the first bridge circuit is defined by the first magnetoresistive element portions R1, R2, R3, and R4 on the base sides of the plurality of projecting portions 26 on which the compressive stress acts, the second bridge circuit is defined by the second magnetoresistive element portions R5, R6, R7, and R8 on the tip sides of the plurality of projecting portions 26 on which the tensile stress acts, such that double sensitivity is obtained. Therefore, the signal can be increased and an SNR can be increased.

The slit portion 30 in Preferred Embodiment 6 has a shape the same as or similar to that of the slit portion in Preferred Embodiment 4. In this case, the compressive stress acting on the base portions of connection portions 25 can be effectively increased as compared with Preferred Embodiment 1.

Further, the tensile stress can act, to a considerable extent, also on the tip sides of the connection portions 25 (the tip sides of the projecting portions 26). As a result, in the sensor 100E in Preferred Embodiment 6, detection accuracy can be further increased.

The sensor 100D in Preferred Embodiment 6 is manufactured in accordance with the non-limiting example of a method of manufacturing the sensor 100 in Preferred Embodiment 1. In this case, in a step based on the third step in Preferred Embodiment 1, the TMR laminated film 64 and the upper electrode film 65 are patterned such that the plurality of unit elements defining the first magnetoresistive element portions are formed on the base sides of the portions of the film portion 2, which become the projecting portions 26, and the plurality of unit elements defining the second magnetoresistive elements are formed on the tip sides of the portions thereof, which become the projecting portions 26. Further, in a step based on the eighth step of Preferred Embodiment 1, a portion of the film portion 2 is dry-etched such that the one extending portions 33 along the corresponding side portions in the pairs of extending portions 33 and 34 formed at the plurality of corner portions are connected to the other extending portions 34 of the pairs of extending portions 33 and 34 provided at the corner portions adjacent to the predetermined corner portions.

Preferred Embodiment 7

Figure 30:
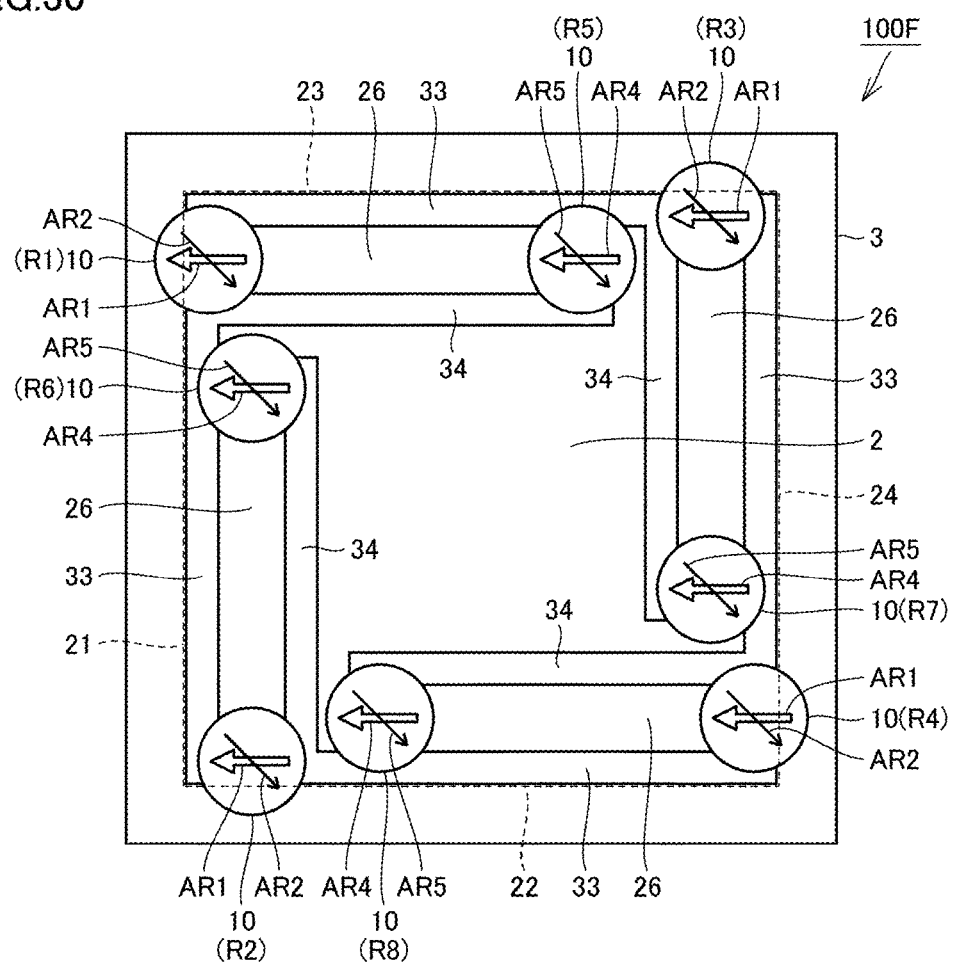
FIG. 30 is a view illustrating directions of bias magnetic fields applied to free layers and magnetization directions of reference layers in a sensor according to Preferred Embodiment 7 of the present invention.
Figure 31:
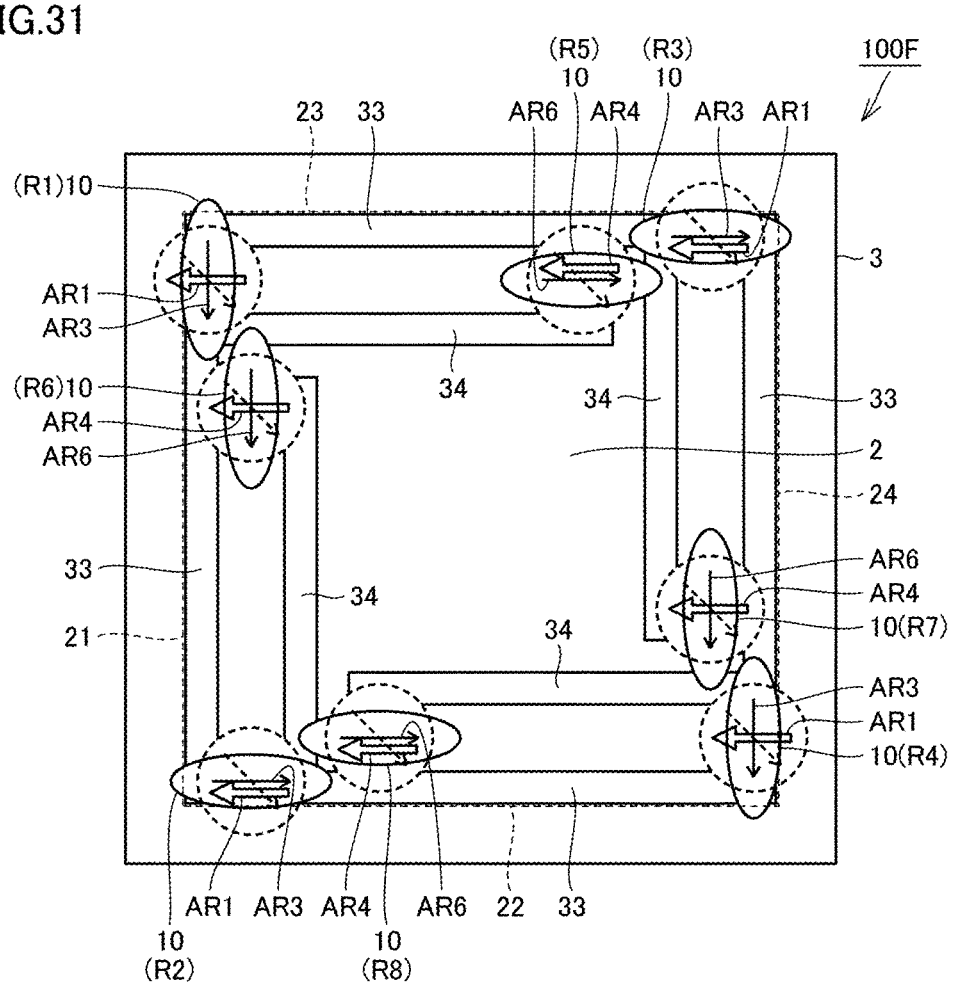
FIG. 31 is a view illustrating directions of stress-induced magnetic anisotropies generated when a film portion is deformed by external force and the magnetization directions of the reference layers in the sensor in Preferred Embodiment 7 of the present invention.

FIG. 30 is a view illustrating the directions of bias magnetic fields applied to free layers and the magnetization directions of reference layers in a sensor according to Preferred Embodiment 7 of the present invention. FIG. 31 is a view illustrating the directions of stress-induced magnetic anisotropies generated when a film portion is deformed by external force and the magnetization directions of the reference layers in the sensor in Preferred Embodiment 7. A sensor 100F in Preferred Embodiment 7 will be described with reference to FIGS. 30 and 31.

As illustrated in FIGS. 30 and 31, the sensor 100F in Preferred Embodiment 7 is different from the sensor 100E in Preferred Embodiment 6 in the magnetization directions of the reference layers 44. The other configurations thereof are the same or substantially the same.

As illustrated in FIG. 30, in the unit elements 10 included in any of the first magnetoresistive element portions R1, R2, R3, and R4 and the second magnetoresistive element portions R5, R6, R7, and R8, relative angles between the directions of the bias magnetic fields in the in-plane direction, which are applied to the free layers 46, and the magnetization directions of the reference layers 44 are about 135 degrees±5 degrees in a state where no external force is applied to the film portion 2.

To be specific, in the unit elements 10 included in any of the first magnetoresistive element portions R1, R2, R3, and R4 and the second magnetoresistive element portions R5, R6, R7, and R8, the directions of the bias magnetic fields in the in-plane direction, which are applied to the free layers 46, intersect with the direction parallel or substantially parallel to the side portion 21 counterclockwise at about 45 degrees±5 degrees. In the unit elements 10 included in any of the magnetoresistive element portions R1, R2, R3, and R4, the magnetization directions of the reference layers 44 are orthogonal or substantially orthogonal to the side portion 21 and correspond to the direction from the center portion of the film portion 2 toward the side portion 21.

The bias magnetic fields in the in-plane direction cause the free layers 46 to be magnetized in the directions of the applied bias magnetic fields in the in-plane direction. That is, the relative angles between the directions in which the free layers are magnetized by the bias magnetic fields in the in-plane direction and the magnetization directions of the reference layers 44 are also about 135 degrees±5 degrees in the state where no external stress is applied to the film portion 2.

As illustrated in FIG. 31, when the film portion 2 is deformed, compressive stress and tensile stress act as described above, such that the stress-induced magnetic anisotropies of the free layers 46 occur. As a result, the magnetization directions of the free layers 46 become the directions of the stress-induced magnetic anisotropies. On the other hand, the directions of the bias magnetic fields in the in-plane direction, which are applied to the free layers 46, and the magnetization directions of the reference layers 44 are not changed.

Regardless of whether the compressive stress or the tensile stress acts, the relative angles between the directions of the stress-induced magnetic anisotropies in the free layers 46 and the directions of the bias magnetic fields in the in-plane direction, which are applied to the free layers 46, are about 45 degrees±5 degrees.

To be specific, in the first magnetoresistive element portions R1 and R4 (on the sides of the side portions 21 and 24), the directions of the stress-induced magnetic anisotropies are parallel or substantially parallel to the side portion 21 and correspond to the direction from the side portion 23 toward the side portion 22 on the base sides of the projecting portions 26 on which the compressive stress acts. On the other hand, the directions of the bias magnetic fields applied to the free layers are directions obtained by rotating the directions of the stress-induced magnetic anisotropies counterclockwise by about 45 degrees±5 degrees. That is, the relative angles between the directions of the stress-induced magnetic anisotropies in the free layers 46 and the directions of the bias magnetic fields in the in-plane direction, which are applied to the free layers 46, are about 45 degrees±5 degrees.

In the first magnetoresistive element portions R2 and R3 (on the sides of the side portions 22 and 23), the directions of the stress-induced magnetic anisotropies are orthogonal or substantially orthogonal to the side portion 21 and correspond to the direction from the side portion 21 toward the side portion 24 on the base sides of the projecting portions 26 on which the compressive stress acts. On the other hand, the directions of the bias magnetic fields in the in-plane direction, which are applied to the free layers 46, are directions obtained by rotating the directions of the stress-induced magnetic anisotropies clockwise by about 45 degrees±5 degrees. That is, the relative angles between the directions of the stress-induced magnetic anisotropies in the free layers 46 and the directions of the bias magnetic fields in the in-plane direction, which are applied to the free layers 46, are about 45 degrees±5 degrees.

In the first magnetoresistive element portions R1 and R4 (on the sides of the side portions 21 and 24), the magnetization directions of the reference layers 44 are directions obtained by rotating the directions of the stress-induced magnetic anisotropies clockwise by about 90 degrees±5 degrees. In the first magnetoresistive element portions R2 and R3 (on the sides of the side portions 22 and 23), the magnetization directions of the reference layers 44 are directions obtained by rotating the directions of the stress-induced magnetic anisotropies clockwise by about 180 degrees.

In the second magnetoresistive element portions R5 and R8 (on the sides of the side portions 21 and 24), the directions of the stress-induced magnetic anisotropies are orthogonal or substantially orthogonal to the side portion 21 and correspond to the direction from the side portion 21 toward the side portion 24 on the tip sides of the projecting portions 26 on which the tensile stress acts. On the other hand, the directions of the bias magnetic fields in the in-plane direction, which are applied to the free layers 46, are directions obtained by rotating the directions of the stress-induced magnetic anisotropies clockwise by about 45 degrees±5 degrees. That is, the relative angles between the directions of the stress-induced magnetic anisotropies in the free layers 46 and the directions of the bias magnetic fields in the in-plane direction, which are applied to the free layers 46, are about 45 degrees±5 degrees.

In the second magnetoresistive element portions R6 and R7 (on the sides of the side portions 22 and 23), the directions of the stress-induced magnetic anisotropies are parallel or substantially parallel to the side portion 21 and correspond to the direction from the one end 25a toward the other end 25b of the connection portion 25 in the side portion 21 on the base sides of the projecting portions 26 on which the compressive stress acts. On the other hand, the directions of the bias magnetic fields in the in-plane direction, which are applied to the free layers 46, are directions obtained by rotating the directions of the stress-induced magnetic anisotropies counterclockwise by about 45 degrees±5 degrees. That is, the relative angles between the directions of the stress-induced magnetic anisotropies in the free layers 46 and the directions of the bias magnetic fields in the in-plane direction, which are applied to the free layers 46, are about 45 degrees±5 degrees.

In the second magnetoresistive element portions R5 and R8 (on the sides of the side portions 21 and 24), the magnetization directions of the reference layers 44 are directions obtained by rotating the directions of the stress-induced magnetic anisotropies clockwise by about 180 degrees. In the second magnetoresistive element portions R6 and R7 (on the sides of the side portions 22 and 23), the magnetization directions of the reference layers 44 are directions obtained by rotating the directions of the stress-induced magnetic anisotropies clockwise by about 90 degrees±5 degrees.

By making the intensities of the bias magnetic fields applied to the free layers 46 greater than the intensities of exchange coupling magnetic fields acting between the free layers 46 and the reference layers 44 and making the directions in which the free layers 46 are magnetized by the bias magnetic fields in the in-plane direction, the directions of the stress-induced magnetic anisotropies of the free layers 46, and the magnetization directions of the reference layers 44 have the above-described angular relationship, output characteristics of an odd function are obtained in each of the first bridge circuit and the second bridge circuit.

The case where the relative angles between the directions of the bias magnetic fields applied to the free layers 46 and the magnetization directions of the reference layers 44 and the relative angles between the directions of the stress-induced magnetic anisotropies of the free layers 46 and the directions of the bias magnetic fields have the ranges of about ±5 degrees have been described as an example. However, more favorable output characteristics can be obtained by setting the relative angles between the directions of the bias magnetic fields applied to the free layers 46 and the magnetization directions of the reference layers 44 to 135 degrees and setting the relative angles between the directions of the stress-induced magnetic anisotropies of the free layers 46 and the directions of the bias magnetic fields to about 45 degrees.

Even with such a configuration, the sensor 100F in Preferred Embodiment 7 provides the same substantially the same advantageous effects as those of Preferred Embodiment 6.

Preferred Embodiment 8

Figure 32:
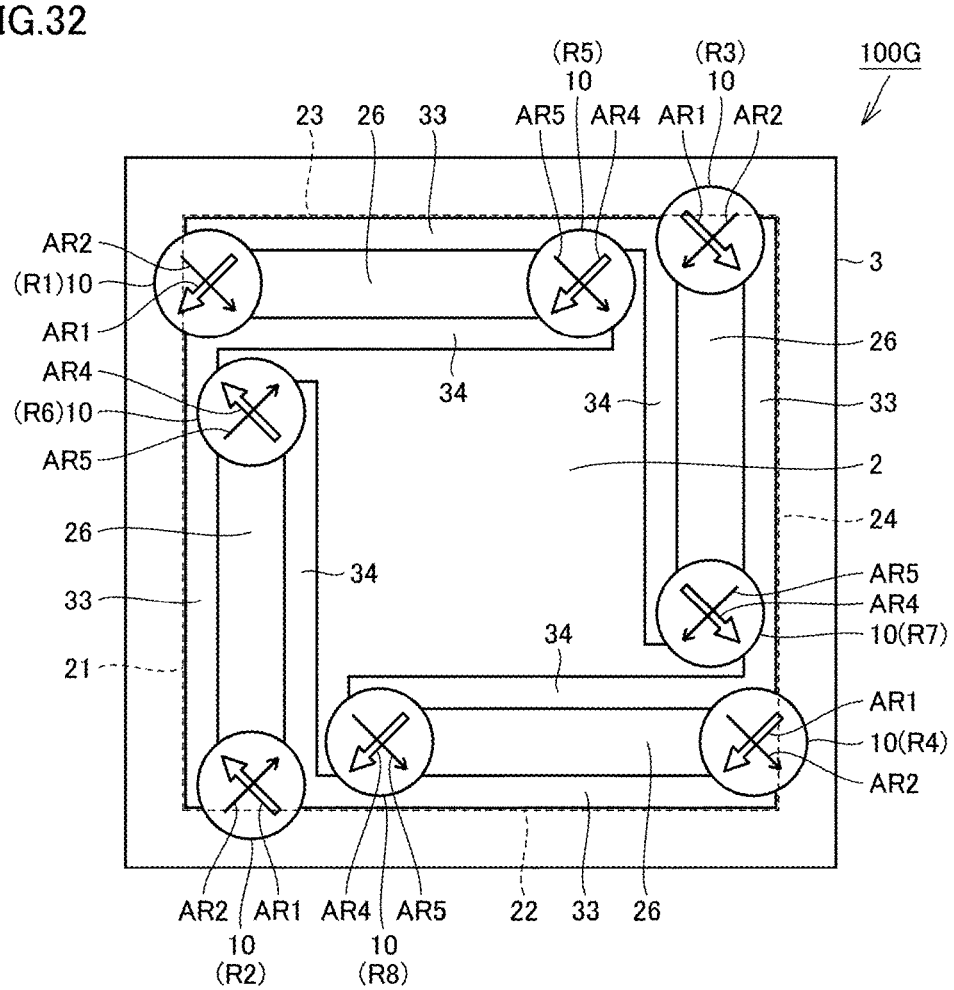
FIG. 32 is a view illustrating directions of bias magnetic fields applied to free layers and magnetization directions of reference layers in a sensor according to Preferred Embodiment 8 of the present invention.
Figure 33:
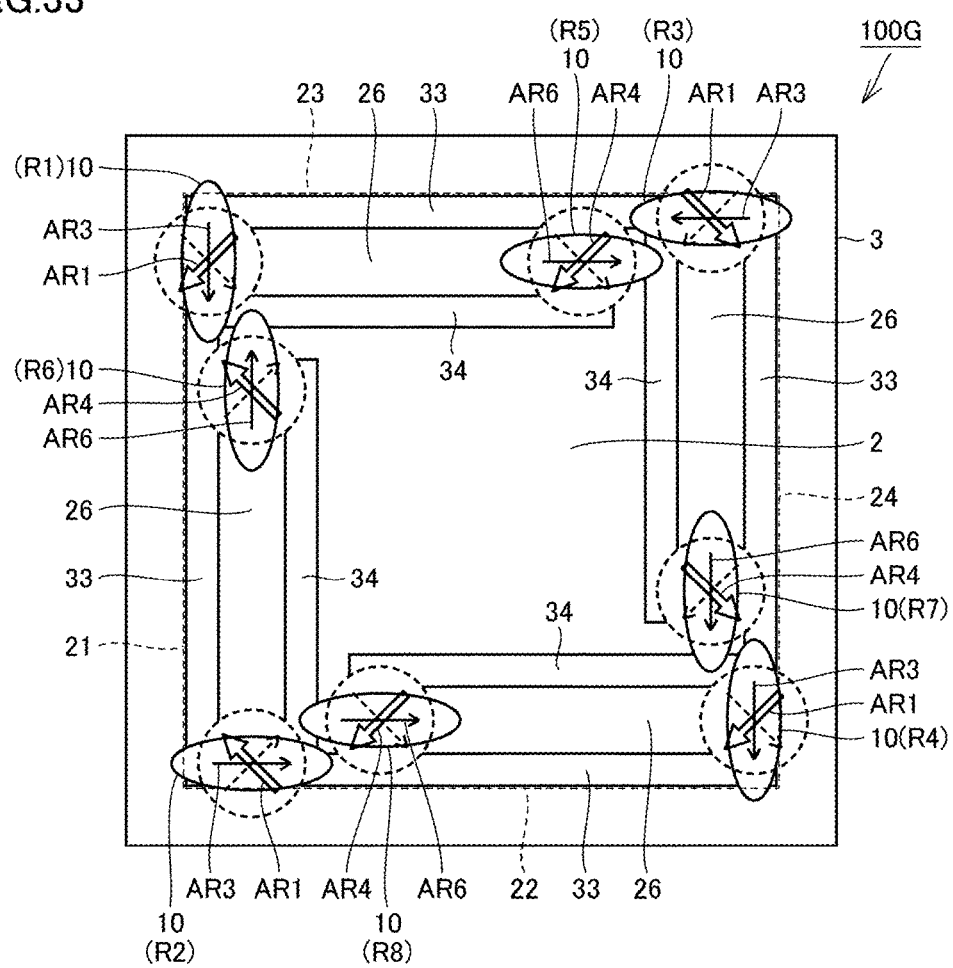
FIG. 33 is a view illustrating directions of stress-induced magnetic anisotropies generated when a film portion is deformed by external force and the magnetization directions of the reference layers in the sensor in Preferred Embodiment 8 of the present invention.

FIG. 32 is a view illustrating the directions of bias magnetic fields in the in-plane direction, which are applied to free layers, and the magnetization directions of reference layers in a sensor according to Preferred Embodiment 8 of the present invention. FIG. 33 is a view illustrating the directions of stress-induced magnetic anisotropies generated when a film portion is deformed by external force and the magnetization directions of the reference layers in the sensor in Preferred Embodiment 8. A sensor 100G in Preferred Embodiment 8 will be described with reference to FIGS. 32 and 33.

As illustrated in FIGS. 32 and 33, the sensor 100G in Preferred Embodiment 8 is different from the sensor 100E in Preferred Embodiment 6 in the magnetization directions of the reference layers 44. The other configurations thereof are the same or substantially the same.

As illustrated in FIG. 32, in the unit elements 10 included in any of the first magnetoresistive element portions R1, R2, R3, and R4 and the second magnetoresistive element portions R5, R6, R7, and R8, relative angles between the directions of the bias magnetic fields in the in-plane direction, which are applied to the free layers 46, and the magnetization directions of the reference layers 44 are about 90 degrees±5 degrees in a state where no external force is applied to the film portion 2.

To be specific, in the unit elements 10 included in the first magnetoresistive element portions R1 and R4 and the second magnetoresistive element portions R5 and R8, the directions of the bias magnetic fields in the in-plane direction, which are applied to the free layers 46, are directions rotated counterclockwise by about 45 degrees±5 degrees with respect to the direction parallel or substantially parallel to the side portion 21 (more specifically, the direction from the side portion 23 toward the side portion 22). On the other hand, the magnetization directions of the reference layers 44 are directions rotated clockwise by about 45 degrees±5 degrees with respect to the direction parallel or substantially parallel to the side portion 21 (more specifically, the direction from the side portion 23 toward the side portion 22).

In the first magnetoresistive element portion R2 and the second magnetoresistive element portion R6, the directions of the bias magnetic fields in the in-plane direction, which are applied to the free layers 46, are directions rotated counterclockwise by about 135 degrees±5 degrees with respect to the direction parallel or substantially parallel to the side portion 21 (more specifically, the direction from the side portion 23 toward the side portion 22). On the other hand, the magnetization directions of the reference layers 44 are directions rotated clockwise by about 135 degrees±5 degrees with respect to the direction parallel or substantially parallel to the side portion 21 (more specifically, the direction from the side portion 23 toward the side portion 22).

In the unit elements 10 included in the first magnetoresistive element portion R3 and the second magnetoresistive element portion R7, the directions of the bias magnetic fields in the in-plane direction, which are applied to the free layers 46, are directions rotated clockwise by about 45 degrees±5 degrees with respect to the direction parallel or substantially parallel to the side portion 21 (more specifically, the direction from the side portion 23 toward the side portion 22). On the other hand, the magnetization directions of the reference layers 44 are directions rotated counterclockwise by about 45 degrees±5 degrees with respect to the direction parallel or substantially parallel to the side portion 21 (more specifically, the direction from the side portion 23 toward the side portion 22).

The bias magnetic fields in the in-plane direction cause the free layers 46 to be magnetized in the directions of the applied bias magnetic fields in the in-plane direction. That is, the relative angles between the directions in which the free layers are magnetized by the bias magnetic fields in the in-plane direction and the magnetization directions of the reference layers 44 are also about 90 degrees±5 degrees in the state where no external stress is applied to the film portion 2.

As illustrated in FIG. 33, when the film portion 2 is deformed, compressive stress and tensile stress act as described above, such that the stress-induced magnetic anisotropies of the free layers 46 occur. As a result, the magnetization directions of the free layers 46 become the directions of the stress-induced magnetic anisotropies. On the other hand, the directions of the bias magnetic fields in the in-plane direction, which are applied to the free layers 46, and the magnetization directions of the reference layers 44 are not changed.

Regardless of whether the compressive stress or the tensile stress acts, the relative angles between the directions of the stress-induced magnetic anisotropies in the free layers 46 and the directions of the bias magnetic fields in the in-plane direction, which are applied to the free layers 46, are about 45 degrees±5 degrees.

To be specific, in the first magnetoresistive element portions R1 and R4, the directions of the stress-induced magnetic anisotropies are parallel or substantially parallel to the side portion 21 and correspond to the direction from the side portion 23 toward the side portion 22 on the base sides of the projecting portions 26 on which the compressive stress acts. On the other hand, the directions of the bias magnetic fields in the in-plane direction, which are applied to the free layers 46, are directions obtained by rotating the directions of the stress-induced magnetic anisotropies counterclockwise by about 45 degrees±5 degrees.

In the first magnetoresistive element portion R2, the directions of the stress-induced magnetic anisotropies are orthogonal or substantially orthogonal to the side portion 21 and correspond to the direction from the side portion 21 toward the side portion 24 on the base sides of the projecting portions 26 on which the compressive stress acts. On the other hand, the directions of the bias magnetic fields in the in-plane direction, which are applied to the free layers 46, are directions obtained by rotating the directions of the stress-induced magnetic anisotropies counterclockwise by about 45 degrees±5 degrees.

In the first magnetoresistive element portion R3, the directions of the stress-induced magnetic anisotropies are orthogonal or substantially orthogonal to the side portion 21 and correspond to the direction from the central portion of the film portion 2 toward the side portion 21 on the base sides of the projecting portions 26 on which the compressive stress acts. On the other hand, the directions of the bias magnetic fields in the in-plane direction, which are applied to the free layers 46, are directions obtained by rotating the directions of the stress-induced magnetic anisotropies counterclockwise by about 45 degrees±5 degrees.

In the second magnetoresistive element portions R5 and R8, the directions of the stress-induced magnetic anisotropies are orthogonal or substantially orthogonal to the side portion 21 and correspond to the direction from the side portion 21 toward the side portion 24 on the tip sides of the projecting portions 26 on which the tensile stress acts. On the other hand, the directions of the bias magnetic fields in the in-plane direction, which are applied to the free layers 46, are directions obtained by rotating the directions of the stress-induced magnetic anisotropies clockwise by about 45 degrees±5 degrees.

In the second magnetoresistive element portion R6, the directions of the stress-induced magnetic anisotropies are parallel or substantially parallel to the side portion 21 and correspond to the direction from the side portion 22 toward the side portion 23 on the tip sides of the projecting portions 26 on which the tensile stress acts. On the other hand, the directions of the bias magnetic fields in the in-plane direction, which are applied to the free layers 46, are directions obtained by rotating the directions of the stress-induced magnetic anisotropies clockwise by about ±5 degrees.

In the second magnetoresistive element portion R7, the directions of the stress-induced magnetic anisotropies are parallel or substantially parallel to the side portion 21 and correspond to the direction from the side portion 23 toward the side portion 22 on the tip sides of the projecting portions 26 on which the tensile stress acts. On the other hand, the directions of the bias magnetic fields in the in-plane direction, which are applied to the free layers 46, are directions obtained by rotating the directions of the stress-induced magnetic anisotropies counterclockwise by about 45 degrees±5 degrees.

Also in this case, by making the intensities of the bias magnetic fields in the in-plane direction, which are applied to the free layers 46, greater than the intensities of exchange coupling magnetic fields acting between the free layers 46 and the reference layers 44 and making the directions in which the free layers 46 are magnetized by the bias magnetic fields in the in-plane direction, the directions of the stress-induced magnetic anisotropies of the free layers 46, and the magnetization directions of the reference layers 44 have the above-described angular relationship, output characteristics of an odd function are obtained in each of the first bridge circuit and the second bridge circuit.

Even with such a configuration, the sensor 100G in Preferred Embodiment 8 provides the same or substantially the same advantageous effects as those of Preferred Embodiment 6.

Preferred Embodiment 9

Figure 34:
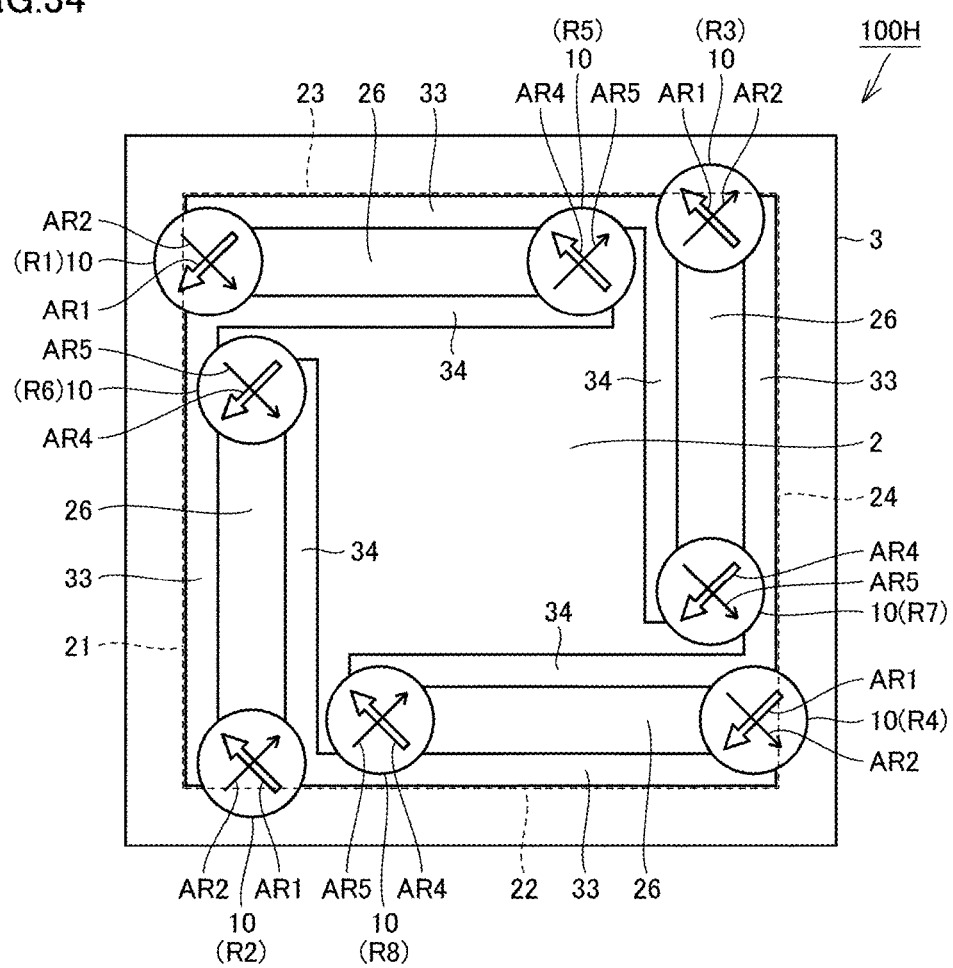
FIG. 34 is a view illustrating directions of bias magnetic fields applied to free layers and magnetization directions of reference layers in a sensor according to Preferred Embodiment 9 of the present invention.
Figure 35:
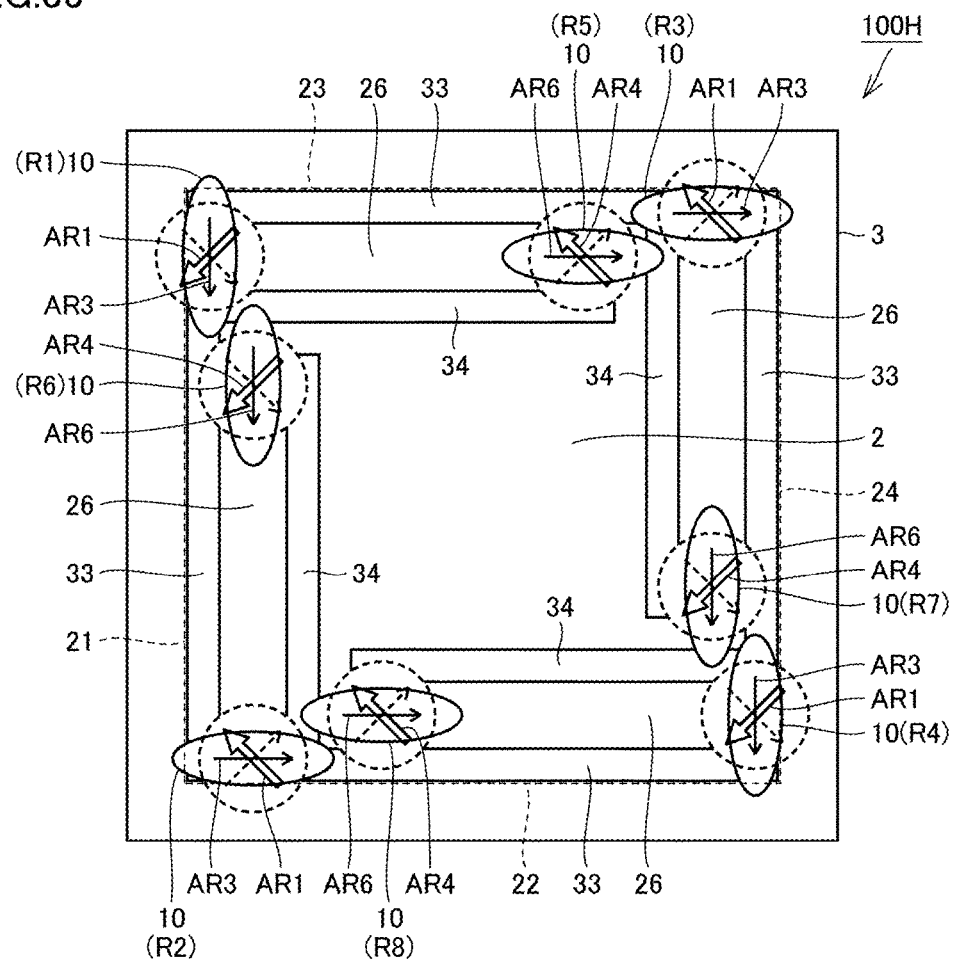
FIG. 35 is a view illustrating directions of stress-induced magnetic anisotropies generated when a film portion is deformed by external force and the magnetization directions of the reference layers in the sensor in Preferred Embodiment 9 of the present invention.

FIG. 34 is a view illustrating the directions of bias magnetic fields in the in-plane direction, which are applied to free layers, and the magnetization directions of reference layers in a sensor according to Preferred Embodiment 9 of the present invention. FIG. 35 is a view illustrating the directions of stress-induced magnetic anisotropies generated when a film portion is deformed by external force and the magnetization directions of the reference layers in the sensor in Preferred Embodiment 9. A sensor 100H in Preferred Embodiment 9 will be described with reference to FIGS. 34 and 35.

As illustrated in FIG. 34, in the unit elements 10 included in any of the first magnetoresistive element portions R1, R2, R3, and R4 and the second magnetoresistive element portions R5, R6, R7, and R8, relative angles between the directions of the bias magnetic fields in the in-plane direction, which are applied to the free layers 46, and the magnetization directions of the reference layers 44 are about 90 degrees±5 degrees in a state where no external force is applied to the film portion 2.

To be specific, in the unit elements 10 included in the first magnetoresistive element portions R1 and R4 and the second magnetoresistive element portions R6 and R7, the directions of the bias magnetic fields in the in-plane direction, which are applied to the free layers 46, are directions rotated counterclockwise by about 45 degrees±5 degrees with respect to the direction parallel or substantially parallel to the side portion 21 (more specifically, the direction from the side portion 23 toward the side portion 22). On the other hand, the magnetization directions of the reference layers 44 are directions rotated clockwise by 45 degrees±5 degrees with respect to the direction parallel to the side portion (more specifically, the direction from the side portion 23 toward the side portion 22).

In the first magnetoresistive element portions R2 and R3 and the second magnetoresistive element portions R5 and R8, the directions of the bias magnetic fields in the in-plane direction, which are applied to the free layers 46, are directions rotated counterclockwise by about 135 degrees±5 degrees with respect to the direction parallel to the side portion 21 (more specifically, the direction from the side portion 23 toward the side portion 22). On the other hand, the magnetization directions of the reference layers 44 are directions rotated clockwise by about 135 degrees±5 degrees with respect to the direction parallel or substantially parallel to the side portion 21 (more specifically, the direction from the side portion 23 toward the side portion 22).

The bias magnetic fields in the in-plane direction cause the free layers 46 to be magnetized in the direction of the applied bias magnetic fields in the in-plane direction. That is, the relative angles between the directions in which the free layers 46 are magnetized by the bias magnetic fields in the in-plane direction and the magnetization directions of the reference layers 44 are also about 90 degrees±5 degrees in the state where no external stress is applied to the film portion 2.

As illustrated in FIG. 35, when the film portion 2 is deformed, compressive stress and tensile stress act as described above, such that the stress-induced magnetic anisotropies of the free layers 46 occur. As a result, the magnetization directions of the free layers 46 become the directions of the stress-induced magnetic anisotropies. On the other hand, the directions of the bias magnetic fields in the in-plane direction, which are applied to the free layers 46, and the magnetization directions of the reference layers 44 are not changed.

Regardless of whether the compressive stress or the tensile stress acts, the relative angles between the directions of the stress-induced magnetic anisotropies in the free layers 46 and the directions of the bias magnetic fields in the in-plane direction, which are applied to the free layers 46, are about 45 degrees±5 degrees.

To be specific, in the first magnetoresistive element portions R1 and R4, the directions of the stress-induced magnetic anisotropies are parallel or substantially parallel to the side portion 21 and correspond to the direction from the side portion 23 toward the side portion 22 on the base sides of the projecting portions 26 on which the compressive stress acts. On the other hand, the directions of the bias magnetic fields in the in-plane direction, which are applied to the free layers 46, are directions obtained by rotating the directions of the stress-induced magnetic anisotropies counterclockwise by about 45 degrees±5 degrees.

In the first magnetoresistive element portions R2 and R3, the directions of the stress-induced magnetic anisotropies are orthogonal or substantially orthogonal to the side portion 21 and correspond to the direction from the side portion 21 toward the side portion 24 on the base sides of the projecting portions 26 on which the compressive stress acts. On the other hand, the directions of the bias magnetic fields in the in-plane direction, which are applied to the free layers 46, are directions obtained by rotating the directions of the stress-induced magnetic anisotropies counterclockwise by about 45 degrees±5 degrees.

In the second magnetoresistive element portions R5 and R8, the directions of the stress-induced magnetic anisotropies are orthogonal or substantially orthogonal to the side portion 21 and correspond to the direction from the side portion 21 toward the side portion 24 on the tip sides of the projecting portions 26 on which the tensile stress acts. On the other hand, the directions of the bias magnetic fields in the in-plane direction, which are applied to the free layers 46, are directions obtained by rotating the directions of the stress-induced magnetic anisotropies counterclockwise by about 45 degrees±5 degrees.

In the second magnetoresistive element portions R6 and R7, the directions of the stress-induced magnetic anisotropies are parallel or substantially parallel to the side portion 21 and correspond to the direction from the side portion 23 toward the side portion 22 on the tip sides of the projecting portions 26 on which the tensile stress acts. On the other hand, the directions of the bias magnetic fields in the in-plane direction, which are applied to the free layers 46, are directions obtained by rotating the directions of the stress-induced magnetic anisotropies counterclockwise by about 45 degrees±5 degrees.

Also in this case, by making the intensities of the bias magnetic fields in the in-plane direction, which are applied to the free layers 46, greater than the intensities of exchange coupling magnetic fields acting between the free layers 46 and the reference layers 44 and making the directions in which the free layers 46 are magnetized by the bias magnetic fields in the in-plane direction, the directions of the stress-induced magnetic anisotropies of the free layers 46, and the magnetization directions of the reference layers 44 have the above-described angular relationship, output characteristics of an odd function are obtained in each of the first bridge circuit and the second bridge circuit.

Even with such a configuration, the sensor 100G in Preferred Embodiment 8 provides the same of substantially the same advantageous effects as those of Preferred Embodiment 6.

Preferred Embodiment 10

Figure 36:
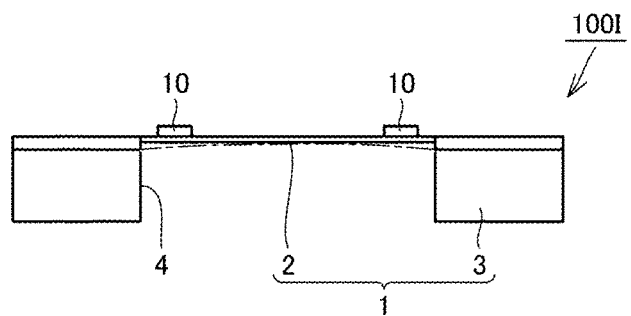
FIG. 36 is a schematic cross-sectional view illustrating a sensor according to Preferred Embodiment 10 of the present invention.

FIG. 36 is a schematic cross-sectional view illustrating a sensor according to Preferred Embodiment 10 of the present invention. A sensor 100I in Preferred Embodiment 10 will be described with reference to FIG. 36.

As illustrated in FIG. 36, the sensor 100I in Preferred Embodiment 10 is different from the sensor 100 in Preferred Embodiment 1 in that the film portion 2 is further etched.

More particularly, the configuration of the substrate 1 is different, and the support body 3 of the substrate 1 includes a first portion 3a, a second portion 3b, and a third portion 3c. The second member 3b is provided on the first member 3a and supports the film portion 2. The second portion 3b is made of a material different from that of the first member 3b. The third portion 3c is provided on the side opposite to the side where the second member 3b is located with respect to the first portion 3a in the thickness direction of the support body 3.

For example, the first member 3a is made of an insulating layer such as a silicon oxide film, and the first member 3b and the third member 3c are made of silicon, polysilicon, or the like.

The film portion 2 includes a portion thinner than the second portion 3b. For example, the film portion 2 may be thinner than the second portion 3b as a whole. Further, as indicated by an alternate long and short dash line in FIG. 36, the film portion may be provided such that the film thicknesses thereof in the connection portions 25 are larger than the film thickness of the center portion of the film portion 2.

As will be described later, when forming the film portion 2, etching is performed from the back surface side of the substrate (the main surface side of the substrate 61, which is located on the side opposite to the side on which the unit elements 10 are formed). As described above, different materials are used for the second portion 3b and the first portion 3a and a difference in an etching rate (selection ratio) based on the materials is used, such that etching can be stopped in the vicinity where an etching surface reaches the film portion 2. However, in practice, the selectivity takes a finite value, over-etching of the film portion 2 occurs, and an in-plane distribution is generated in the film thickness of the film portion due to an influence by in-plane distribution of the etching rate. For example, with the loading effect, the center portion of the film portion 2 tends to be thinner than the film portion 2 in the connection portions 25.

When the in-plane distribution is generated in the film thickness of the film portion 2, variations may occur in the stress applied to the magnetoresistive elements in input of external force and variations may occur in sensitivity and linearity, as a result. On the other hand, when the film thickness of the film portion 2 is decreased, the sensitivity increases and the linearity decreases. By utilizing this characteristic, the sensitivity can be adjusted by performing additional etching from the back surface side of the substrate 1 after the film portion 2 is formed.

Figure 37:
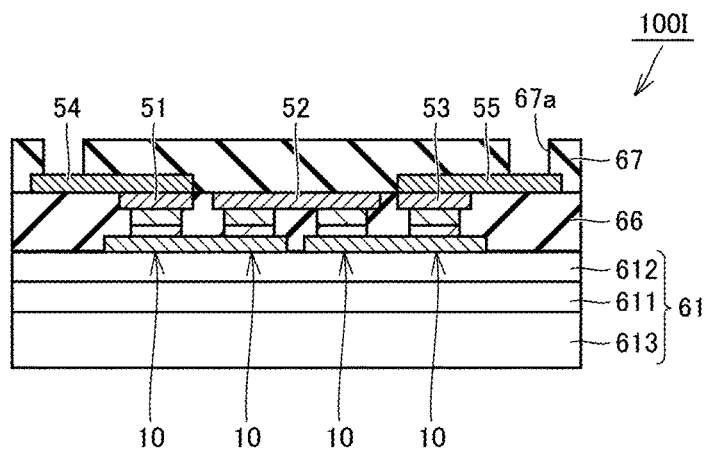
FIG. 37 is a view illustrating a step of forming a passivation film in a non-limiting example of a manufacturing process of the sensor in Preferred Embodiment 10 of the present invention.
Figure 38:
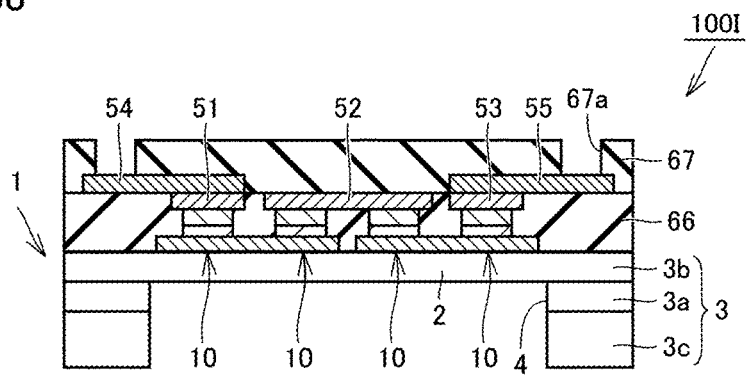
FIG. 38 is a view illustrating a first step of a step of forming a film portion in a non-limiting example of a manufacturing process of the sensor in Preferred Embodiment 10 of the present invention.
Figure 39:
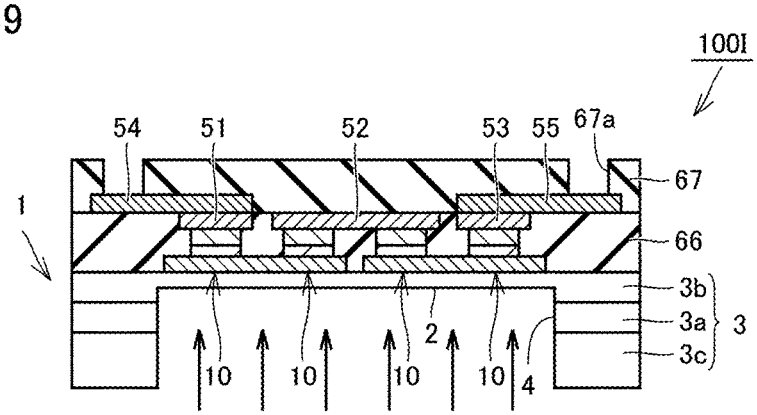
FIG. 39 is a view illustrating a second step of the step of forming the film portion in a non-limiting example of a manufacturing process of the sensor in Preferred Embodiment 10 of the present invention.

FIGS. 37 to 39 are views illustrating a step of forming a passivation film and a first step and a second step of a step of forming the film portion in a non-limiting example of a manufacturing process of the sensor in Preferred Embodiment 10. A non-limiting example of a method of manufacturing the sensor 100I in Preferred Embodiment 10 will be described with reference to FIGS. 37 to 39.

The sensor 100I in Preferred Embodiment 10 is manufactured substantially in accordance with the non-limiting example of a method of manufacturing the sensor 100 in Preferred Embodiment 1. In manufacturing of the sensor 100I in Preferred Embodiment 10, steps up to the sixth step are performed substantially similarly to the manufacturing method of the sensor 100 in Preferred Embodiment 1. As illustrated in FIG. 37, the substrate 61 including a first layer portion 611 that forms the first portion 3a, a second layer portion 612 that forms the second portion 3b, and a third layer portion 613 that forms the third portion 3c is used.

Then, as illustrated in FIG. 37, the electrodes 54 and 55 that are connected to the metal wirings 51 and 53 and the like are formed on the insulating film 66, and the passivation film 67 is formed so as to cover the electrodes 54 and 55 and the insulating film 66. The electrodes 54 and 55 are formed on the insulating film 66 by, for example, a photolithography method. The passivation film 67 is formed by, for example, photolithography and dry etching such that the electrodes 54 and 55 are exposed. Subsequently, as in Preferred Embodiment 1, the magnetization directions of the reference layers are fixed.

Then, as illustrated in FIG. 38, in the first step in the step of forming the film portion 2, dry etching is used to remove a portion of the substrate 61 from the main surface side of the substrate 61 located on the side opposite to the side on which the unit elements 10 are formed similarly to the eighth step in Preferred Embodiment 1. At this time, the substrate 61 is etched such that the second layer 612 which forms the film portion 2 is exposed from the first layer 613.

Subsequently, as illustrated in FIG. 39, in the second step in the step of forming the film portion 2, the second layer 612 is further dry-etched to form the film portion 2 so as to include a portion thinner than the second portion 3b. For example, the film portion 2 is formed such that the film thickness of the film portion in the connection portions 25 is thicker than the film thickness of the center portion of the film portion 2. The sensor 100I in Preferred Embodiment 10 can be manufactured through the above-described steps.

Note that the configuration in which the film portion 2 is thin as in Preferred Embodiment 10 can be applied to the sensors in Preferred Embodiments 2 to 9.

Preferred Embodiment 11

Figure 40:
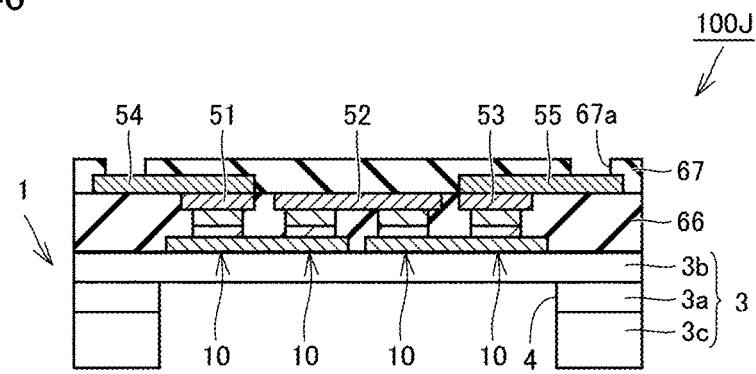
FIG. 40 is a cross-sectional view illustrating a sensor according to Preferred Embodiment 11 of the present invention.

FIG. 40 is a cross-sectional view illustrating a sensor according to Preferred Embodiment 11 of the present invention. A sensor 100J in Preferred Embodiment 11 will be described with reference to FIG. 40.

As illustrated in FIG. 40, the sensor 100J in Preferred Embodiment 11 is mainly different from the sensor 100 in Preferred Embodiment 1 in that the passivation film 67 includes a thinned portion.

To be more specific, the sensor 100J in Preferred Embodiment 11 includes the passivation film 67 as a protective film covering the magnetoresistive element portions, and the passivation film 67 has a film thickness partially different in a region corresponding to the film portion 2.

Similarly to the film thickness of the film portion 2 in Preferred Embodiment 10, when the film thickness of the passivation film 67 is reduced, sensitivity increases and linearity decreases. By utilizing this characteristic and forming the passivation film 67 such that the film thickness thereof is partially different in the region corresponding to the film portion 2, the sensitivity of the sensor 100J can be adjusted.

Figure 41:
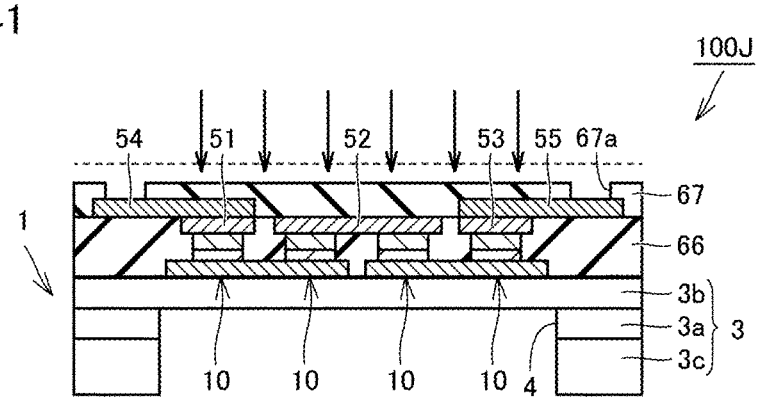
FIG. 41 is a view illustrating a step of thinning a passivation film in a non-limiting example of a manufacturing process of the sensor in Preferred Embodiment 11 of the present invention.

FIG. 41 is a view illustrating a step of thinning the passivation film in a non-limiting example of a manufacturing process of the sensor in Preferred Embodiment 11. A method of manufacturing the sensor 100J in Preferred Embodiment 11 will be described with reference to FIG. 41.

The sensor 100J in Preferred Embodiment 11 is manufactured substantially in accordance with the non-limiting example of a method of manufacturing the sensor 100 in Preferred Embodiment 1. In manufacturing of the sensor 100J in Preferred Embodiment 11, the steps up to the eighth step are performed substantially similarly to the manufacturing method of the sensor 100 in Preferred Embodiment 1. As illustrated in FIG. 41, the substrate 61 including the first layer portion 611 that forms the first portion 3a, the second layer portion 612 that forms the second portion 3b, and the third layer portion 613 that forms the third portion 3c may be used.

FIG. 41 is a view illustrating a step of thinning the passivation film in the non-limiting example of a manufacturing process of the sensor in Preferred Embodiment 11.

Subsequently, as illustrated in FIG. 41, in the step of thinning the passivation film 67, the passivation film 67 is thinned by dry etching such as, for example, reactive ion etching, ion milling, or the like. For example, the passivation film 67 is formed such that the film thickness thereof is partially different in the region corresponding to the film portion 2. The sensor 100J in Preferred Embodiment 11 can be manufactured through the above-described steps.

Note that the configuration in which the passivation film 67 is thin as in Preferred Embodiment 11 can be applied to the sensors in Preferred Embodiments 2 to 9.

Preferred Embodiment 12

Figure 42:
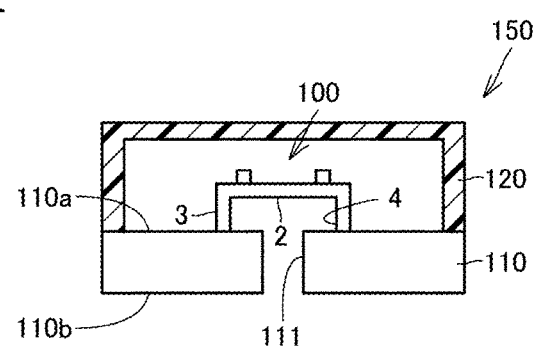
FIG. 42 is a view illustrating a strain detection sensor according to Preferred Embodiment 12 of the present invention.

FIG. 42 is a view illustrating a strain detection sensor according to Preferred Embodiment 12 of the present invention. A strain detection sensor 150 in Preferred Embodiment 12 will be described with reference to FIG. 42.

The strain detection sensor 150 in Preferred Embodiment includes the sensor 100 in Preferred Embodiment 1, a base portion 110, and a cover portion 120.

The base portion 110 has a plate shape and includes a first main surface 110a and a second main surface 110b which are in a front-back relationship with each other. The base portion 110 includes a through-hole 111. As the base portion 110, for example, a substrate made of a material obtained by combining resin and glass fibers, such as a glass epoxy substrate, a low temperature co-fired ceramics (LTCC) multilayer substrate, a substrate made of a ceramic material such as alumina, or the like can be used.

The sensor 100 is provided on the first main surface 110a. The sensor 100 is configured such that the cavity portion 4 communicates with the through-hole 111 and the film portion 2 faces the through-hole 111.

The cover portion 120 is provided on the first main surface 110a side so as to cover the sensor 100 while being spaced apart from the sensor 100. The cover portion 120 is joined to the first main surface 110a without a clearance therebetween in order to seal a space between the sensor 100 and the cover portion 120.

The cover portion 120 is made of a metal material or a resin material, for example. The cover portion 120 may be formed by, for example, cutting or pressing a member made of the above-described material or may be formed by molding.

In the strain detection sensor 150 having the above configuration, a space inside the sensor 100 (a space between the sensor 100 and the first main surface 110a) and a space outside the sensor 100 (a space between the sensor 100 and a lid portion 130) are separated from each other. When external force is applied to the film portion 2 by a sound wave or the like passing through the through-hole 111, the film portion 2 is deformed and stress acts on the unit elements 10 arranged on the film portion 2. The sensor 100 outputs a voltage in accordance with the deformation amounts of the unit elements 10. As described above, the strain detection sensor 150 can detect strain with high sensitivity by measuring the output.

Preferred Embodiment 13

Figure 43:
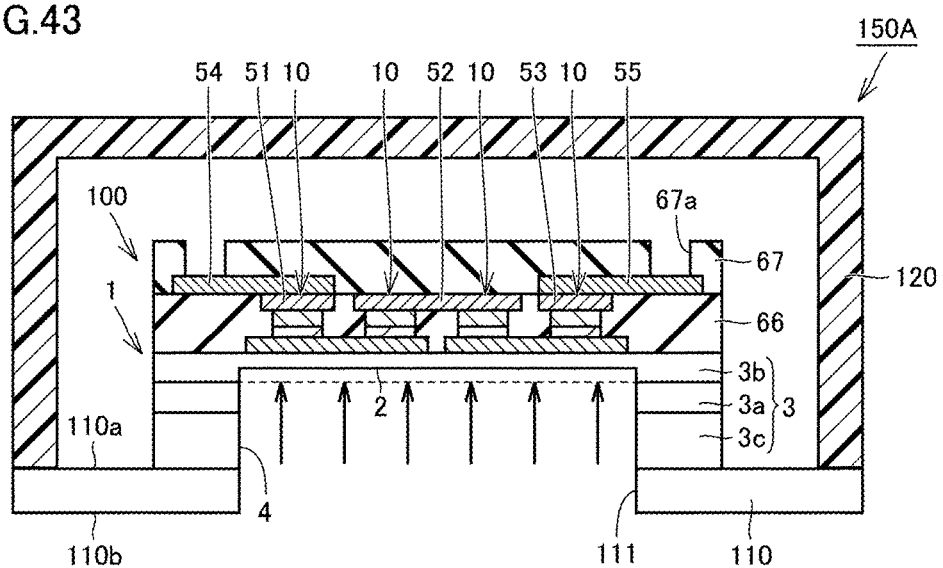
FIG. 43 is a view illustrating a first non-limiting example of a manufacturing process of a strain detection sensor according to Preferred Embodiment 13 of the present invention.
Figure 44:
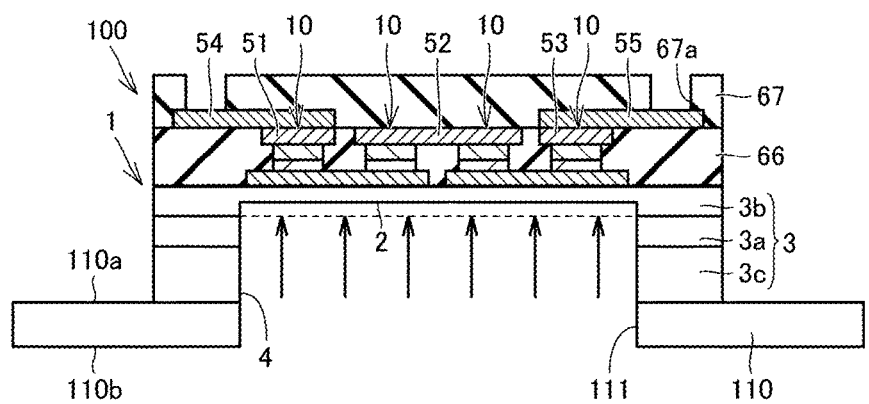
FIG. 44 is a view illustrating a second non-limiting example of a manufacturing process of the strain detection sensor in Preferred Embodiment 13 of the present invention.

FIGS. 43 and 44 are views illustrating a first example and a second example of a manufacturing process of a strain detection sensor according to Preferred Embodiment 13 of the present invention. A strain detection sensor 150A in Preferred Embodiment 13 will be described with reference to FIGS. 43 and 44.

The strain detection sensor 150A in Preferred Embodiment 13 is mainly different from the strain detection sensor 150 in Preferred Embodiment 12 in that the film portion 2 is thinned. The sensor provided in the strain sensor 150A has the same or substantially the same configuration as that in Preferred Embodiment 10 as described above but is different therefrom in a step of thinning the film portion 2. To be specific, the film portion 2 is further thinned when the sensor 100 is manufactured in Preferred Embodiment 10, and Preferred Embodiment 13 is mainly different therefrom in that the film portion 2 is further thinned in a non-limiting example of a manufacturing process of the strain detection sensor 150A using the sensor 100.

As illustrated in FIG. 43, in the first example of the manufacturing process of the strain detection sensor 150A, the sensor 100 is mounted on the base portion 110, the sensor 100 is covered with the cover portion 120 from the first main surface 110a side, and then the film portion 2 is thinned. Specifically, dry etching such, for example, as reactive ion etching, ion milling, or the like is performed on the film portion 2 facing the through-hole 111 via the through-hole 111 provided in the base portion 110. This enables the sensitivity and/or output of the sensor 100 to be adjusted after the sensor 100 is packaged.

As illustrated in FIG. 44, in the second example of the manufacturing process of the strain detection sensor 150A, the film portion 2 is thinned after the sensor 100 is mounted on the base portion 110. Specifically, dry etching such as, for example, reactive ion etching, ion milling, or the like is performed on the film portion 2 facing the through-hole 111 via the through-hole 111 provided in the base portion 110. Subsequently, the sensor 100 in which the film portion 2 is thinned is covered with the cover portion 120 from the first main surface 110a side.

Preferred Embodiment 14

Figure 45:
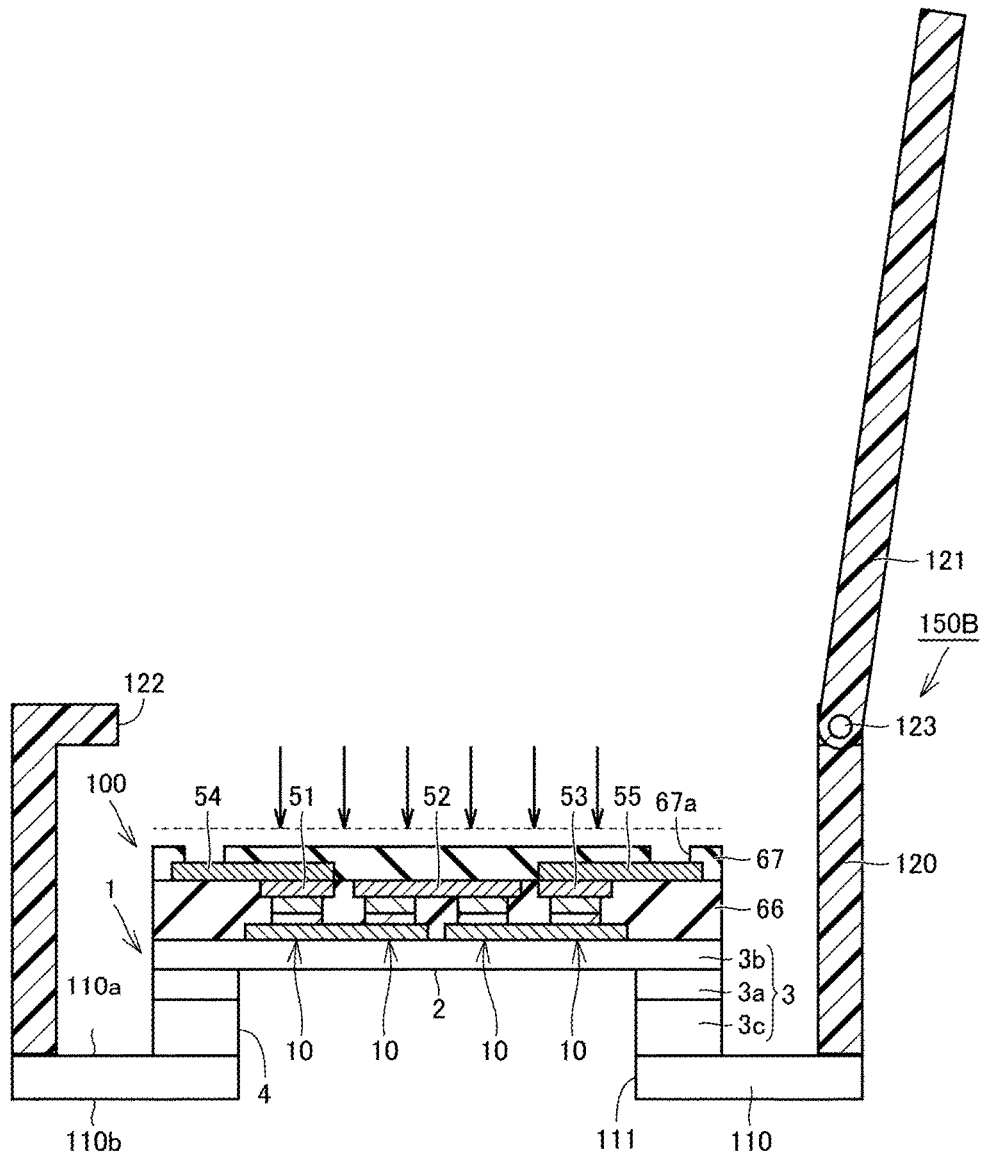
FIG. 45 is a view illustrating a first non-limiting example of a manufacturing process of a strain detection sensor according to Preferred Embodiment 14 of the present invention.
Figure 46:
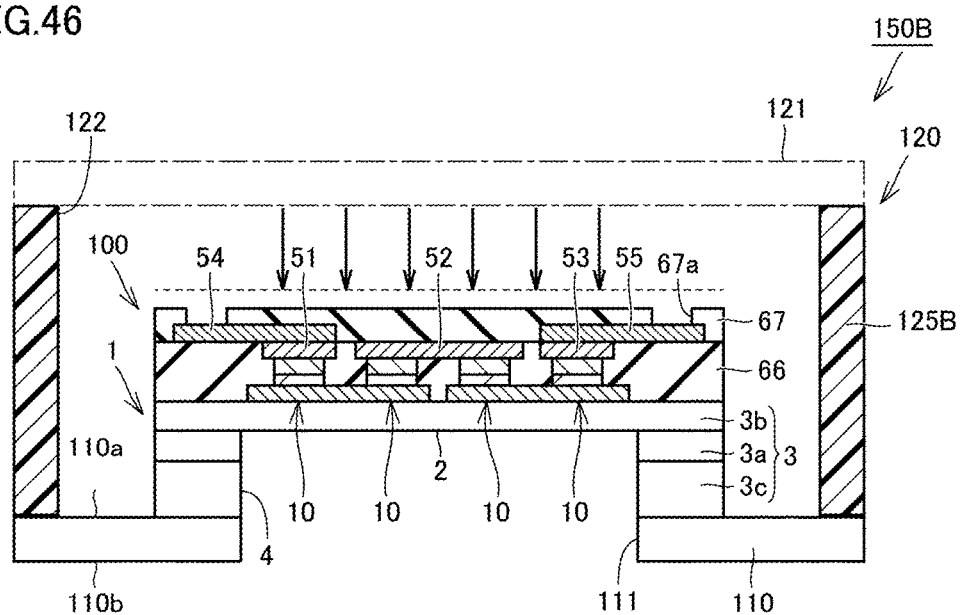
FIG. 46 is a view illustrating a second non-limiting example of a manufacturing process of the strain detection sensor in Preferred Embodiment 14 of the present invention.
Figure 47:
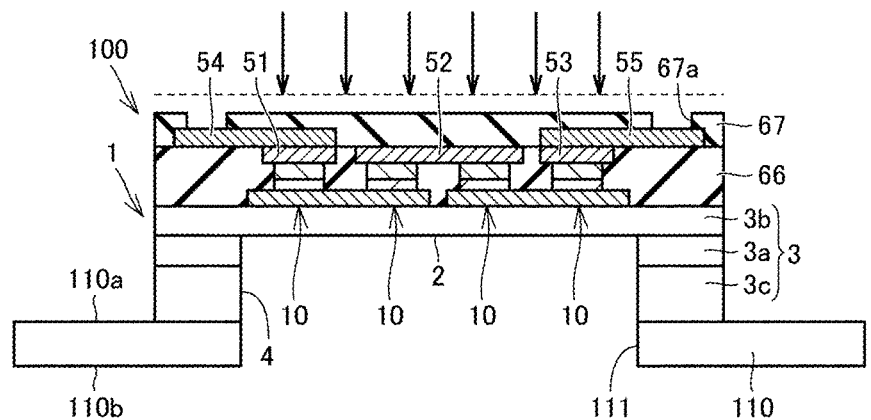
FIG. 47 is a view illustrating a third non-limiting example of a manufacturing process of the strain detection sensor in Preferred Embodiment 14 of the present invention.

FIGS. 45 to 47 are views illustrating first to third examples of a manufacturing process of a strain detection sensor according to Preferred Embodiment 14 of the present invention. A strain detection sensor 150B in Preferred Embodiment 14 will be described with reference to FIGS. 45 to 47.

As illustrated in FIG. 45, the strain detection sensor 150B in Preferred Embodiment 14 is mainly different from the strain detection sensor 150 in Preferred Embodiment 12 in that the passivation film 67 is thinned. A sensor included in the strain sensor 150B has the same or substantially the same configuration as that in Preferred Embodiment 11 as described above, but is different therefrom in a step of thinning the passivation film 67. To be specific, the passivation film 67 is further thinned when the sensor 100 is manufactured in Preferred Embodiment 11, and Preferred Embodiment 14 is mainly different therefrom in that the passivation film 67 is further thinned in a manufacturing process of the strain detection sensor 150B using the sensor 100.

As illustrated in FIG. 45, in the first example of the manufacturing process of the strain detection sensor 150B, the sensor 100 is mounted on the base portion 110, the sensor 100 is covered with the cover portion 120 from the first main surface 110a side, and then the passivation film 67 is thinned. In this case, the cover portion 120 includes a lid portion 121 provided to be able to open and close an opening 122 by a hinge mechanism 123. When the passivation film 67 is thinned, the lid portion 121 is opened, and dry etching such as reactive ion etching, ion milling, or the like is performed on the passivation film 67 through the opening 122.

As illustrated in FIG. 46, also in the second example of the manufacturing process of the strain detection sensor 150B, the sensor 100 is mounted on the base portion 110, the sensor 100 is covered with the cover portion 120 from the first main surface 110a side, and then the passivation film 67 is thinned. In the second example, the cover portion 120 includes a main body portion 125D having the opening 122 that opens upward and the lid portion 121 for closing the opening 122. In this case, it is preferable to arrange the main body portion 125D on the base portion 110 so as to cause the sensor 100 to be exposed through the opening 122 and surround the periphery of the sensor 100.

When the passivation film 67 is thinned, dry etching such as, for example, reactive ion etching, ion milling, or the like is performed on the passivation film 67 through the opening 122 in a state where the lid portion 121 is detached from the main body portion 125D.

As illustrated in FIG. 47, in the third example of the manufacturing process of the strain detection sensor 150B, after the sensor 100 is mounted on the base portion 110, the passivation film 67 is thinned by dry etching such as, for example, reactive ion etching, ion milling, or the like.

Preferred Embodiment 15

Figure 48:
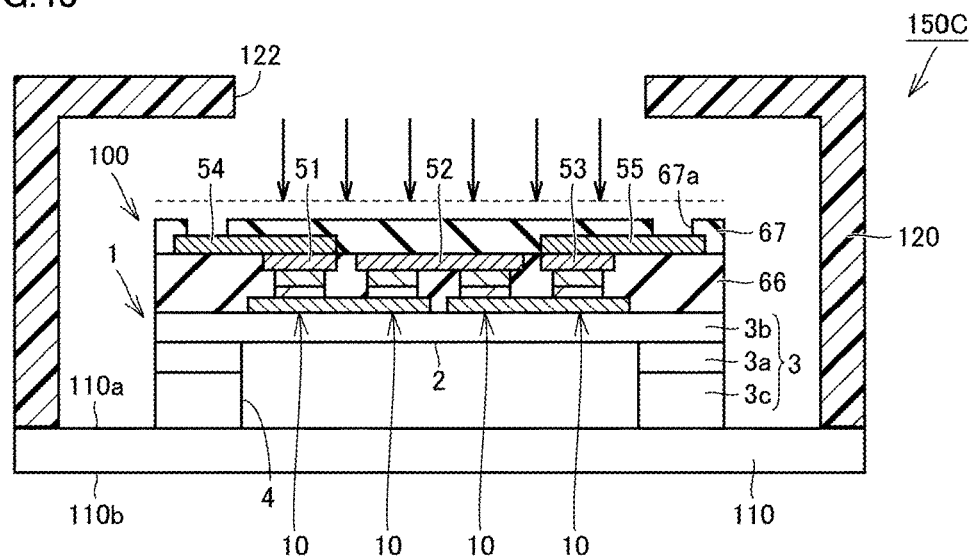
FIG. 48 is a view illustrating a first non-limiting example of a manufacturing process of a strain detection sensor according to Preferred Embodiment 15 of the present invention.
Figure 49:
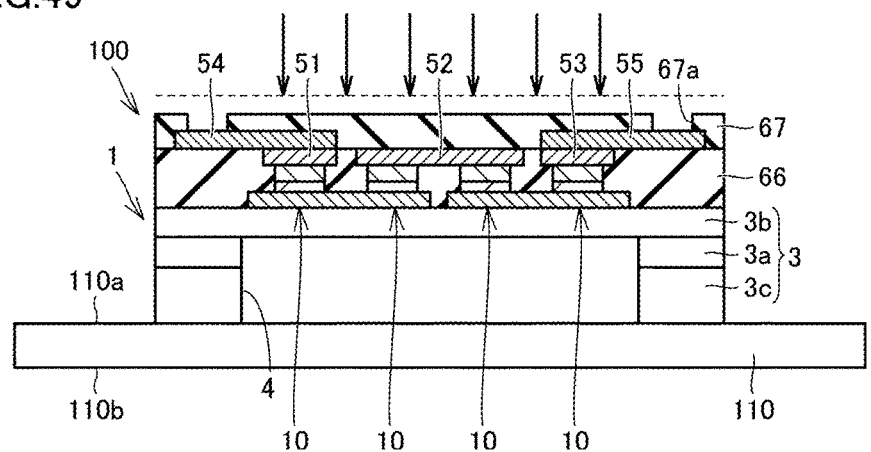
FIG. 49 is a view illustrating a second non-limiting example of a manufacturing process of the strain detection sensor in Preferred Embodiment 15 of the present invention.

FIGS. 48 and 49 are views illustrating a first example and a second example of a manufacturing process of a strain detection sensor according to Preferred Embodiment 15 of the present invention. A strain detection sensor 150C in Preferred Embodiment 15 will be described with reference to FIGS. 48 and 49.

As illustrated in FIG. 48, the strain detection sensor 150C in Preferred Embodiment 15 is different from the strain detection sensor 100 in Preferred Embodiment 12 mainly in that the through-hole 111 is not provided in the base portion 110, the opening 122 is provided in the cover portion 120 side, and the passivation film 67 is thinned. The opening 122 is provided in a ceiling portion of the cover portion 120 facing the sensor 100 and is provided at a position corresponding to the film portion 2.

The sensor included in the strain detection sensor 150C has the same or substantially the same configuration as that in Preferred Embodiment 11 as described above, but is different in a step of thinning the passivation film 67 in Preferred Embodiment 15. To be specific, the passivation film 67 is further thinned when the sensor 100 is manufactured in Preferred Embodiment 11, and Preferred Embodiment 15 is mainly different therefrom in that the passivation film 67 is further thinned in a manufacturing process of the strain detection sensor 150B using the sensor 100.

As illustrated in FIG. 48, in the first example of the manufacturing process of the strain detection sensor 150C, the sensor 100 is mounted on the base portion 110, the sensor 100 is covered with the cover portion 120 from the first main surface 110a side, and then the passivation film 67 is thinned. At this time, dry etching such as, for example, reactive ion etching, ion milling, or the like is performed on the passivation film 67 through the opening 122 provided in the ceiling portion of the cover portion 120.

As illustrated in FIG. 49, in the second example of the manufacturing process of the strain detection sensor 150C, after the sensor 100 is mounted on the base portion 110, the passivation film 67 is thinned by dry etching such as, for example, reactive ion etching, ion milling, or the like.

Preferred Embodiment 16

Figure 50:
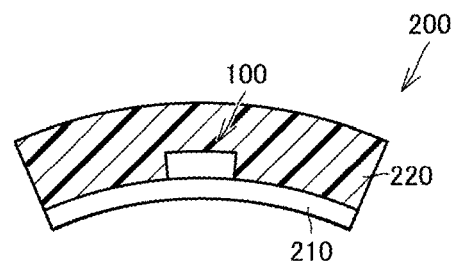
FIG. 50 is a view illustrating a pressure sensor according to Preferred Embodiment 16 of the present invention.

FIG. 50 is a view illustrating a pressure sensor according to Preferred Embodiment 16 of the present invention. A pressure sensor 200 in Preferred Embodiment 11 will be described with reference to FIG. 50. FIG. 50 illustrates a state in which stress acts on a base portion 210 and the base portion 210 is deflected.

As illustrated in FIG. 50, the pressure sensor 200 in Preferred Embodiment 16 includes the sensor 100 in Preferred Embodiment 1, the base portion 210, and a sealing portion 220.

The base portion 210 has a plate shape. The sensor 100 is provided on the base portion 210. The sensor 100 is sealed on the base portion 210 by the sealing portion 220.

When stress (pressure) acts on the base portion 210 and the base portion 210 is strained, the pressure also acts on the sensor 100 on the base portion 210. The film portion 2 is thus deformed, and the stress acts on the unit elements 10 on the film portion 2. A voltage in accordance with deformation of the unit elements 10 is output from the sensor 100. As described above, in the pressure sensor 200, the pressure applied to the base portion 210 can be detected with high sensitivity by measuring the output.

Preferred Embodiment 17

Figure 51:
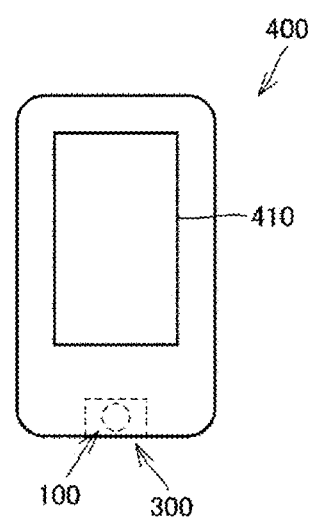
FIG. 51 is a view illustrating a portable information terminal including a microphone according to Preferred Embodiment 17 of the present invention.

FIG. 51 illustrates a portable information terminal including a microphone according to Preferred Embodiment 17 of the present invention. A microphone 300 in Preferred Embodiment 17 will be described with reference to FIG. 51.

As illustrated in FIG. 51, the microphone 300 including the sensor 100 in Preferred Embodiment 1 is incorporated in a portable information terminal 400. The film portion 2 of the sensor 100 provided in the microphone 300 is parallel or substantially parallel to the surface of the portable information terminal 400 on which a display 410 is provided. Arrangement of the sensor 100 can be changed as appropriate.

Since the microphone 300 includes the sensor 100, sound can be detected with high sensitivity in a wide frequency band.

Note that the microphone 300 may be incorporated in, for example, an IC recorder, a pin microphone, or the like, instead of the portable information terminal 400.

In Preferred Embodiments 10 to 12 described above, the case where the strain detection sensor 150, the pressure sensor 200, and the microphone 300 include the sensor 100 in Preferred Embodiment 1 has been described as examples. However, the present invention is not limited thereto, and any of the sensors in Preferred Embodiments 1 to 9 described above may be included.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A sensor comprising:
    a film portion that is deformable by external force;
    a support body supporting the film portion; and
    a magnetoresistive element portion on the film portion and including at least one unit element; wherein the at least one unit element includes a first magnetic layer whose magnetization direction changes in accordance with deformation of the film portion, a second magnetic layer whose magnetization direction is fixed, and an intermediate layer between the first magnetic layer and the second magnetic layer;

the film portion includes a first side portion in a portion of an outer edge of the film portion;

a slit portion is provided in the film portion and includes at least a portion that extends in a direction along the outer edge of the film portion along the first side portion, so that the film portion includes a connection portion in which the first side portion is partially connected to the support body; and the magnetoresistive element portion is in the connection portion.

2. A sensor comprising:

a film portion that is deformable by external force;

a support body supporting the film portion; and a plurality of magnetoresistive element portions on the film portion and each including at least one unit element; wherein the at least one unit element includes a first magnetic layer whose magnetization direction changes in accordance with deformation of the film portion, a second magnetic layer whose magnetization direction is fixed, and an intermediate layer between the first magnetic layer and the second magnetic layer;

the film portion includes a plurality of side portions defining an outer edge of the film portion;

a slit portion is provided in the film portion and includes portions along the plurality of side portions, so that the film portion includes a plurality of connection portions in which the plurality of side portions are partially connected to the support body;

the plurality of magnetoresistive element portions are respectively located in the plurality of connection portions; and a bridge circuit is defined by the plurality of magnetoresistive element portions provided in the plurality of connection portions.

3. A sensor comprising:

a film portion that is deformable by external force;

a support body supporting the film portion; and a plurality of magnetoresistive element portions on the film portion and each including at least one unit element; wherein the at least one unit element includes a first magnetic layer whose magnetization direction changes in accordance with deformation of the film portion, a second magnetic layer whose magnetization direction is fixed, and an intermediate layer between the first magnetic layer and the second magnetic layer;

the film portion includes a plurality of side portions defining an outer edge of the film portion;

a slit portion is provided in the film portion and includes portions along the plurality of side portions, so that the film portion includes a plurality of connection portions in which the plurality of side portions are partially connected to the support body;

the plurality of magnetoresistive element portions are respectively located in the plurality of connection portions;

each of the plurality of connection portions includes one end on one side in a direction along the outer edge of the film portion and another end on another side in the direction along the outer edge of the film portion;

the slit portion includes, in each of the plurality of side portions, a first slit portion extending from the one end of each of the plurality of connection portions toward the one side and a second slit portion extending from the another end of each of the plurality of connection portions toward the another side; and the first slit portion on one connection portion side of the plurality of connection portions adjacent to each other in a circumferential direction of the film portion and the second slit portion on another connection portion side of the plurality of connection portions are coupled to each other.

4. The sensor according to claim 3, wherein the slit portion includes a plurality of pairs of extending portions on both outer sides of the plurality of connection portions along the outer edge of the film portion so as to extend in directions intersecting with the side portions that respectively correspond to the plurality of connection portions;

the plurality of connection portions respectively include projecting portions extending between the pairs of extending portions; and the plurality of magnetoresistive element portions are at least in portions of the projecting portions, which are located on the outer edge side of the film portion.

5. The sensor according to claim 2, wherein the film portion has a polygonal or substantially polygonal shape including a plurality of corner portions;

the slit portion includes a plurality of pairs of extending portions corresponding to the plurality of corner portions;

the pairs of extending portions extend from corresponding predetermined corner portions of the plurality of corner portions towards corner portions adjacent to the predetermined corner portions of the plurality of corner portions on one side in the circumferential direction of the film portion;

first extending portions of the pairs of extending portions are provided along the side portions;

second extending portions of the pairs of extending portions are parallel or substantially parallel to the first extending portions in inner side portions of the film portion inward from the first extending portions;

the plurality of connection portions respectively include projecting portions extending between the pairs of extending portions; and lengths of the pairs of extending portions are equal to or more than about 50% of lengths of the side portions.

6. The sensor according to claim 5, wherein lengths of the first extending portions are larger than lengths of the second extending portions; and the first extending portions are connected to the second extending portions of the pairs of extending portions provided at the corner portions adjacent to the predetermined corner portions.

7. The sensor according to claim 4, wherein the plurality of magnetoresistive element portions include a plurality of first magnetoresistive element portions and a plurality of second magnetoresistive element portions;

the first magnetoresistive element portion and the second magnetoresistive element portion are provided in each of the plurality of the projecting portions;

the plurality of first magnetoresistive element portions are provided in portions of the projecting portions of the plurality of projecting portions, which are located on the outer edge side of the film portion;

the plurality of second magnetoresistive element portions are provided in portions of the projecting portions of the plurality of projecting portions, which are located on tip sides of the pairs of extending portions;

a first bridge circuit is defined by the plurality of first magnetoresistive element portions;

a second bridge circuit is defined by the plurality of second magnetoresistive element portions; and the second bridge circuit has an output characteristic opposite in sign to an output characteristic of the first bridge circuit.

8. The sensor according to claim 7, wherein
the plurality of first magnetoresistive element portions and the plurality of second magnetoresistive element portions include a plurality of the unit elements; and
a number of the plurality of unit elements included in the first magnetoresistive element portions is smaller than a number of the plurality of unit elements included in the second magnetoresistive element portions.

9. The sensor according to claim 7, wherein
each of the plurality of first magnetoresistive element portions and the plurality of second magnetoresistive element portions includes a plurality of the unit elements of different sizes; and
an average size of the plurality of unit elements included in the plurality of first magnetoresistive element portions is smaller than an average size of the plurality of unit elements included in the plurality of second magnetoresistive element portions.

10. The sensor according to claim 3, wherein a bridge circuit is defined by the plurality of magnetoresistive element portions provided in the plurality of connection portions.

11. The sensor according to claim 7, wherein
bias magnetic fields in an in-plane direction are applied to the first magnetic layers;
relative angles between directions of the bias magnetic fields applied to the first magnetic layers and the magnetization directions of the second magnetic layers are about 90 degrees±5 degrees; and
relative angles between directions of stress-induced magnetic anisotropies of the first magnetic layers and the directions of the bias magnetic fields are about 45±5 degrees, the stress-induced magnetic anisotropies occurring when the film portion is deformed such that compressive force acts on portions of the connection portions, which are located on the outer edge side of the film portion.

12. The sensor according to claim 7, wherein
bias magnetic fields in an in-plane direction are applied to the first magnetic layers;
relative angles between directions of the bias magnetic fields applied to the first magnetic layers and the magnetization directions of the second magnetic layers are about 135 degrees±5 degrees; and
relative angles between directions of stress-induced magnetic anisotropies of the first magnetic layers and the directions of the bias magnetic fields are about 45±5 degrees, the stress-induced magnetic anisotropies occurring when the film portion is deformed such that compressive force acts on portions of the connection portions, which are located on the outer edge side of the film portion.

13. The sensor according to claim 1, wherein the at least one unit element further includes a bias layer to apply a bias magnetic field in an in-plane direction to the first magnetic layer and a separation layer between the bias layer and the first magnetic layer.

14. The sensor according to claim 13, wherein
the first magnetic layer has a magnetization vortex structure; and
an intensity of the bias magnetic field which is applied to the first magnetic layer is larger than an intensity of an interlayer exchange coupling magnetic field acting between the first magnetic layer and the second magnetic layer with the intermediate layer interposed therebetween.

15. The sensor according to claim 1, wherein the first magnetic layer has a disk shape.

16. The sensor according to claim 15, wherein
the magnetoresistive element portion includes a plurality of the unit elements with different disk diameters of the first magnetic layers; and
the plurality of unit elements are provided such that a unit element of the plurality of unit elements at a position in the connection portion where an absolute value of stress acting when the film portion is deformed is larger has a smaller disk diameter.

17. The sensor according to claim 1, wherein a film thickness of the film portion in the connection portion is larger than a film thickness of a central portion of the film portion.

18. The sensor according to claim 1, wherein
the support body includes a first portion and a second portion on the first portion and supporting the film portion;
the second portion is made of a material different from a material of the first portion; and
the film portion includes a portion with a thickness smaller than a thickness of the second portion.

19. The sensor according to claim 1, further comprising:
a protective film covering the magnetoresistive element portion; wherein
a film thickness of the protective film is partially different in a region corresponding to the film portion.

20. A strain detection sensor comprising the sensor according to claim 1.

21. A pressure sensor comprising the sensor according to claim 1.

22. A microphone comprising the sensor according to claim 1.

* * * * *